(12) United States Patent
Yamazaki et al.

(10) Patent No.: US 12,142,694 B2
(45) Date of Patent: Nov. 12, 2024

(54) SEMICONDUCTOR DEVICE, DISPLAY DEVICE INCLUDING THE SEMICONDUCTOR DEVICE, DISPLAY MODULE INCLUDING THE DISPLAY DEVICE, AND ELECTRONIC DEVICE INCLUDING THE SEMICONDUCTOR DEVICE, THE DISPLAY DEVICE, AND THE DISPLAY MODULE

(71) Applicant: SEMICONDUCTOR ENERGY LABORATORY CO., LTD., Atsugi (JP)

(72) Inventors: Shunpei Yamazaki, Tokyo (JP); Kenichi Okazaki, Tochigi (JP); Masahiro Katayama, Tochigi (JP); Masataka Nakada, Tochigi (JP)

(73) Assignee: SEMICONDUCTOR ENERGY LABORATORY CO., LTD., Kanagawa-ken (JP)

(*) Notice: Subject to any disclaimer, the term of this patent is extended or adjusted under 35 U.S.C. 154(b) by 0 days.

(21) Appl. No.: 18/208,101

(22) Filed: Jun. 9, 2023

(65) Prior Publication Data

US 2023/0343875 A1    Oct. 26, 2023

Related U.S. Application Data

(63) Continuation of application No. 17/392,766, filed on Aug. 3, 2021, now Pat. No. 11,699,762, which is a (Continued)

(30) Foreign Application Priority Data

Feb. 5, 2014    (JP) .................. 2014-020517
Feb. 27, 2014   (JP) .................. 2014-037209

(51) Int. Cl.
    *H01L 29/786*    (2006.01)
    *H01L 27/12*     (2006.01)
    (Continued)

(52) U.S. Cl.
    CPC ...... *H01L 29/7869* (2013.01); *H01L 27/1225* (2013.01); *H01L 27/1255* (2013.01);
    (Continued)

(58) Field of Classification Search
    None
    See application file for complete search history.

(56) References Cited

U.S. PATENT DOCUMENTS 5,518,940 A    5/1996    Hodate et al.
5,731,856 A    3/1998    Kim et al.
(Continued)

FOREIGN PATENT DOCUMENTS

CN    101752390 A    6/2010
CN    103293790 A    9/2013
(Continued)

OTHER PUBLICATIONS

Yang.J et al., "A New Process and Structure for Oxide Semiconductor LCDs", SID Digest '14 : SID International Symposium Digest of Technical Papers, Jun. 3, 2014, pp. 469-472.
(Continued)

*Primary Examiner* — Feifei Yeung Lopez
(74) *Attorney, Agent, or Firm* — NIXON PEABODY LLP; Jeffrey L. Costellia

(57) ABSTRACT

To provide a semiconductor device including a planar transistor having an oxide semiconductor and a capacitor. In a semiconductor device, a transistor includes an oxide semiconductor film, a gate insulating film over the oxide semiconductor film, a gate electrode over the gate insulating film, a second insulating film over the gate electrode, a third
(Continued)

insulating film over the second insulating film, and a source and a drain electrodes over the third insulating film; the source and the drain electrodes are electrically connected to the oxide semiconductor film; a capacitor includes a first and a second conductive films and the second insulating film; the first conductive film and the gate electrode are provided over the same surface; the second conductive film and the source and the drain electrodes are provided over the same surface; and the second insulating film is provided between the first and the second conductive films.

15 Claims, 49 Drawing Sheets

Related U.S. Application Data continuation of application No. 17/028,014, filed on Sep. 22, 2020, now Pat. No. 11,107,837, which is a continuation of application No. 16/361,452, filed on Mar. 22, 2019, now Pat. No. 10,811,435, which is a continuation of application No. 15/220,430, filed on Jul. 27, 2016, now Pat. No. 10,249,645, which is a continuation of application No. 14/604,999, filed on Jan. 26, 2015, now Pat. No. 9,443,876.

(51) Int. Cl.
  *H01L 27/146*     (2006.01)
  *H01L 29/49*      (2006.01)
  *H10K 59/121*     (2023.01)

(52) U.S. Cl.
  CPC .. *H01L 27/14609* (2013.01); *H01L 27/14612* (2013.01); *H01L 27/14634* (2013.01); *H01L 29/4908* (2013.01); *H01L 29/78603* (2013.01); *H01L 29/78645* (2013.01); *H01L 29/78648* (2013.01); *H01L 29/78696* (2013.01); *H10K 59/1216* (2023.02)

(56) References Cited

U.S. PATENT DOCUMENTS

| | | | |
|---|---|---|---|
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,809,706 B2 | 10/2004 | Shimoda |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,317,434 B2 | 1/2008 | Lan et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,575,966 B2 | 8/2009 | Lai et al. |
| 7,674,650 B2 | 3/2010 | Akimoto et al. |
| 7,705,358 B2 | 4/2010 | Okamoto et al. |
| 7,732,819 B2 | 6/2010 | Akimoto et al. |
| 8,059,068 B2 | 11/2011 | Kimura |
| 8,063,400 B2 | 11/2011 | Sugimoto |
| 8,164,090 B2 | 4/2012 | Iwasaki et al. |
| 8,242,986 B2 | 8/2012 | Kimura |
| 8,344,374 B2 | 1/2013 | Yamazaki et al. |
| 8,384,076 B2 | 2/2013 | Park et al. |
| 8,415,208 B2 | 4/2013 | Takayama et al. |
| 8,445,902 B2 | 5/2013 | Sato et al. |
| 8,470,649 B2 | 6/2013 | Yamazaki et al. |
| 8,476,625 B2 | 7/2013 | Kimura |
| 8,502,788 B2 | 8/2013 | Cho |
| 8,508,443 B2 | 8/2013 | Kimura |
| 8,516,728 B2 | 8/2013 | Jung |
| 8,519,387 B2 | 8/2013 | Endo et al. |
| 8,530,273 B2 | 9/2013 | Den Boer |
| 8,541,780 B2 | 9/2013 | Yamazaki et al. |
| 8,593,061 B2 | 11/2013 | Yamada |
| 8,604,472 B2 | 12/2013 | Sasagawa et al. |
| 8,610,118 B2 | 12/2013 | Yamazaki et al. |
| 8,610,155 B2 | 12/2013 | Hatano et al. |
| 8,624,240 B2 | 1/2014 | Sato et al. |
| 8,637,348 B2 | 1/2014 | Endo et al. |
| 8,729,613 B2 | 5/2014 | Honda et al. |
| 8,736,162 B2 | 5/2014 | Jin et al. |
| 8,796,681 B2 | 8/2014 | Yamade et al. |
| 8,809,992 B2 | 8/2014 | Yamazaki et al. |
| 8,835,918 B2 | 9/2014 | Yamazaki et al. |
| 8,860,021 B2 | 10/2014 | Isobe et al. |
| 8,860,022 B2 | 10/2014 | Sasaki et al. |
| 8,883,556 B2 | 11/2014 | Yamazaki |
| 8,890,150 B2 | 11/2014 | Sasaki et al. |
| 8,890,158 B2 | 11/2014 | Yamazaki et al. |
| 8,907,392 B2 | 12/2014 | Yamazaki et al. |
| 8,916,424 B2 | 12/2014 | Isobe et al. |
| 8,916,866 B2 | 12/2014 | Godo et al. |
| 8,941,112 B2 | 1/2015 | Yamazaki |
| 8,975,115 B2 | 3/2015 | Endo et al. |
| 8,999,750 B2 | 4/2015 | Kimura |
| 8,999,773 B2 | 4/2015 | Hanaoka et al. |
| 9,006,803 B2 | 4/2015 | Isobe et al. |
| 9,023,684 B2 | 5/2015 | Suzawa et al. |
| 9,082,864 B2 | 7/2015 | Sasaki et al. |
| 9,087,908 B2 | 7/2015 | Honda et al. |
| 9,093,539 B2 | 7/2015 | Sasagawa et al. |
| 9,111,795 B2 | 8/2015 | Ieda et al. |
| 9,117,662 B2 | 8/2015 | Isobe et al. |
| 9,130,041 B2 | 9/2015 | Yamazaki et al. |
| 9,201,280 B2 | 12/2015 | Kimura |
| 9,236,428 B2 | 1/2016 | Isobe et al. |
| 9,276,121 B2 | 3/2016 | Yamazaki |
| 9,281,410 B2 | 3/2016 | Okazaki et al. |
| 9,337,321 B2 | 5/2016 | Yamazaki |
| 9,368,501 B2 | 6/2016 | Yamazaki et al. |
| 9,368,638 B2 | 6/2016 | Yamazaki et al. |
| 9,373,708 B2 | 6/2016 | Sasagawa et al. |
| 9,443,876 B2 | 9/2016 | Yamazaki et al. |
| 9,496,375 B2 | 11/2016 | Isobe et al. |
| 9,537,012 B2 | 1/2017 | Yamazaki et al. |
| 9,640,639 B2 | 5/2017 | Yamazaki |
| 9,680,028 B2 | 6/2017 | Honda et al. |
| 9,711,349 B2 | 7/2017 | Hanaoka et al. |
| 9,773,810 B2 | 9/2017 | Ieda et al. |
| 9,780,225 B2 | 10/2017 | Yamazaki |
| 9,825,068 B2 | 11/2017 | Kimura |
| 9,859,114 B2 | 1/2018 | Yamazaki |
| 10,008,587 B2 | 6/2018 | Yamazaki et al. |
| 10,079,295 B2 | 9/2018 | Isobe et al. |
| 10,128,280 B2 | 11/2018 | Kimura |
| 10,249,645 B2 | 4/2019 | Yamazaki et al. |
| 10,388,670 B2 | 8/2019 | Ieda et al. |
| 10,522,692 B2 | 12/2019 | Yamazaki |
| 10,811,435 B2 | 10/2020 | Yamazaki et al. |
| 10,886,414 B2 | 1/2021 | Yamazaki |
| 11,670,721 B2 | 6/2023 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0201974 A1 | 10/2003 | Yin |
| 2003/0218222 A1 | 11/2003 | Wager, II et al. |
| 2004/0038446 A1 | 2/2004 | Takeda et al. |
| 2004/0080474 A1* | 4/2004 | Kimura ............... G09G 3/3233 |
| | | | 257/E27.113 |

(56) References Cited

U.S. PATENT DOCUMENTS

| | | |
|---|---|---|
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0210720 A1 | 9/2007 | Kimura |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0150027 A1 | 6/2008 | Okamoto et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0265254 A1 | 10/2008 | Nishiura |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0039422 A1 | 2/2010 | Seto |
| 2010/0065832 A1 | 3/2010 | Sugimoto |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0117975 A1 | 5/2010 | Cho |
| 2010/0140613 A1 | 6/2010 | Kimura |
| 2010/0163874 A1 | 7/2010 | Koyama et al. |
| 2010/0248403 A1 | 9/2010 | Hatano et al. |
| 2010/0317409 A1 | 12/2010 | Jiang et al. |
| 2011/0050657 A1 | 3/2011 | Yamada |
| 2011/0079778 A1 | 4/2011 | Yamazaki et al. |
| 2011/0084267 A1 | 4/2011 | Yamazaki et al. |
| 2011/0101333 A1 | 5/2011 | Shionoiri et al. |
| 2011/0240998 A1 | 10/2011 | Morosawa et al. |
| 2012/0032173 A1 | 2/2012 | Sato et al. |
| 2012/0074399 A1 | 3/2012 | Den Boer |
| 2012/0104385 A1 | 5/2012 | Godo et al. |
| 2012/0161126 A1 | 6/2012 | Yamazaki |
| 2012/0187397 A1 | 7/2012 | Yamazaki et al. |
| 2012/0193628 A1 | 8/2012 | Sasaki et al. |
| 2012/0273773 A1 | 11/2012 | Ieda et al. |
| 2012/0288993 A1 | 11/2012 | Sasagawa et al. |
| 2012/0315730 A1 | 12/2012 | Koezuka et al. |
| 2012/0315735 A1 | 12/2012 | Koezuka et al. |
| 2013/0002133 A1 | 1/2013 | Jin et al. |
| 2013/0002583 A1 | 1/2013 | Jin et al. |
| 2013/0069054 A1 | 3/2013 | Isobe et al. |
| 2013/0069055 A1 | 3/2013 | Yamazaki et al. |
| 2013/0112968 A1 | 5/2013 | Sasagawa et al. |
| 2013/0126859 A1 | 5/2013 | Yeh et al. |
| 2013/0180882 A1 | 7/2013 | Hamers et al. |
| 2013/0194761 A1 | 8/2013 | Kim |
| 2013/0270616 A1 | 10/2013 | Yamazaki |
| 2013/0299883 A1 | 11/2013 | Lin et al. |
| 2013/0300456 A1 | 11/2013 | Lennon |
| 2013/0320848 A1 | 12/2013 | Miyake et al. |
| 2014/0001468 A1 | 1/2014 | Yamazaki et al. |
| 2014/0077205 A1 | 3/2014 | Yamazaki et al. |
| 2014/0099999 A1 | 4/2014 | Hatano et al. |
| 2014/0247405 A1 | 9/2014 | Jin et al. |
| 2015/0177543 A1 | 6/2015 | Kimura |
| 2015/0228802 A1 | 8/2015 | Suzawa et al. |
| 2016/0293605 A1 | 10/2016 | Yamazaki et al. |
| 2018/0122629 A1 | 5/2018 | Yamazaki |
| 2019/0157309 A1 | 5/2019 | Ieda et al. |
| 2023/0275158 A1 | 8/2023 | Yamazaki |

FOREIGN PATENT DOCUMENTS

| | | |
|---|---|---|
| CN | 103314431 A | 9/2013 |
| DE | 112012004307 | 7/2014 |
| EP | 1310937 A | 5/2003 |
| EP | 1737044 A | 12/2006 |
| EP | 2226847 A | 9/2010 |
| EP | 2302614 A | 3/2011 |
| EP | 2309479 A | 4/2011 |
| EP | 2518767 A | 10/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-249766 A | 9/1995 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-058106 A | 2/2003 |
| JP | 2003-086000 A | 3/2003 |
| JP | 2003-086808 A | 3/2003 |
| JP | 2003-216110 A | 7/2003 |
| JP | 2004-103957 A | 4/2004 |
| JP | 2004-165688 A | 6/2004 |
| JP | 2004-273614 A | 9/2004 |
| JP | 2004-273732 A | 9/2004 |
| JP | 2006-165529 A | 6/2006 |
| JP | 2007-220817 A | 8/2007 |
| JP | 2008-522246 | 6/2008 |
| JP | 2008-177546 A | 7/2008 |
| JP | 2008-275937 A | 11/2008 |

(56) References Cited

FOREIGN PATENT DOCUMENTS

| JP | 2009-265459 A | 11/2009 |
|---|---|---|
| JP | 2009-272427 A | 11/2009 |
| JP | 2009-278115 A | 11/2009 |
| JP | 2010-156963 A | 7/2010 |
| JP | 2012-033836 A | 2/2012 |
| JP | 2012-049513 A | 3/2012 |
| JP | 2012-151455 A | 8/2012 |
| JP | 2012-151461 A | 8/2012 |
| JP | 2012-169605 A | 9/2012 |
| JP | 2012-169612 A | 9/2012 |
| JP | 2012-199527 A | 10/2012 |
| JP | 2012-235098 A | 11/2012 |
| JP | 2012-256874 A | 12/2012 |
| JP | 2013-008946 A | 1/2013 |
| JP | 2013-123044 A | 6/2013 |
| JP | 2013-149964 A | 8/2013 |
| JP | 2013-149970 A | 8/2013 |
| JP | 2013-179286 A | 9/2013 |
| JP | 2013-179294 A | 9/2013 |
| JP | 2013-214731 A | 10/2013 |
| JP | 2013-219336 A | 10/2013 |
| JP | 2013-219345 A | 10/2013 |
| JP | 2013-232636 A | 11/2013 |
| JP | 2013-232689 A | 11/2013 |
| JP | 2013-234940 A | 11/2013 |
| JP | 2013-236068 A | 11/2013 |
| JP | 2013-236070 A | 11/2013 |
| JP | 2013-243352 A | 12/2013 |
| JP | 2013-254942 A | 12/2013 |
| JP | 2013-254951 A | 12/2013 |
| KR | 2012-0047202 A | 5/2012 |
| KR | 2013-0098709 A | 9/2013 |
| KR | 2014-0000103 A | 1/2014 |
| TW | I292281 | 1/2008 |
| TW | 201138112 | 11/2011 |
| TW | 201320164 | 5/2013 |
| TW | 201334195 | 8/2013 |
| TW | I667777 | 8/2019 |
| WO | WO-2004/114391 | 12/2004 |
| WO | WO-2006/060519 | 6/2006 |
| WO | WO-2009/136645 | 11/2009 |
| WO | WO-2011/027723 | 3/2011 |
| WO | WO-2011/068022 | 6/2011 |
| WO | WO-2012/039310 | 3/2012 |
| WO | WO-2012/044344 | 4/2012 |
| WO | WO-2012/090973 | 7/2012 |
| WO | WO-2012/102181 | 8/2012 |
| WO | WO-2013/054933 | 4/2013 |
| WO | WO-2014/190657 | 12/2014 |

OTHER PUBLICATIONS

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Ikeda. T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9, and 16) in the $In_2O_3$—$ZnGa_2O_4$—ZnO System", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor", Science, May 23, 2003, vol. 300, No. 5623, pp. 1269-1272.
Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)m$ (M=In,Ga; m=Integer) Described by Four-Dimensional Superspace Group", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MoO_3$ as a Charge-Generation Layer", Adv. Mater. (Advanced Materials), 2006, vol. 18, No. 3, pp. 339-342.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Van de Walle.C, "Hydrogen as a Cause of Doping in Zinc Oxide", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Kurokawa. Y et al., "UHF RFCPUS on Flexible and Glass Substrates for Secure RFID Systems", Journal of Solid-State Circuits, 2008, vol. 43, No. 1, pp. 292-299.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.S et al., "Challenge to Future Displays: Transparent AM-OLED Driven by Peald Grown ZnO TFT", IMID '07 Digest, 2007, pp. 1249-1252.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17 22.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Miyasaka.M, "SUFTLA Flexible Microelectronics on Their Way to Business", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.
Lee.H et al., "Current Status of, Challenges to, and Perspective View of AM-OLED ", IDW '06 : Proceedings of the 13th International Display Workshops, Dec. 7, 2006, pp. 663-666.
Kikuchi.H et al., "62.2: Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Nakamura.M, "Synthesis of Homologous Compound with New Long-Period Structure", NIRIM Newsletter, Mar. 1, 1995, vol. 150, pp. 1-4.
Kikuchi.H et al., "Polymer-Stabilized Liquid Crystal Blue Phases", Nature Materials, Sep. 2, 2002, vol. 1, pp. 64-68.
Kimizuka.N et al., "Spinel, YbFe2O4, and Yb2Fe3O7 Types of Structures for Compounds in the In2O3 and SC2O3-A2O3-BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Kitzerow.H et al., "Observation of Blue Phases in Chiral Networks", Liquid Crystals, 1993, vol. 14, No. 3, pp. 911-916.
Costello.M et al., "Electron Microscopy of a Cholesteric Liquid Crystal and Its Blue Phase", Phys. Rev. a (Physical Review. A), May 1, 1984, vol. 29, No. 5, pp. 2957-2959.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Orita.M et al., "Mechanism of Electrical Conductivity of Transparent InGaZnO4", Phys. Rev. B (Physical Review. B), Jan. 15, 2000, vol. 61, No. 3, pp. 1811-1816.
Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.
Janotti.A et al., "Native Point Defects in ZnO", Phys. Rev. B (Physical Review. B), Oct. 4, 2007, vol. 76, No. 16, pp. 165202-1-165202-22.
Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Janotti.A et al., "Oxygen Vacancies in ZnO", Appl. Phys. Lett. (Applied Physics Letters), 2005, vol. 87, pp. 122102-1-122102-3.
Oba.F et al., "Defect energetics in ZnO: A hybrid Hartree-Fock density functional study", Phys. Rev. B (Physical Review. B), 2008, vol. 77, pp. 245202-1-245202-6.
Orita.M et al., "Amorphous transparent conductive oxide InGaO3(ZnO)m (m<4):a Zn4s conductor", Philosophical Magazine, 2001, vol. 81, No. 5, pp. 501-515.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Mo.Y et al., "Amorphous Oxide TFT Backplanes for Large Size AMOLED Displays", IDW '08 : Proceedings of the 6th International Display Workshops, Dec. 3, 2008, pp. 581-584.
Kim.S et al., "High-Performance oxide thin film transistors passivated by various gas plasmas", 214th ECS Meeting, 2008, No. 2317, ECS.
Clark.S et al., "First Principles Methods Using CASTEP", Zeitschrift fur Kristallographie, 2005, vol. 220, pp. 567-570.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

(56) References Cited

OTHER PUBLICATIONS

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.
Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.
Taiwanese Office Action (Application No. 104103057) dated Jun. 13, 2018.
Chinese Office Action (Application No. 201510060315.X) dated Nov. 26, 2018.
Taiwanese Office Action (Application No. 109120205) dated Dec. 30, 2020.
Jeon.S et al., "180nm Gate Length Amorphous InGaZnO Thin Film Transistor for High Density Image Sensor Applications", IEDM 10: Technical Digest of International Electron Devices Meeting, Dec. 6, 2010, pp. 504-507.
German Office Action (Application No. 102015201707.9) dated Mar. 11, 2021.
Taiwanese Office Action (Application No. 111101335) dated Feb. 22, 2022.
Chinese Office Action (Application No. 201910418591.7) dated Nov. 16, 2022.
Chinese Office Action (Application No. 202011132943.1), dated Apr. 20, 2024.

\* cited by examiner

100

150

100B

150B

100C

150C

100D

150D

100E

150E

CAAC-OS nc-OS as-sputtered

450°C After Heat Treatment

FIG. 21A  Initial State ($V_oH$)
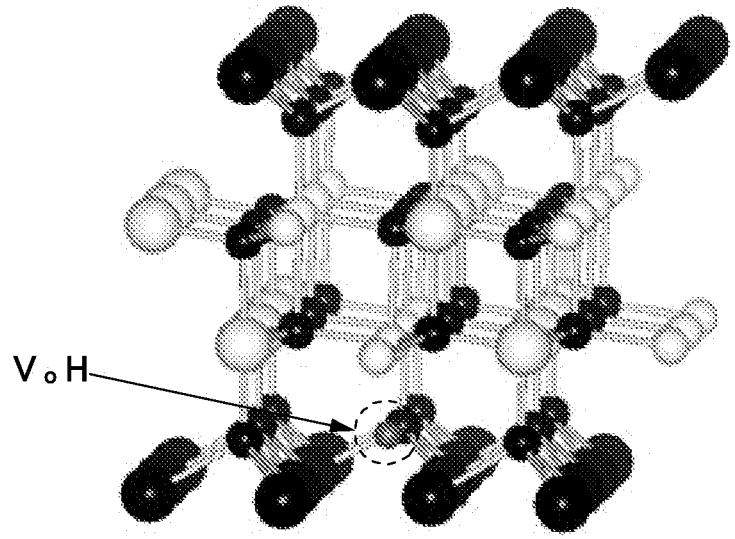
$V_oH$
FIG. 21B  Final State ($V_o$, H-O)
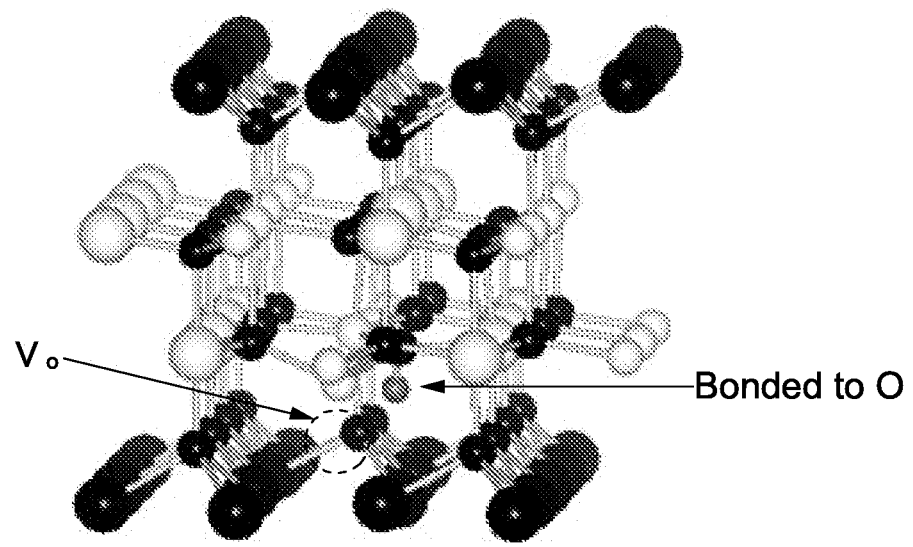
$V_o$
Bonded to O FIG. 23A  Initial State ($V_o$ H)
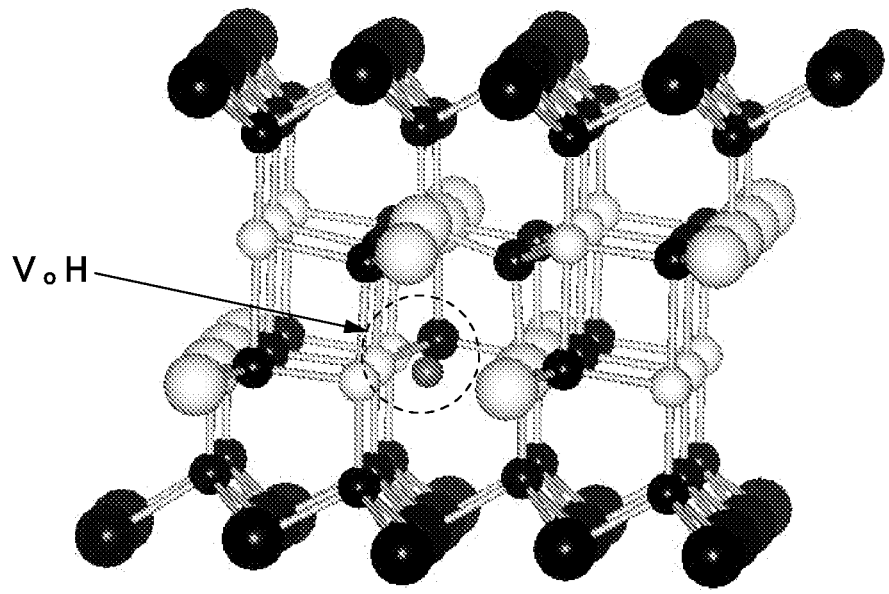
FIG. 23B  Final State ($V_o$, H-O)
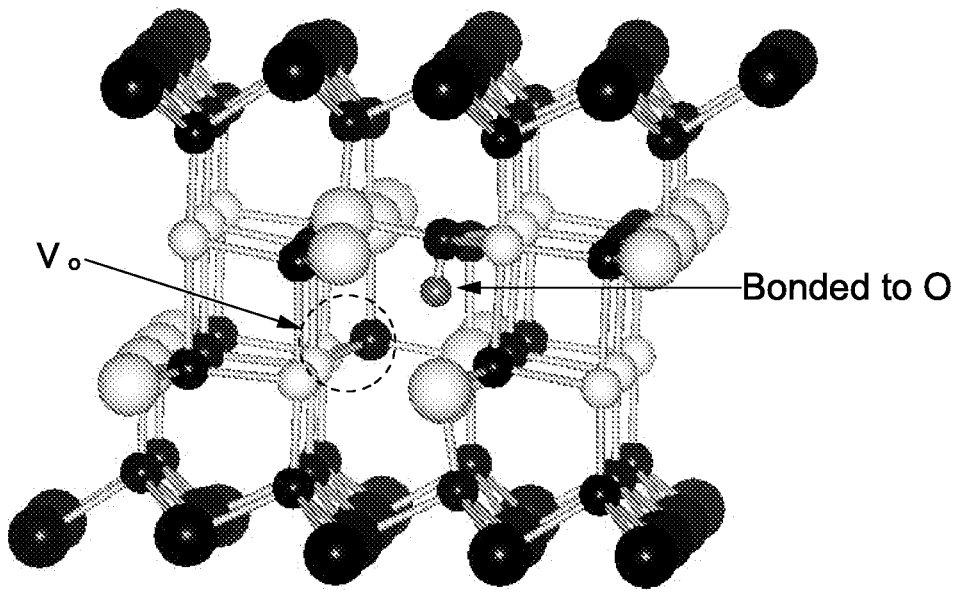

InGaZnO$_4$

100 Picosecond
After Ar Entering

100 Picosecond
After O Entering

In : ○   Ga : ○   Zn : ●   O : ●

Zn In Third Layer (Zn-O Layer)
Reaches Vincinity of Sixth Layer

Trajectories Of Atoms
From 0 picosecond
To 0.3 picosecond
After Ar Entering

Zn In Third Layer (Zn-O Layer)
Does Not Reach Fifth Layer

Trajectories Of Atoms
From 0 picosecond
To 0.3 picosecond
After O Entering

CAAC-OS Film    1 nm

Target    1 nm

SEMICONDUCTOR DEVICE, DISPLAY DEVICE INCLUDING THE SEMICONDUCTOR DEVICE, DISPLAY MODULE INCLUDING THE DISPLAY DEVICE, AND ELECTRONIC DEVICE INCLUDING THE SEMICONDUCTOR DEVICE, THE DISPLAY DEVICE, AND THE DISPLAY MODULE

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, or a manufacturing method. In addition, the present invention relates to a process, a machine, manufacture, or a composition of matter. In particular, one embodiment of the present invention relates to a semiconductor device, a display device, a light-emitting device, a power storage device, a storage device, a driving method thereof, or a manufacturing method thereof.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic devices such as an integrated circuit (IC) and an image display device (display device). A semiconductor material typified by silicon is widely known as a material for a semiconductor thin film applicable to a transistor. As another material, an oxide semiconductor has been attracting attention.

For example, a technique in which a transistor is manufactured using an amorphous oxide containing In, Zn, Ga, Sn, and the like as an oxide semiconductor is disclosed (see Patent Document 1). Furthermore, a technique in which a transistor using an oxide thin film and a self-aligned top-gate structure is manufactured is disclosed (see Patent Document 2).

REFERENCES

Patent Documents

[Patent Document 1] Japanese Published Patent Application No. 2006-165529
[Patent Document 2] Japanese Published Patent Application No. 2009-278115

SUMMARY OF THE INVENTION

As a transistor including an oxide semiconductor film, an inverted staggered transistor (also referred to as a transistor having a bottom-gate structure), a planar transistor (also referred to as a transistor having a top-gate structure), and the like are given. In the case where a transistor including an oxide semiconductor film is used for a display device, an inverted staggered transistor is used more often than a planar transistor because a manufacturing process thereof is relatively simple and manufacturing cost thereof can be kept low. However, signal delay or the like is increased by parasitic capacitance that exists between a gate electrode and source and drain electrodes of an inverted staggered transistor and accordingly image quality of a display device degrades, which has posed a problem, as an increase in screen size of a display device proceeds, or a display device is provided with a higher resolution image (for example, a high-resolution display device typified by 4 k×2 k pixels (3840 pixels in the horizontal direction and 2160 pixels in the perpendicular direction) or 8 k×4 k pixels (7680 pixels in the horizontal direction and 4320 pixels in the perpendicular direction)). Furthermore, as another problem, the occupation area of an inverted staggered transistor is larger than that of a planar transistor. Thus, with regard to a planar transistor including an oxide semiconductor film, development of a transistor which has a structure with stable semiconductor characteristics and high reliability and which is formed by a simple manufacturing process is desired.

With the increase in the screen size or the resolution of the display device, the structures of a transistor formed in a pixel of the display device and a capacitor connected to the transistor become important. The capacitor functions as a storage capacitor for storing data written to the pixel. Depending on the structure of the capacitor, there has been a problem in that data written to the pixel cannot be stored and the image quality of the display device is degraded.

In view of the foregoing problems, one object of one embodiment of the present invention is to provide a novel semiconductor device including a transistor having an oxide semiconductor. In particular, one object is to provide a semiconductor device including a planar type transistor having an oxide semiconductor. Another object is to provide a semiconductor device including a planar transistor having an oxide semiconductor and a capacitor connected to the transistor. Another object is to provide a semiconductor device including a transistor having an oxide semiconductor and having high on-state current. Another object is to provide a semiconductor device including a transistor having an oxide semiconductor and having low off-state current. Another object is to provide a semiconductor device including a transistor having an oxide semiconductor and occupying a small area. Another object is to provide a semiconductor device including a transistor having an oxide semiconductor and having a stable electrical characteristic. Another object is to provide a semiconductor device including an oxide semiconductor and having high reliability. Another object is to provide a novel semiconductor device. Another object is to provide a novel display device.

Note that the description of the above objects do not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor and a capacitor. The transistor includes an oxide semiconductor film, a gate insulating film over the oxide semiconductor film, a gate electrode over the gate insulating film, a second insulating film over the gate electrode, a third insulating film over the second insulating film, a source electrode over the third insulating film, and a drain electrode over the third insulating film. The source electrode is electrically connected to the oxide semiconductor film. The drain electrode is electrically connected to the oxide semiconductor film. The capacitor includes a first conductive film, a second conductive film, and the second insulating film. The first conductive film and the gate electrode are provided over the same surface, the second conductive film, the source electrode, and the drain electrode are provided over the same surface, and the second insulating film is provided between the first conductive film and the second conductive film. More details are described below.

One embodiment of the present invention is a semiconductor device including a transistor and a capacitor. The transistor includes an oxide semiconductor film over a first insulating film, a gate insulating film over the oxide semiconductor film, a gate electrode over the gate insulating film, a second insulating film over the gate electrode, a third insulating film over the second insulating film, a source electrode over the third insulating film, and a drain electrode over the third insulating film; the first insulating film includes oxygen; the second insulating film includes nitrogen; the source electrode is electrically connected to the oxide semiconductor film; and the drain electrode is electrically connected to the oxide semiconductor film. The capacitor includes a first conductive film, a second conductive film, and the second insulating film; the first conductive film and the gate electrode are provided over the same surface; the second conductive film, the source electrode, and the drain electrode are provided over the same surface; and the second insulating film is provided between the first conductive film and the second conductive film.

Another embodiment of the present invention is a semiconductor device including a transistor and a capacitor. The transistor includes a first gate electrode over a first insulating film, a first gate insulating film over the first gate electrode, an oxide semiconductor film over the first gate insulating film, a second gate insulating film over the oxide semiconductor film, a second gate electrode over the second gate insulating film, a second insulating film over the second gate electrode, a third insulating film over the second insulating film, a source electrode over the third insulating film, and a drain electrode over the third insulating film; the first gate insulating film includes oxygen; the second insulating film includes nitrogen; the source electrode is electrically connected to the oxide semiconductor film; and the drain electrode is electrically connected to the oxide semiconductor film. The capacitor includes a first conductive film, a second conductive film, and the second insulating film; the first conductive film and the second gate electrode are provided over the same surface; the second conductive film, the source electrode, and the drain electrode are provided over the same surface; and the second insulating film is provided between the first conductive film and the second conductive film.

In the above embodiment, it is preferable that the oxide semiconductor film include a first region and a second region, the first region have a region overlapping with the gate electrode, the second region have a region not overlapping with the gate electrode, the first region have a portion in which a concentration of an impurity element is a first concentration, the second region have a portion in which a concentration of the impurity element is a second concentration, and the first concentration be different from the second concentration. In the above embodiment, it is preferable that the oxide semiconductor film include a first region and a second region, the first region have a region overlapping with the second gate electrode, the second region have a region not overlapping with the second gate electrode, the first region have a portion in which a concentration of an impurity element is a first concentration, the second region have a portion in which a concentration of the impurity element is a second concentration, and the first concentration be different from the second concentration.

In any of the above embodiments, it is preferable that the impurity element include one or more of hydrogen, boron, carbon, nitrogen, fluorine, aluminum, silicon, phosphorus, chlorine, and a rare gas element. In any of the above embodiments, it is preferable that the impurity element include argon and hydrogen.

In any of the above embodiments, it is preferable that the second region have a region in contact with the second insulating film. In any of the above embodiments, it is preferable that the second region have a region with a higher concentration of the impurity element than the first region. In any of the above embodiments, it is preferable that the first region have a region with higher crystallinity than the second region.

In any of the above embodiments, it is preferable that the oxide semiconductor film contain oxygen, In, Zn, and M (M is Ti, Ga, Y, Zr, La, Ce, Nd, or Hf). In any of the above embodiments, it is preferable that the oxide semiconductor film include a crystal part having c-axis alignment and a portion in which the c-axis is parallel to a normal vector of a surface where the oxide semiconductor film is formed.

Another embodiment of the present invention is a display device including the semiconductor device according to any one of the above embodiments and a display element. Another embodiment of the present invention is a display module including the display device and a touch sensor. Another embodiment of the present invention is an electronic device including the semiconductor device according to any one of the above embodiments, the display device, or the display module, and an operation key or a battery.

According to one embodiment of the present invention, a novel semiconductor device including a transistor having an oxide semiconductor can be provided. In particular, a semiconductor device including a planar type transistor having an oxide semiconductor can be provided. Alternatively, a semiconductor device including a planar transistor having an oxide semiconductor and a capacitor connected to the transistor can be provided, a semiconductor device including a transistor having an oxide semiconductor and having high on-state current can be provided, a semiconductor device including a transistor having an oxide semiconductor and having low off-state current can be provided, a semiconductor device including a transistor having an oxide semiconductor and occupying a small area can be provided, a semiconductor device including a transistor having an oxide semiconductor and having a stable electrical characteristic can be provided, a semiconductor device including an oxide semiconductor and having high reliability can be provided, a novel semiconductor device can be provided, or a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 21A and 21B show an initial state and a final state, respectively.

FIGS. 23A and 23B illustrate an initial state and a final state, respectively.

FIGS. 40B and 40C are cross-sectional views of pellets and a CAAC-OS.

DETAILED DESCRIPTION OF THE INVENTION

Figure 1A:
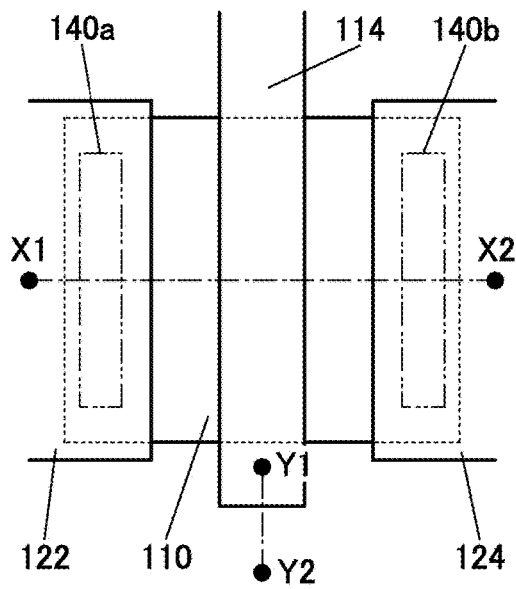
FIGS. 1A to 1D are top views and cross-sectional views which illustrate one embodiment of a semiconductor device.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. In addition, the transistor has a channel region between a drain (a drain terminal, a drain region, or a drain electrode) and a source (a source terminal, a source region, or a source electrode), and current can flow through the drain region, the channel region, and the source region. Note that in this specification and the like, a channel region refers to a region through which current mainly flows.

Further, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Embodiment 1

In this embodiment, a semiconductor device in which a transistor and a capacitor are provided over the same substrate and a method for manufacturing the semiconductor device are described with reference to FIGS. 1A to 1D, FIG. 2, FIGS. 3A to 3D, FIGS. 4A and 4B, FIGS. 5A to 5D, FIG. 6, FIGS. 7A to 7D, FIGS. 8A to 8D, FIGS. 9A to 9D, FIG. 10, FIGS. 11A to 11C, FIGS. 12A to 12H, FIGS. 13A to 13F, FIGS. 14A to 14F, FIGS. 15A to 15F, and FIGS. 16A to 16F.

<Structure 1 of Semiconductor Device>

FIGS. 1A to 1D illustrate an example of a semiconductor device in which a transistor and a capacitor are provided over the same substrate. Note that the transistor has a top-gate structure.

Figure 1B:
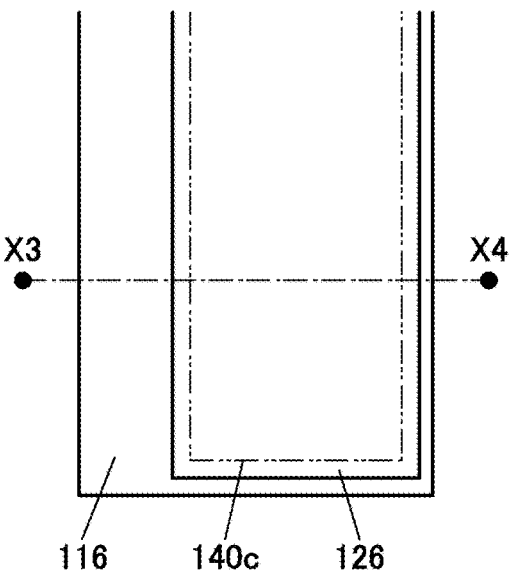
Figure 1C:
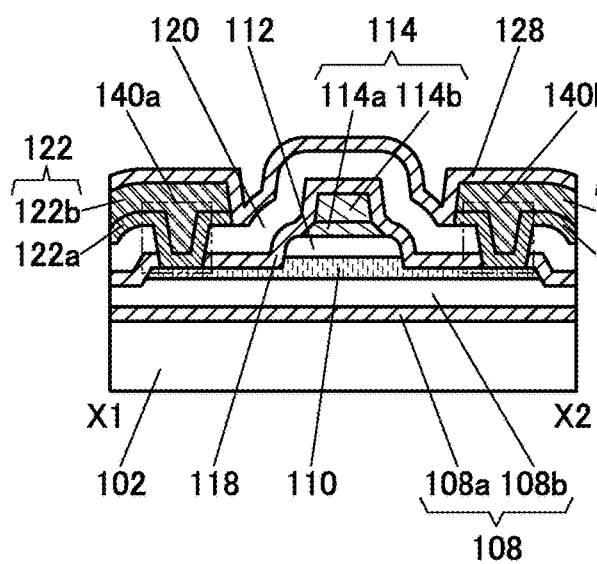
Figure 1D:
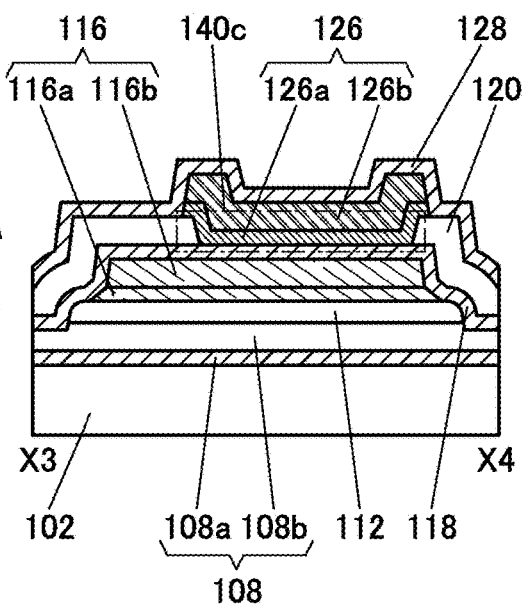

FIG. 1A is a top view of a transistor 100 included in the semiconductor device. FIG. 1B is a top view of a capacitor 150 included in the semiconductor device. FIG. 1C is a cross-sectional view along the dashed-dotted line X1-X2 in FIG. 1A. FIG. 1D is a cross-sectional view along the dashed-dotted line X3-X4 in FIG. 1B. Note that in FIGS. 1A and 1B, a substrate 102, an insulating film 104, an insulating film 108, an insulating film 118, an insulating film 120, and the like are not illustrated for simplicity. In a manner similar to that of FIGS. 1A and 1B, some components are not illustrated in some cases in top views of transistors and capacitors described below. Furthermore, the direction of the dashed-dotted line X1-X2 may be called a channel length direction, and the direction of the dashed-dotted line Y1-Y2 may be called a channel width direction.

The transistor 100 illustrated in FIGS. 1A and 1C includes the insulating film 108 formed over the substrate 102, an oxide semiconductor film 110 over the insulating film 108, an insulating film 112 over the oxide semiconductor film 110, a conductive film 114 overlapping with the oxide semiconductor film 110 with the insulating film 112 provided therebetween, the insulating film 118 covering the oxide semiconductor film 110, the insulating film 112, and the conductive film 114, the insulating film 120 over the insulating film 118, a conductive film 122 connected to the oxide semiconductor film 110 through an opening portion 140a provided in the insulating film 118 and the insulating film 120, and a conductive film 124 connected to the oxide semiconductor film 110 through an opening portion 140b provided in the insulating film 118 and the insulating film 120. Note that an insulating film 128 covering the insulating film 120, the conductive film 122, and the conductive film 124 may be provided over the transistor 100.

Note that in FIG. 1C, the insulating film 108 has a stacked-layer structure of an insulating film 108a and an insulating film 108b over the insulating film 108a. The conductive film 114 has a stacked-layer structure of a conductive film 114a and a conductive film 114b over the conductive film 114a. The conductive film 122 has a stacked-layer structure of a conductive film 122a and a conductive film 122b over the conductive film 122a. The conductive film 124 has a stacked-layer structure of a conductive film 124a and a conductive film 124b over the conductive film 124a.

In the transistor 100, the conductive film 114 functions as a gate electrode (also referred to as a top-gate electrode), the conductive film 122 functions as one of a source electrode and a drain electrode, and the conductive film 124 functions as the other of the source electrode and the drain electrode. Furthermore, in the transistor 100, the insulating film 108 functions as a base film of the oxide semiconductor film 110 and the insulating film 112 functions as a gate insulating film.

The capacitor 150 illustrated in FIGS. 1B and 1D includes the insulating film 108 formed over the substrate 102, the insulating film 112 over the insulating film 108, a conductive film 116 over the insulating film 112, the insulating film 118 covering the insulating film 108, the insulating film 112, and the conductive film 116, the insulating film 120 over the insulating film 118, and a conductive film 126 overlapping with the conductive film 116 with the insulating film 118 provided therebetween in an opening portion 140c provided in the insulating film 120. Note that the insulating film 128 covering the insulating film 120 and the conductive film 126 may be provided over the capacitor 150.

Note that in FIG. 1D, the insulating film 108 has a stacked-layer structure of the insulating film 108a and the insulating film 108b over the insulating film 108a. The conductive film 116 has a stacked-layer structure of a conductive film 116a and a conductive film 116b over the conductive film 116a. The conductive film 126 has a stacked-layer structure of a conductive film 126a and a conductive film 126b over the conductive film 126a.

Furthermore, the capacitor 150 has a structure in which a dielectric is provided between a pair of electrodes. In more detail, one of the pair of electrodes is the conductive film 116, the other of the pair of electrodes is the conductive film 126, and the insulating film 118 between the conductive film 116 and the conductive film 126 functions as the dielectric.

Note that the conductive film 114 functioning as the gate electrode of the transistor 100 and the conductive film 116 functioning as the one of the pair of electrodes of the capacitor 150 are formed in the same step, and the conductive films 114 and 116 are at least partly formed over the same surface. Furthermore, the conductive film 122 and the conductive film 124 that function as the source electrode and the drain electrode of the transistor 100 and the conductive film 126 functioning as the other of the pair of electrodes of the capacitor 150 are formed in the same step, and the conductive films 122, 124, and 126 are at least partly formed over the same surface.

As described above, by forming the conductive films that function as the electrodes of the transistor 100 and the capacitor 150 in the same step, a manufacturing cost can be reduced.

Furthermore, in the capacitor 150, the insulating film 120 has the opening portion 140c. Therefore, in an insulating film in which the insulating film 118 and the insulating film 120 are stacked, only the insulating film 118 is made to function as the dielectric. The capacitor 150 having such a structure can have a high capacitance value, and accordingly, a display device can have a high capacitance value.

Figure 2:
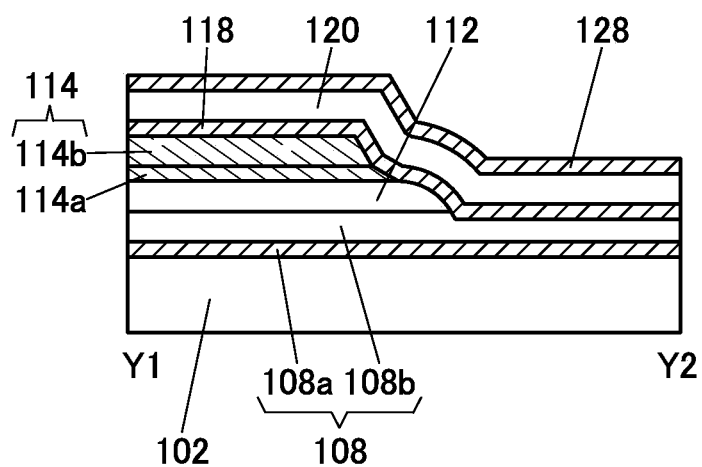
FIG. 2 is a cross-sectional view illustrating one embodiment of a semiconductor device.

FIG. 2 is a cross-sectional view of the transistor 100 illustrated in FIG. 1A in the dashed-dotted line Y1-Y2 direction (the channel width direction).

As illustrated in FIG. 2, an end portion of the conductive film 114a is positioned on the outer side than an end portion of the conductive film 114b in the channel width direction. Furthermore, an end portion of the insulating film 112 is positioned on the outer side than the end portion of the conductive film 114a. Furthermore, the insulating film 108b has a depressed portion in a region that does not overlap with the insulating film 112. By using such a structure, the coverage with the insulating films 118, 120, and 128 can be increased.

Next, the oxide semiconductor film 110 included in the transistor 100 is described in detail below.

An element which forms an oxygen vacancy is contained in a region that does not overlap with the conductive film 114 in the oxide semiconductor film 110 of the transistor 100. Hereinafter, elements which form oxygen vacancies are described as impurity elements. Typical examples of impurity elements are hydrogen, boron, carbon, nitrogen, fluorine, aluminum, silicon, phosphorus, chlorine, and rare gas elements. Typical examples of rare gas elements are helium, neon, argon, krypton, and xenon.

When the impurity element is added to the oxide semiconductor film, a bond between a metal element and oxygen in the oxide semiconductor film is cut, whereby an oxygen vacancy is formed. When the impurity element is added to the oxide semiconductor film, oxygen bonded to a metal element in the oxide semiconductor film is bonded to the impurity element, whereby oxygen is detached from the metal element and accordingly an oxygen vacancy is formed. As a result, the oxide semiconductor film has a higher carrier density and thus the conductivity thereof becomes higher.

When hydrogen is added to an oxide semiconductor in which an oxygen vacancy is generated by addition of the impurity element, hydrogen enters an oxygen vacant site and forms a donor level in the vicinity of the conduction band. As a result, the conductivity of the oxide semiconductor is increased, so that the oxide semiconductor becomes a conductor. An oxide semiconductor having become a conductor can be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small, and an oxide conductor has a visible light transmitting property comparable to that of an oxide semiconductor.

Here, the temperature dependence of resistivity of a film formed with an oxide conductor (hereinafter referred to as an oxide conductor film) is described with reference to FIG. 39.

Here, a sample including an oxide conductor film was formed. As the oxide conductor film, an oxide conductor film (OC_SiN$_x$) formed by making the oxide semiconductor film in contact with a silicon nitride film, an oxide conductor film (OC_Ar dope+SiN$_x$) formed by making the oxide semiconductor film in contact with a silicon nitride film after addition of argon to the oxide semiconductor film with a doping apparatus, or an oxide conductor film (OC_Ar plasma+SiN$_x$) formed by making the oxide semiconductor film in contact with a silicon nitride film after exposure of the oxide semiconductor film to argon plasma with a plasma treatment apparatus was formed. The silicon nitride film contains hydrogen.

A method for forming a sample including the oxide conductor film (OC_SiN$_x$) is as follows. A 400-nm-thick silicon oxynitride film was formed over a glass substrate by a plasma CVD method and then exposed to oxygen plasma so that an oxygen ion was added to the silicon oxynitride film, whereby a silicon oxynitride film that releases oxygen by being heated was formed. Next, a 100-nm-thick In—Ga—Zn oxide film was formed over the silicon oxynitride film that releases oxygen by being heated by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Next, a 100-nm-thick silicon nitride film was formed by a plasma CVD method. Then, the film was subjected to heat treatment in a mixed gas of nitrogen and oxygen at 350° C.

A method for forming a sample including the oxide conductor film (OC_Ar dope+SiN$_x$) is as follows. A 400-nm-thick silicon oxynitride film was formed over a glass substrate by a plasma CVD method and then exposed to oxygen plasma so that an oxygen ion was added to the silicon oxynitride film, whereby a silicon oxynitride film that releases oxygen by being heated was formed. Next, a 100-nm-thick In—Ga—Zn oxide film was formed over the silicon oxynitride film that releases oxygen by being heated by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Next, with a doping apparatus, argon with a dose of $5 \times 10^{14}$ ions/cm$^2$ was added to the In—Ga—Zn oxide film at an accelerating voltage of 10 kV, and oxygen vacancies were formed in the In—Ga—Zn oxide film. Next, a 100-nm-thick silicon nitride film was formed by a plasma CVD method. Then, the film was subjected to heat treatment in a mixed gas of nitrogen and oxygen at 350° C.

A method for forming a sample including the oxide conductor film (OC_Ar plasma+SiN$_x$) is as follows. A 400-nm-thick silicon oxynitride film was formed over a glass substrate by a plasma CVD method and then exposed to oxygen plasma, whereby a silicon oxynitride film that releases oxygen by being heated was formed. Next, a 100-nm-thick In—Ga—Zn oxide film was formed over the silicon oxynitride film that releases oxygen by being heated by a sputtering method using a sputtering target in which the atomic ratio of In to Ga and Zn was 1:1:1.2, and heat treatment was performed at 450° C. in a nitrogen atmosphere and then heat treatment was performed at 450° C. in a mixed atmosphere of nitrogen and oxygen. Then, in a plasma treatment apparatus, argon plasma was generated, accelerated argon ions were made to collide with the In—Ga—Zn oxide film, and oxygen vacancies were formed in the In—Ga—Zn oxide film. Next, a 100-nm-thick silicon nitride film was formed by a plasma CVD method. Then, the film was subjected to heat treatment in a mixed gas of nitrogen and oxygen at 350° C.

Figure 39:
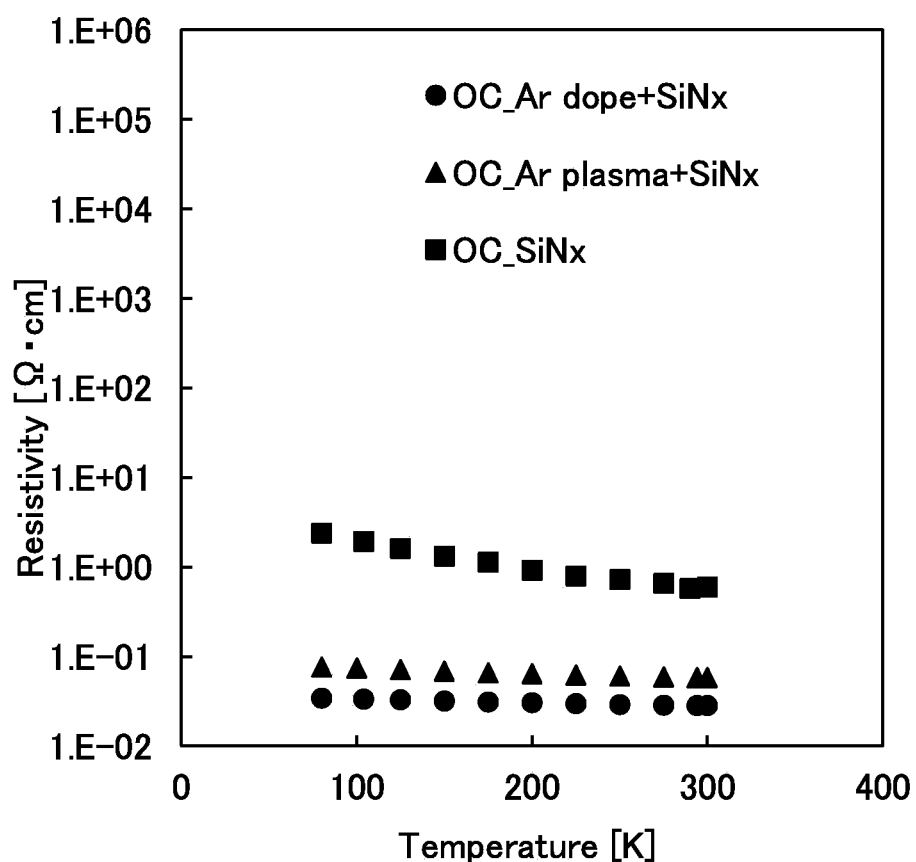
FIG. 39 shows temperature dependence of resistivity.

Next, FIG. 39 shows the measured resistivity of the samples. Here, the resistivity was measured by the Van der Pauw method using four terminals. In FIG. 39, the horizontal axis represents measurement temperature, and the vertical axis represents resistivity. Measurement results of the oxide conductor film (OC_SiN$_x$) are plotted as squares, measurement results of the oxide conductor film (OC_Ar dope+SiN$_x$) are plotted as circles, and measurement results of the oxide conductor film (OC_Ar plasma+SiN$_x$) are plotted as triangles.

Note that although not shown, the oxide semiconductor film which is not in contact with the silicon nitride film had high resistivity, which was difficult to measure. Therefore, it is found that the oxide conductor film has lower resistivity than the oxide semiconductor film.

According to FIG. 39, in the case where the oxide conductor film (OC_Ar dope+SiN$_x$) and the oxide conductor film (OC_Ar plasma+SiN$_x$) contain an oxygen vacancy and hydrogen, variation in resistivity is small. Typically, the variation in resistivity at temperatures from 80 K to 290 K is lower than ±20%. Alternatively, the variation in resistivity at temperatures from 150 K to 250 K is lower than ±10%. In other words, the oxide conductor is a degenerate semiconductor and it is suggested that the conduction band edge agrees with or substantially agrees with the Fermi level. Thus, when the oxide conductor film is used as a source region and a drain region of a transistor, an ohmic contact is made at a portion where the oxide conductor film is in contact with a conductive film functioning as a source electrode and a drain electrode, and the contact resistance of the oxide conductor film and the conductive film functioning as a source electrode and a drain electrode can be reduced. Furthermore, the oxide conductor has low temperature dependence of resistivity; thus, a fluctuation of contact resistance of the oxide conductor film and a conductive film functioning as a source electrode and a drain electrode is small, and a highly reliable transistor can be obtained.

FIGS. 3A to 3D and FIGS. 4A and 4B are enlarged views of the vicinity of the oxide semiconductor film 110. Note that in FIGS. 3A to 3D and FIGS. 4A and 4B, some components are not illustrated in order to avoid complexity.

A region in which the carrier density of the oxide semiconductor film is increased and the conductivity thereof is increased (hereinafter such a region is referred to as a low-resistance region) is formed in a cross section of the oxide semiconductor film 110 in the channel length direction. Furthermore, low-resistance regions formed in the oxide semiconductor film 110 can have a plurality of structures as illustrated in FIGS. 3A to 3D and FIGS. 4A and 4B. Note that in FIGS. 3A to 3D and FIGS. 4A and 4B, a channel length L corresponds to a length of a region between a pair of low-resistance regions.

Figure 3A:
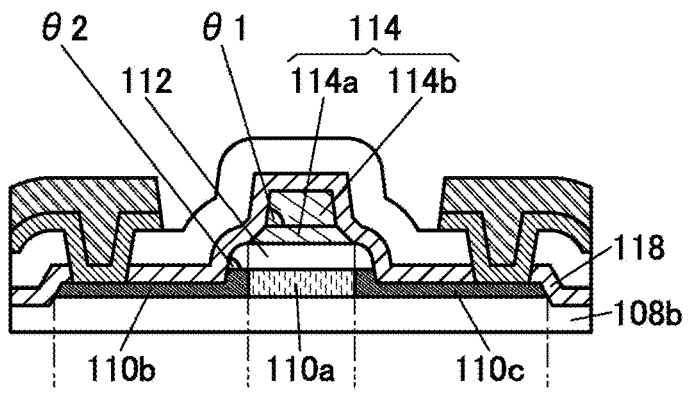
FIGS. 3A to 3D are cross-sectional views each illustrating one embodiment of a semiconductor device.

As illustrated in FIG. 3A, the oxide semiconductor film 110 includes a channel region 110a formed in a region overlapping with the conductive film 114 and low-resistance regions 110b and 110c between which the channel region 110a is provided and which contain the impurity elements. Note that as illustrated in FIG. 3A, in the cross-sectional shape in the channel length direction, the boundaries between the channel region 110a and the low-resistance regions 110b and 110c coincide with or substantially coincide with bottom end portions of the conductive film 114a, with the insulating film 112 provided between the conductive film 114a and the boundaries. That is, in a top surface shape, the boundaries between the channel region 110a and the low-resistance regions 110b and 110c coincide with or substantially coincide with the bottom end portions of the conductive film 114a.

Note that as illustrated in FIG. 3A, in the cross-sectional shape in the channel length direction, the end portion of the conductive film 114a may be positioned on the outer side than the end portion of the conductive film 114b and the conductive film 114b may have a tapered shape. That is, an angle θ1 formed between a surface where the conductive film 114a and the conductive film 114b are in contact with each other and a side surface of the conductive film 114b may be less than 90°, greater than or equal to 10° and less than or equal to 85°, greater than or equal to 15° and less than or equal to 85°, greater than or equal to 30° and less than or equal to 85°, greater than or equal to 450 and less than or equal to 85°, or greater than or equal to 600 and less than or equal to 85°. When the angle θ1 is less than 90°, greater than or equal to 10° and less than or equal to 85°, greater than or equal to 15° and less than or equal to 85°, greater than or equal to 300 and less than or equal to 85°, greater than or equal to 450 and less than or equal to 85°, or greater than or equal to 60° and less than or equal to 85°, the coverage of the side surfaces of the insulating film 114b with the insulating film 118 can be increased.

As illustrated in FIG. 3A, in the cross-sectional shape in the channel length direction, the end portion of the insulating film 112 may be positioned on the outer side than the end portions of the conductive film 114a and the conductive film 114b. The end portion of the insulating film 112 may be partly arc-shaped. Alternatively, the insulating film 112 may have a tapered shape. That is, an angle θ2 formed between a surface where the oxide semiconductor film 110 and the insulating film 112 are in contact with each other and a side surface of the insulating film 112 may be less than 90°, preferably greater than or equal to 30° and less than 90°.

Figure 3B:
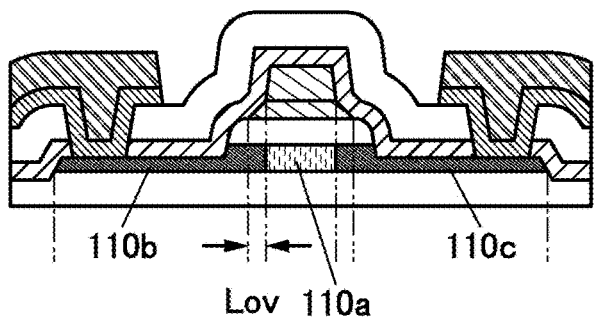

Alternatively, as illustrated in FIG. 3B, in a cross-sectional shape in the channel length direction, the low-resistance regions 110b and 110c each have a region overlapping with the conductive film 114 with the insulating film 112 provided therebetween. The regions function as an overlap region. The overlap region in the channel length direction is referred to as $L_{ov}$. $L_{ov}$ is smaller than 20%, smaller than 10%, smaller than 5%, or smaller than 2% of the channel length L.

Figure 3C:
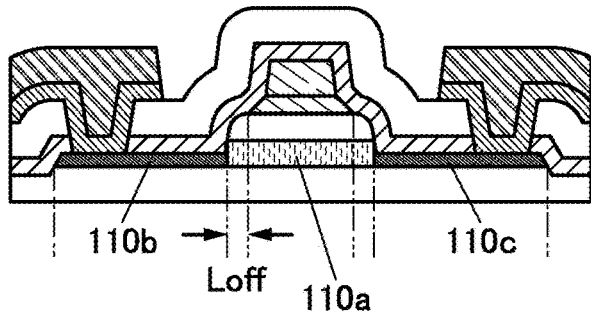

Alternatively, as illustrated in FIG. 3C, in a cross-sectional shape in the channel length direction, the channel region 110a has a region that does not overlap with the bottom end portion of the conductive film 114a. The region functions as an offset region. The length of the offset region in the channel length direction is referred to as $L_{off}$. Note that when a plurality of offset regions is provided, $L_{off}$ indicates the length of one offset region. $L_{off}$ is included in the channel length L. Note that $L_{off}$ is smaller than 20%, smaller than 10%, smaller than 5%, or smaller than 2% of the channel length L.

Figure 3D:
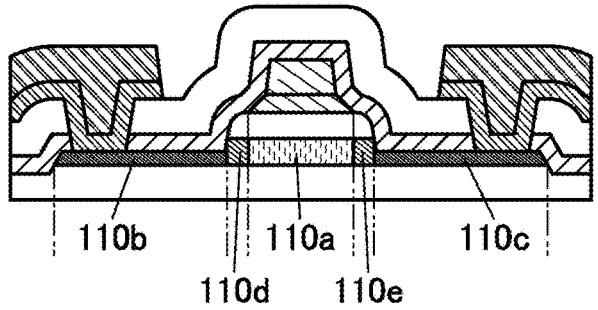

Alternatively, as illustrated in FIG. 3D, in a cross-sectional shape in the channel length direction, the oxide semiconductor film 110 includes a low-resistance region 110d between the channel region 110a and the low-resistance region 110b, and a low-resistance region 110e between the channel region 110a and the low-resistance region 110c.

The low-resistance regions 110d and 110e have lower impurity element concentrations and higher resistivity than the low-resistance regions 110b and 110c. Here, the low-resistance regions 110d and 110e overlap with the insulating film 112, but they may overlap with the insulating film 112 and the conductive film 114.

Figure 4A:
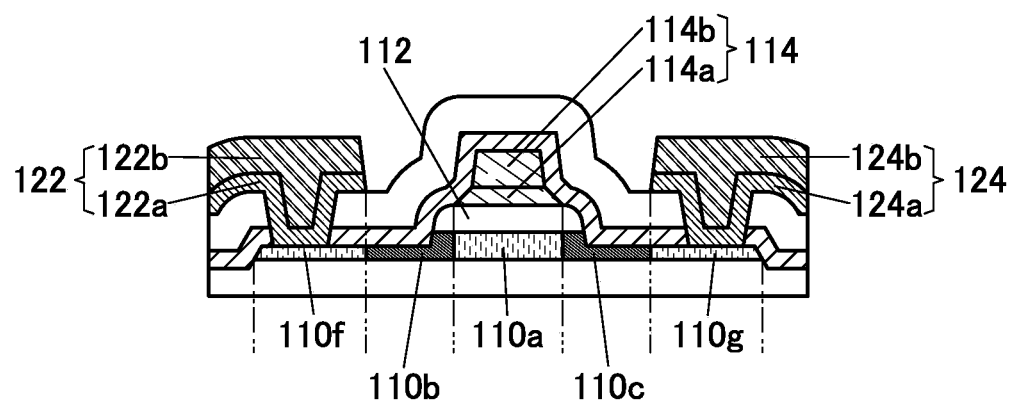
FIGS. 4A and 4B are cross-sectional views each illustrating one embodiment of a semiconductor device.

Alternatively, as illustrated in FIG. 4A, in a cross-sectional shape in the channel length direction, the oxide semiconductor film 110 includes regions 110f and 110g in regions overlapping with the conductive films 122 and 124. The impurity element is not necessarily added to the regions 110f and 110g. In this case, the oxide semiconductor film 110 includes regions containing the impurity elements, i.e., the low-resistance regions 110b and 110c. The low-resistance region (110b or 110c) is provided between the channel region 110a and the region (110f or 110g) in contact with the conductive film (122 or 124). The regions 110f and 110g have conductivity when voltage is applied to the conductive films 122 and 124; thus, the regions 110f and 110g function as a source region and a drain region.

Note that the structure illustrated in FIG. 4A is formed as follows: after the conductive films 122 and 124 are formed, the impurity element is added to the oxide semiconductor film 110 through the insulating film 120 and the insulating film 118 using the conductive films 114, 122, and 124 as masks.

Figure 4B:
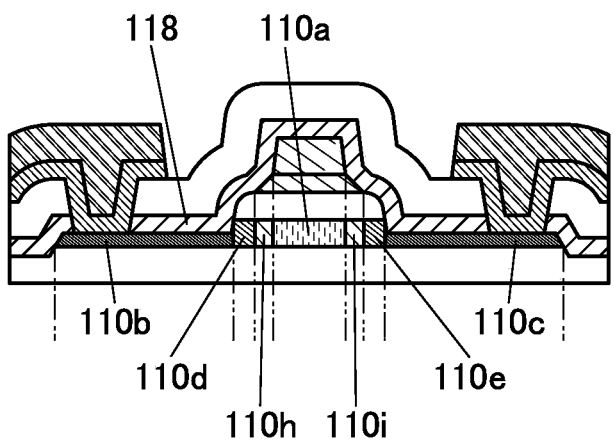

Alternatively, as illustrated in FIG. 4B, in a cross-sectional shape in the channel length direction, the low-resistance regions 110b, 110c, 110d, 110e, 110h, and 110i between which the channel region 110a is provided may be provided.

Specifically, the oxide semiconductor film 110 illustrated in FIG. 4B includes the channel region 110a, the low-resistance regions 110h and 110i between which the channel region 110a is provided, the low-resistance regions 110d and 110e between which the low-resistance regions 110h and 110i are provided, and the low-resistance regions 110b and 110c between which the low-resistance regions 110d and 110e are provided. The low-resistance regions 110h and 110i are formed by adding the impurity element through regions of the conductive film 114a and the insulating film 112 not overlapping with the conductive film 114b. The low-resistance regions 110d and 110e are formed by adding the impurity element through regions of the insulating film 112 not overlapping with the conductive film 114a and the conductive film 114b. The low-resistance regions 110b and 110c are formed by directly adding the impurity element. Therefore, the low-resistance regions 110h and 110i have lower impurity concentrations and higher resistivity than the low-resistance regions 110d and 110e and the low-resistance regions 110b and 110c. Furthermore, the low-resistance regions 110d and 110e have lower impurity concentrations and higher resistivity than the low-resistance regions 110b and 110c.

Note that in FIG. 4B, the channel region 110a overlaps with the conductive film 114b. Furthermore, the low-resistance regions 110h and 110i overlap with the conductive film 114a projecting outside the conductive film 114b. Furthermore, the low-resistance regions 110d and 110e overlap with the insulating film 112 projecting outside the conductive film 114a. Furthermore, the low-resistance regions 110b and 110c project outside the insulating film 112 and overlap with the insulating film 118.

As illustrated in FIG. 3D and FIG. 4B, the oxide semiconductor film 110 includes the low-resistance regions 110d, 110e, 110h, and 110i having lower impurity element concentrations and higher resistivity than the low-resistance regions 110b and 110c, whereby the electric field of the drain region can be relaxed. Thus, change in the threshold voltage of the transistor due to the electric field of the drain region can be reduced.

The oxide semiconductor films 110 illustrated in FIGS. 3A to 3D and FIGS. 4A and 4B each include a region that does not overlap with the insulating film 112 and the conductive film 114 and is thinner than a region of the oxide semiconductor film 110 overlapping with the insulating film 112 and the conductive film 114. The thin region is thinner than the region of the oxide semiconductor film overlapping with the insulating film 112 and the conductive film 114; the thickness of the thin region is greater than or equal to 0.1 nm and less than or equal to 5 nm.

Note that the low-resistance regions 110b and 110c in the oxide semiconductor film 110 function as a source region and a drain region. Furthermore, the impurity element is contained in the low-resistance regions 110b and 110c and the low-resistance regions 110d, 110e, 110h, and 110i.

In the case where the impurity element is a rare gas element and the oxide semiconductor film 110 is formed by a sputtering method, the channel region 110a and the low-resistance regions 110b, 110c, 110d, 110e, 110h, and 110i each contain a rare gas element. Note that the concentrations of the rare gas elements in the low-resistance regions 110b and 110c are higher than the concentration of the rare gas element in the channel region 110a. Furthermore, the concentrations of the rare gas elements in the low-resistance regions 110b and 110c are higher than the concentrations of the rare gas elements in the low-resistance regions 110d and 110e. Furthermore, the concentrations of the rare gas elements in the low-resistance regions 110d and 110e are higher than the concentrations of the rare gas elements in the low-resistance regions 110h and 110i.

The reasons for this are as follows: in the case where the oxide semiconductor film 110 is formed by a sputtering method, a rare gas is used as a sputtering gas, so that the oxide semiconductor film 110 contains the rare gas; and a rare gas is intentionally added to the low-resistance regions 110b and 110c in order to form oxygen vacancies in the low-resistance regions 110b and 110c. Furthermore, the low-resistance regions 110d, 110e, 110h, and 110i have different concentrations of rare gas elements added to form oxygen vacancies. The difference in rare gas concentration is due to a difference in the structures and thicknesses of films formed over the low-resistance regions 110d, 110e, 110h, and 110i. Note that a rare gas element different from the rare gas element contained in the channel region 110a may be added to the low-resistance regions 110b, 110c, 110d, 110e, 110h, and 110i.

In the case where the impurity element is boron, carbon, nitrogen, fluorine, aluminum, silicon, phosphorus, or chlorine, the low-resistance regions 110b, 110c, 110d, 110e, 110h, and 110i contain the above-described impurity element. Therefore, the concentrations of the impurity elements in the low-resistance regions 110b, 110c, 110d, 110e, 110h, and 110i are higher than the concentration of the impurity element in the channel region 110a. Note that the concentrations of the impurity elements in the low-resistance regions 110b, 110c, 110d, 110e, 110h, and 110i which are measured by secondary ion mass spectrometry (SIMS) can be greater than or equal to $5 \times 10^{18}$ atoms/cm$^3$ and less than or equal to $1 \times 10^{22}$ atoms/cm$^3$, greater than or equal to $1 \times 10^{19}$ atoms/cm$^3$ and less than or equal to $1 \times 10^{21}$ atoms/cm$^3$, or greater than or equal to $5 \times 10^{19}$ atoms/cm$^3$ and less than or equal to $5 \times 10^{20}$ atoms/cm$^3$.

The impurity element concentrations in the low-resistance regions 110b, 110c, 110d, 110e, 110h, and 110i are higher than those in the channel region 110a in the case where the impurity elements are hydrogen. Note that the concentrations of hydrogen in the low-resistance regions 110b, 110c, 110d, 110e, 110h, and 110i which are measured by SIMS can be higher than or equal to $8 \times 10^{19}$ atoms/cm$^3$, higher than or equal to $1 \times 10^{20}$ atoms/cm$^3$, or higher than or equal to $5 \times 10^{20}$ atoms/cm$^3$.

Since the low-resistance regions 110b, 110c, 110d, 110e, 110h, and 110i contain the impurity elements, oxygen vacancies and carrier densities are increased. As a result, the low-resistance regions 110b, 110c, 110d, 110e, 110h, and 110i have higher conductivity.

Note that the impurity element may be a combination of a rare gas and one or more of hydrogen, boron, carbon, nitrogen, fluorine, aluminum, silicon, phosphorus, and chlorine. In that case, in the low-resistance regions 110b, 110c, 110d, 110e, 110h, and 110i, by interaction between oxygen vacancies formed by the rare gas and one or more of hydrogen, boron, carbon, nitrogen, fluorine, aluminum, silicon, phosphorus, and chlorine which is added, the conductivity of the low-resistance regions 110b, 110c, 110d, 110e, 110h, and 110i is further increased in some cases.

Furthermore, when hydrogen is added to an oxide semiconductor in which an oxygen vacancy is generated by addition of the impurity element, hydrogen enters an oxygen vacant site and forms a donor level in the vicinity of the conduction band. Consequently, an oxide conductor can be formed. Accordingly, the oxide conductor has a light-transmitting property. Here, an oxide conductor refers to an oxide semiconductor having become a conductor.

The oxide conductor is a degenerate semiconductor and it is suggested that the conduction band edge agrees with or substantially agrees with the Fermi level. For that reason, an ohmic contact is made between the oxide conductor film and the conductive films functioning as a source electrode and a drain electrode; thus, contact resistance between the oxide conductor film and the conductive films functioning as a source electrode and a drain electrode can be reduced.

In the transistor 100 described in this embodiment, the channel region 110a is sandwiched between the low-resistance regions 110b and 110c functioning as a source region and a drain region. Therefore, the on-state current and field-effect mobility of the transistor 100 are high. In addition, in the transistor 100, the impurity element is added to the oxide semiconductor film 110 using the conductive film 114 as a mask. That is, the low-resistance region can be formed in a self-aligned manner.

Furthermore, in the transistor 100, the conductive film 114 functioning as a gate electrode does not overlap with the conductive films 122 and 124 functioning as a source electrode and a drain electrode. Therefore, parasitic capacitance between the conductive film 114 and the conductive films 122 and 124 can be reduced. As a result, in the case where a large-area substrate is used as the substrate 102, signal delay in the conductive film 114 and the conductive films 122 and 124 can be reduced.

Next, details of other elements included in the semiconductor device illustrated in FIGS. 1A to 1D are described.

The type of the substrate 102 is not limited to a certain type, and any of a variety of substrates can be used as the substrate 102. As the substrate, a semiconductor substrate (e.g., a single crystal substrate or a silicon substrate), an SOI substrate, a glass substrate, a quartz substrate, a plastic substrate, a metal substrate, a stainless steel substrate, a substrate including stainless steel foil, a tungsten substrate, a substrate including tungsten foil, a flexible substrate, an attachment film, paper including a fibrous material, a base material film, or the like can be used, for example. As an example of a glass substrate, a barium borosilicate glass substrate, an aluminoborosilicate glass substrate, soda lime glass substrate, and the like can be given. Examples of the flexible substrate, the attachment film, and the base material film are plastics typified by polyethylene terephthalate (PET), polyethylene naphthalate (PEN), and polyether sulfone (PES), a synthetic resin of acrylic or the like, polyester, polypropylene, polyvinyl fluoride, polyvinyl chloride, polyamide, polyimide, aramid, epoxy, an inorganic vapor deposition film, paper, and the like. Specifically, when a transistor and a capacitor are formed using a semiconductor substrate, a single crystal substrate, an SOI substrate, or the like, it is possible to form a transistor and a capacitor with few variations in characteristics, size, shape, or the like and with high current supply capability and a small size. By forming a circuit using such a transistor and a capacitor, power consumption of the circuit can be reduced or the circuit can be highly integrated.

Alternatively, a flexible substrate may be used as the substrate 102, and the transistor and the capacitor may be provided directly on the flexible substrate. Alternatively, a separation layer may be provided between the substrate 102 and the transistor and the capacitor. The separation layer can be used when part or the whole of a semiconductor device formed over the separation layer is separated from the substrate 102 and transferred onto another substrate. In such a case, the transistor and the capacitor can be transferred to a substrate having low heat resistance or a flexible substrate as well. For the above separation layer, a stack including inorganic films, which are a tungsten film and a silicon oxide film, or an organic resin film of polyimide or the like formed over a substrate can be used, for example.

Examples of the substrate to which the transistor and the capacitor are transferred include, in addition to the above-described substrates over which the transistor and the capacitor can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, and the like. By using such a substrate, a transistor with excellent properties or a transistor with low power consumption can be formed, a device with high durability can be formed, heat resistance can be provided, or reduction in weight or thickness can be achieved.

The insulating film 108 can be formed by a sputtering method, a CVD method, an evaporation method, a pulsed laser deposition (PLD) method, a printing method, a coating method, or the like as appropriate. The insulating film 108 can be formed with a single layer or a stack using an oxide insulating film or a nitride insulating film. Note that an oxide insulating film is preferably used for at least a region of the insulating film 108 which is in contact with the oxide semiconductor film 110, in order to improve characteristics of the interface with the oxide semiconductor film 110. An oxide insulating film that releases oxygen by being heated is preferably used as the insulating film 108, in which case oxygen contained in the insulating film 108 can be moved to the oxide semiconductor film 110 by heat treatment.

The thickness of the insulating film 108 can be greater than or equal to 50 nm, greater than or equal to 100 nm and less than or equal to 3000 nm, or greater than or equal to 200 nm and less than or equal to 1000 nm. With use of the thick insulating film 108, the amount of oxygen released from the insulating film 108 can be increased, and the interface state density at the interface between the insulating film 108 and the oxide semiconductor film 110 and oxygen vacancy included in the channel region 110a of the oxide semiconductor film 110 can be reduced.

The insulating film 108 can be formed with a single layer or a stack using, for example, silicon oxide, silicon oxynitride, silicon nitride oxide, silicon nitride, aluminum oxide, hafnium oxide, gallium oxide, and a Ga—Zn oxide. In this embodiment, a silicon nitride film is used as the insulating film 108a, and a silicon oxynitride film is used as the insulating film 108b.

The oxide semiconductor film 110 is typically formed using a metal oxide such as an In—Ga oxide, an In—Zn oxide, or an In-M-Zn oxide (M is Ti, Ga, Y, Zr, La, Ce, Nd, or Hf). Note that the oxide semiconductor film 110 has a light-transmitting property.

Note that in the case where the oxide semiconductor film 110 is an In-M-Zn oxide, when the summation of In and M is assumed to be 100 atomic %, the proportions of In and M are as follows: the proportions of In and M are preferably set to be greater than or equal to 25 atomic % and less than 75 atomic %, respectively, or greater than or equal to 34 atomic % and less than 66 atomic %, respectively.

The energy gap of the oxide semiconductor film 110 is 2 eV or more, 2.5 eV or more, or 3 eV or more.

The thickness of the oxide semiconductor film 110 can be greater than or equal to 3 nm and less than or equal to 200 nm, greater than or equal to 3 nm and less than or equal to 100 nm, or greater than or equal to 3 nm and less than or equal to 60 nm.

In the case where the oxide semiconductor film 110 is an In-M-Zn oxide, it is preferable that the atomic ratio of metal elements of a sputtering target used for forming a film of the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:1.5, In:M:Zn=2:1:2.3, In:M:Zn=2:1:3, In:M:Zn=3:1:2, or the like is preferable. Note that the atomic ratios of metal elements in the formed oxide semiconductor film 110 vary from the above atomic ratio of metal elements of the sputtering target within a range of ±40% as an error.

When silicon or carbon that is one of elements belonging to Group 14 is contained in the oxide semiconductor film 110, oxygen vacancies are increased in the oxide semiconductor film 110, and the oxide semiconductor film 110 becomes an n-type film. Thus, the concentration of silicon or carbon (the concentration is measured by SIMS) of the oxide semiconductor film 110, in particular, the channel region 110a, can be lower than or equal to $2\times10^{18}$ atoms/cm$^3$, or lower than or equal to $2\times10^{17}$ atoms/cm$^3$. As a result, the transistor has positive threshold voltage (normally-off characteristics).

Further, the concentration of alkali metal or alkaline earth metal of the oxide semiconductor film 110, in particular, the channel region 110a, which is measured by SIMS, can be lower than or equal to $1\times10^{18}$ atoms/cm$^3$, or lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal in the channel region 110a. As a result, the transistor has positive threshold voltage (normally-off characteristics).

Furthermore, when nitrogen is contained in the oxide semiconductor film 110, in particular, the channel region 110a, electrons serving as carriers are generated, carrier density is increased, and the region becomes an n-type in some cases. Thus, a transistor including an oxide semiconductor film which contains nitrogen is likely to have normally-on characteristics. For this reason, nitrogen in the oxide semiconductor film, in particular, the channel region 110a, is preferably reduced as much as possible. The concentration of nitrogen measured by SIMS can be set to be, for example, less than or equal to $5\times10^{18}$ atoms/cm$^3$.

When the impurity element in the oxide semiconductor film 110, in particular, the channel region 110a, is reduced, the carrier density of the oxide semiconductor film can be lowered. Therefore, in the oxide semiconductor film 110, in particular, the channel region 110a, carrier density can be less than or equal to $1\times10^{17}$/cm$^3$, less than or equal to $1\times10^{15}$/cm$^3$, less than or equal to $1\times10^{13}$/cm$^3$, less than or equal to $1\times10^{11}$/cm$^3$, or greater than or equal to $1\times10^{-9}$/cm$^3$ and less than or equal to $1\times10^{10}$/cm$^3$.

Note that an oxide semiconductor film with a low impurity concentration and a low density of defect states can be used for the oxide semiconductor film 110, in which case the transistor can have more excellent electrical characteristics. Here, the state in which impurity concentration is low and density of defect states is low (the amount of oxygen vacancies is small) is referred to as "highly purified intrinsic" or "substantially highly purified intrinsic". A highly purified intrinsic or substantially highly purified intrinsic oxide semiconductor has few carrier generation sources, and thus has a low carrier density in some cases. Thus, a transistor including the oxide semiconductor film in which a channel region is formed is likely to have positive threshold voltage (normally-off characteristics). A highly purified intrinsic or substantially highly purified intrinsic oxide semiconductor film has a low density of defect states and accordingly has few carrier traps in some cases. Further, a highly purified intrinsic or substantially highly purified intrinsic oxide semiconductor film has an extremely low off-state current; the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases.

The oxide semiconductor film 110 may have a non-single-crystal structure, for example. The non-single-crystal structure includes a c-axis aligned crystalline oxide semiconductor (CAAC-OS) which is described later, a polycrystalline structure, a microcrystalline structure described later, or an amorphous structure, for example. Among the non-single-crystal structures, the amorphous structure has the highest density of defect levels, whereas CAAC-OS has the lowest density of defect levels.

Note that the oxide semiconductor film 110 may be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including, for example, two or more of a region having an amorphous structure, a region having a microcrystalline structure, a region having a polycrystalline structure, a CAAC-OS region, and a region having a single-crystal structure in some cases.

Note that in the oxide semiconductor film 110, the crystallinity of the channel region 110a is different from the crystallinity of each of the low-resistance regions 110b, 110c, 110d, 110e, 110h, and 110i in some cases. Specifically, in the oxide semiconductor film 110, the crystallinity of the channel region 110a is higher than the crystallinity of each of the low-resistance regions 110b, 110c, 110d, 110e, 110h, and 110i. This is because, when the impurity element is added to the low-resistance regions 110b, 110c, 110d, 110e, 110h, and 110i, the low-resistance regions 110b, 110c, 110d, 110e, 110h, and 110i are damaged and thus have lower crystallinity.

The insulating film 112 can be formed with a single layer or a stack using an oxide insulating film or a nitride insulating film. Note that an oxide insulating film is preferably used for at least a region of the insulating film 112 which is in contact with the oxide semiconductor film 110, in order to improve characteristics of the interface with the oxide semiconductor film 110. The insulating film 112 can be formed with a single layer or a stack using, for example, silicon oxide, silicon oxynitride, silicon nitride oxide, silicon nitride, aluminum oxide, hafnium oxide, gallium oxide, or a Ga—Zn oxide.

Furthermore, it is possible to prevent outward diffusion of oxygen from the oxide semiconductor film 110 and entry of hydrogen, water, or the like into the oxide semiconductor film 110 from the outside by providing an insulating film having a blocking effect against oxygen, hydrogen, water, and the like as the insulating film 112. As the insulating film which has a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, or the like can be used.

The insulating film 112 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

An oxide insulating film that releases oxygen by being heated is preferably used as the insulating film 112, in which case oxygen contained in the insulating film 112 can be moved to the oxide semiconductor film 110 by heat treatment.

The thickness of the insulating film 112 can be greater than or equal to 5 nm and less than or equal to 400 nm, greater than or equal to 5 nm and less than or equal to 300 nm, or greater than or equal to 10 nm and less than or equal to 250 nm.

The conductive film 114, the conductive film 116, the conductive film 122, the conductive film 124, and the conductive film 126 can be formed by a sputtering method, a vacuum evaporation method, a pulsed laser deposition (PLD) method, a thermal CVD method, or the like. Each of the conductive film 114, the conductive film 116, the conductive film 122, the conductive film 124, and the conductive film 126 can be formed using, for example, a metal element selected from aluminum, chromium, copper, tantalum, titanium, molybdenum, nickel, iron, cobalt, and tungsten; an alloy containing any of these metal elements as a component; an alloy containing these metal elements in combination; or the like. Furthermore, one or more metal elements selected from manganese and zirconium may be used. Furthermore, the conductive film 114, the conductive film 116, the conductive film 122, the conductive film 124, and the conductive film 126 may have a single-layer structure or a stacked-layer structure of two or more layers. For example, any of the following can be used: a single-layer structure of an aluminum film containing silicon; a single-layer structure of a copper film containing manganese; a two-layer structure in which a titanium film is stacked over an aluminum film; a two-layer structure in which a titanium film is stacked over a titanium nitride film; a two-layer structure in which a tungsten film is stacked over a titanium nitride film; a two-layer structure in which a tungsten film is stacked over a tantalum nitride film or a tungsten nitride film; a two-layer structure in which a copper film is stacked over a copper film containing manganese; a three-layer structure in which a titanium film, an aluminum film, and a titanium film are stacked in this order; a three-layer structure in which a copper film containing manganese, a copper film, and a copper film containing manganese are stacked in this order; and the like. Alternatively, an alloy film or a nitride film which contains aluminum and one or more selected from titanium, tantalum, tungsten, molybdenum, chromium, neodymium, and scandium may be used.

Note that the conductive film 114 and the conductive film 116 include the same material and the same stacked-layer structure because they are formed at the same time. Furthermore, the conductive film 122, the conductive film 124, and the conductive film 126 include the same material and the same stacked-layer structure because they are formed at the same time.

The conductive film 114, the conductive film 116, the conductive film 122, the conductive film 124, and the conductive film 126 can also be formed using a light-transmitting conductive material such as indium tin oxide (hereinafter also referred to as ITO), indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to have a stacked-layer structure formed using the above light-transmitting conductive material and the above metal element.

The thicknesses of the conductive film 114, the conductive film 116, the conductive film 122, the conductive film 124, and the conductive film 126 each can be greater than or equal to 30 nm and less than or equal to 500 nm, or greater than or equal to 100 nm and less than or equal to 400 nm.

A nitride insulating film is used for the insulating film 118. The nitride insulating film can be formed using silicon nitride, silicon nitride oxide, aluminum nitride, aluminum nitride oxide, or the like. The hydrogen concentration of the insulating film 118 is preferably higher than or equal to $1\times10^{22}$ atoms/Cm$^3$. Furthermore, the insulating film 118 is in contact with the low-resistance region of the oxide semiconductor film 110. Thus, hydrogen contained in the insulating film 118 is diffused to the low-resistance region of the oxide semiconductor film 110, whereby the hydrogen concentration of the low-resistance region is higher than that of the channel region in the oxide semiconductor film 110.

The insulating film 120 can be formed with a single layer or a stack using an oxide insulating film or a nitride insulating film. The insulating film 120 can be formed with a single layer or a stack using, for example, silicon oxide, silicon oxynitride, silicon nitride oxide, silicon nitride, aluminum oxide, hafnium oxide, gallium oxide, and a Ga—Zn oxide.

The insulating film 128 is preferably a film functioning as a barrier film against hydrogen, water, and the like from the outside. The insulating film 128 can be formed with a single layer or a stack using, for example, silicon nitride, silicon nitride oxide, aluminum oxide, or the like.

The thicknesses of the insulating film 118, the insulating film 120, and the insulating film 128 each can be greater than or equal to 30 nm and less than or equal to 500 nm, or greater than or equal to 100 nm and less than or equal to 400 nm.

<Structure 2 of Semiconductor Device>

Another structure of the semiconductor device illustrated in FIGS. 1A to 1D is described with reference to FIGS. 5A to 5D and FIG. 6.

Figure 5A:
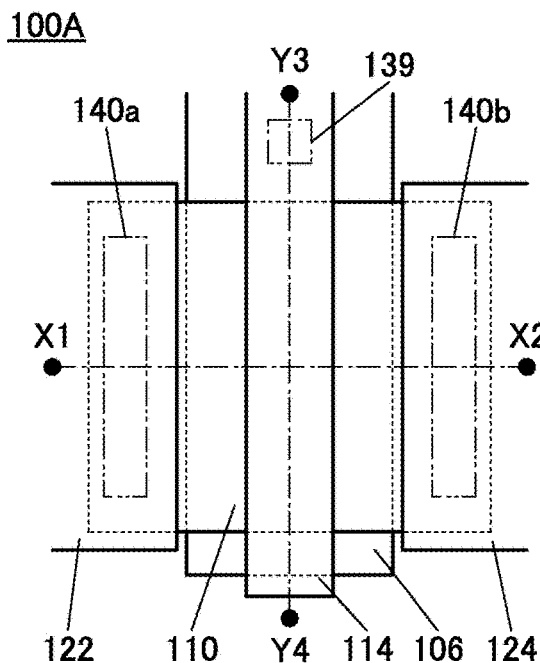
FIGS. 5A to 5D are top views and cross-sectional views which illustrate one embodiment of a semiconductor device.
Figure 5B:
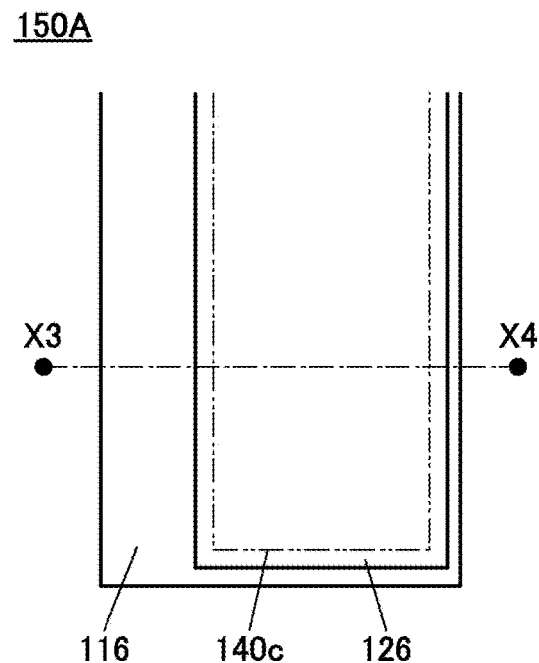
Figure 5C:
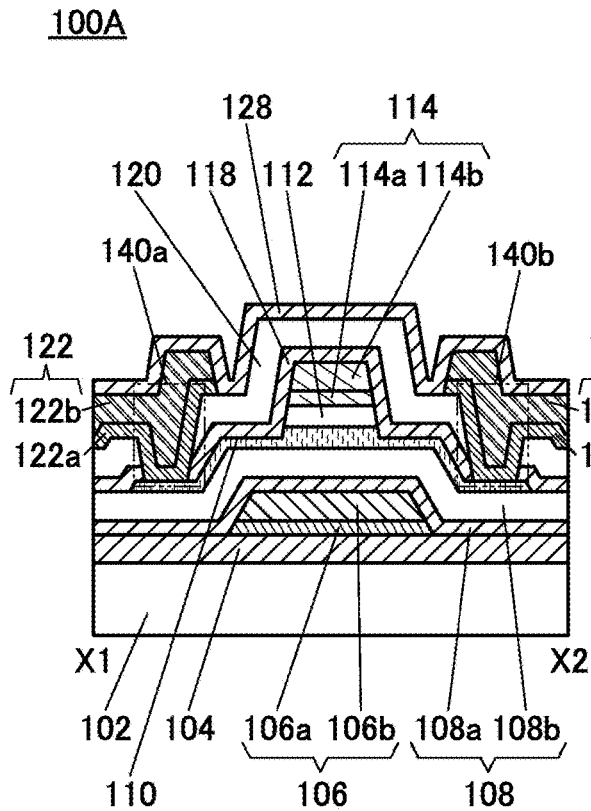
Figure 5D:
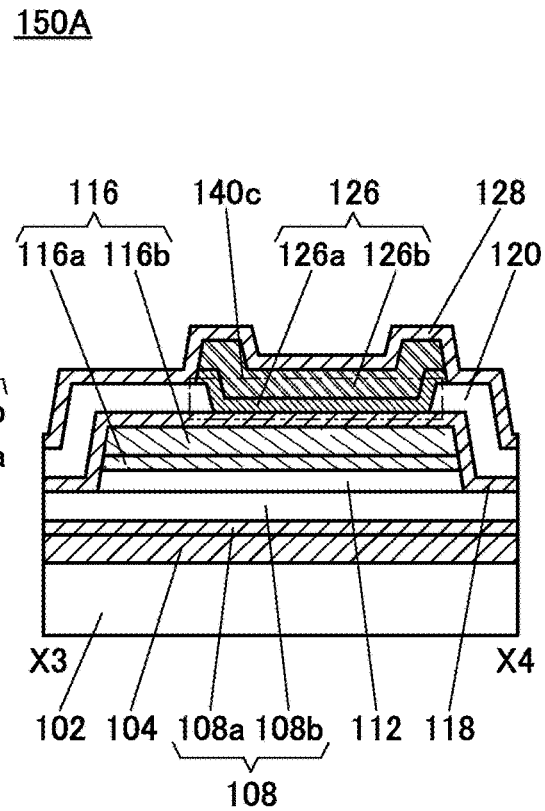

FIG. 5A is a top view of a transistor 100A included in a semiconductor device. FIG. 5B is a top view of a capacitor 150A included in the semiconductor device. FIG. 5C is a cross-sectional view along the dashed-dotted line X1-X2 in FIG. 5A. FIG. 5D is a cross-sectional view along the dashed-dotted line X3-X4 in FIG. 5B.

The transistor 100A illustrated in FIGS. 5A and 5C includes the insulating film 104 formed over the substrate 102, a conductive film 106 over the insulating film 104, the insulating film 108 over the insulating film 104 and the conductive film 106, the oxide semiconductor film 110 overlapping with the conductive film 106 with the insulating film 108 provided therebetween, the insulating film 112 over the oxide semiconductor film 110, the conductive film 114 overlapping with the oxide semiconductor film 110 with the insulating film 112 provided therebetween, the insulating film 118 covering the oxide semiconductor film 110, the insulating film 112, and the conductive film 114, the insulating film 120 over the insulating film 118, the conductive film 122 connected to the oxide semiconductor film 110 through the opening portion 140a provided in the insulating film 118 and the insulating film 120, and the conductive film 124 connected to the oxide semiconductor film 110 through the opening portion 140b provided in the insulating film 118 and the insulating film 120. Note that the insulating film 128 covering the insulating film 120, the conductive film 122, and the conductive film 124 may be provided over the transistor 100A.

Note that in FIG. 5C, the conductive film 106 has a stacked-layer structure of a conductive film 106a and a conductive film 106b over the conductive film 106a. The insulating film 108 has a stacked-layer structure of the insulating film 108a and the insulating film 108b over the insulating film 108a. The conductive film 114 has a stacked-layer structure of the conductive film 114a and the conductive film 114b over the conductive film 114a. The conductive film 122 has a stacked-layer structure of the conductive film 122a and the conductive film 122b over the conductive film 122a. The conductive film 124 has a stacked-layer structure of the conductive film 124a and the conductive film 124b over the conductive film 124a.

In the transistor 100A, the conductive film 106 functions as a first gate electrode (also referred to as a bottom-gate electrode), the conductive film 114 functions as a second gate electrode (also referred to as a top-gate electrode), the conductive film 122 functions as one of a source electrode and a drain electrode, and the conductive film 124 functions as the other of the source electrode and the drain electrode. Furthermore, in the transistor 100A, the insulating film 108 functions as a first gate insulating film, and the insulating film 112 functions as a second gate insulating film.

Note that the transistor 100A shown in FIGS. 5A and 5C is different from the transistor 100 described above and has a structure in which the conductive film functioning as a gate electrode is provided over and under the oxide semiconductor film 110. As in the transistor 100A, two or more gate electrodes may be provided in the semiconductor device of one embodiment of the present invention.

The capacitor 150A illustrated in FIGS. 5B and 5D includes the insulating film 104 formed over the substrate 102, the insulating film 108 over the insulating film 104, the insulating film 112 over the insulating film 108, the conductive film 116 over the insulating film 112, the insulating film 118 covering the insulating film 108, the insulating film 112, and the conductive film 116, the insulating film 120 over the insulating film 118, and the conductive film 126 overlapping with the conductive film 116 with the insulating film 118 provided therebetween in the opening portion 140c provided in the insulating film 120. Note that the insulating film 128 covering the insulating film 120 and the conductive film 126 may be provided over the capacitor 150A.

Note that in FIG. 5D, the insulating film 108 has a stacked-layer structure of the insulating film 108a and the insulating film 108b over the insulating film 108a. The conductive film 116 has a stacked-layer structure of the conductive film 116a and the conductive film 116b over the conductive film 116a. The conductive film 126 has a stacked-layer structure of the conductive film 126a and the conductive film 126b over the conductive film 126a.

Furthermore, the capacitor 150A has a structure in which a dielectric is provided between a pair of electrodes. In more detail, one of the pair of electrodes is the conductive film 116, the other of the pair of electrodes is the conductive film 126, and the insulating film 118 between the conductive film 116 and the conductive film 126 functions as the dielectric.

Note that the conductive film 114 functioning as the second gate electrode of the transistor 100A and the conductive film 116 functioning as the one of the pair of electrodes of the capacitor 150A are formed in the same step, and the conductive films 114 and 116 are at least partly formed over the same surface. Furthermore, the conductive film 122 and the conductive film 124 that function as the source electrode and the drain electrode of the transistor 100A and the conductive film 126 functioning as the other of the pair of electrodes of the capacitor 150A are formed in the same step, and the conductive films 122, 124, and 126 are at least partly formed over the same surface.

As described above, by forming the conductive films that function as the electrodes of the transistor 100A and the capacitor 150A in the same step, a manufacturing cost can be reduced.

Furthermore, in the capacitor 150A, the insulating film 120 has the opening portion 140c. Therefore, in an insulating film in which the insulating film 118 and the insulating film 120 are stacked, only the insulating film 118 is made to function as the dielectric. The capacitor 150A having such a structure can have a high capacitance value, and accordingly, a display device can have a high capacitance value.

Figure 6:
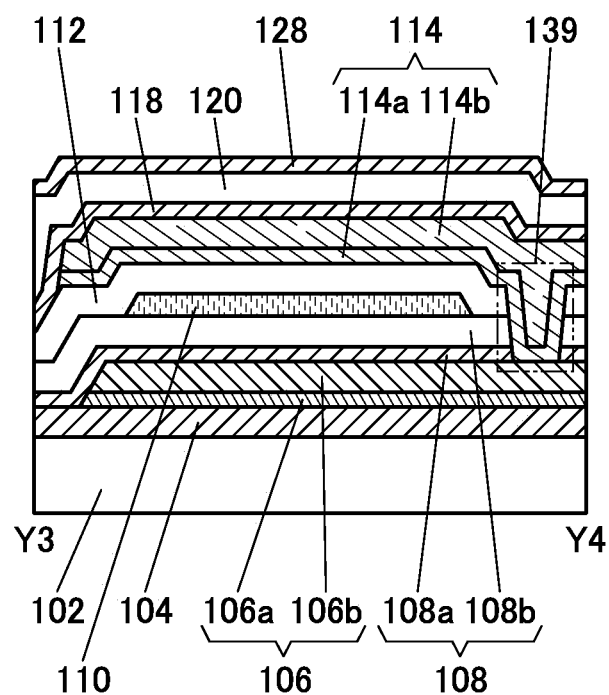
FIG. 6 is a cross-sectional view illustrating one embodiment of a semiconductor device.

FIG. 6 is a cross-sectional view of the transistor 100A illustrated in FIG. 5A in the dashed-dotted line Y3-Y4 direction (the channel width direction).

As illustrated in FIG. 6, the conductive film 114 functioning as a second gate electrode is connected to the conductive film 106 functioning as a first gate electrode in an opening portion 139 provided in the insulating film 108 and the insulating film 112. Therefore, the same potential is applied to the conductive film 114 and the conductive film 106. Note that the conductive film 114 and the conductive film 106 are not necessarily connected to each other, in which case the opening portion 139 is not provided. In the case of employing the structure in which the conductive film 114 and the conductive film 106 are not connected to each other, different potentials may be applied to the conductive film 114 and the conductive film 106.

Furthermore, as illustrated in FIG. 6, the oxide semiconductor film 110 is positioned to face each of the conductive film 106 functioning as a first gate electrode and the conductive film 114 functioning as a second gate electrode, and is sandwiched between the two conductive films functioning as gate electrodes. The length in the channel width direction of the conductive film 114 functioning as a second gate electrode is longer than the length in the channel width direction of the oxide semiconductor film 110. In the channel width direction, the whole oxide semiconductor film 110 is covered with the conductive film 114 with the insulating film 112 provided therebetween. Since the conductive film 114 functioning as a second gate electrode is connected to the conductive film 106 functioning as a first gate electrode in the opening portion 139 provided in the insulating film 108 and the insulating film 112, a side surface of the oxide semiconductor film 110 in the channel width direction faces the conductive film 114 functioning as a second gate electrode with the insulating film 112 provided therebetween.

In other words, in the channel width direction of the transistor 100A, the conductive film 106 functioning as a first gate electrode and the conductive film 114 functioning as a second gate electrode are connected to each other in the opening portion provided in the insulating film 108 functioning as a first gate insulating film and the insulating film 112 functioning as a second gate insulating film; and the conductive film 106 and the conductive film 114 surround the oxide semiconductor film 110 with the insulating film 108 functioning as a first gate insulating film and the insulating film 112 functioning as a second gate insulating film provided therebetween.

Such a structure enables electric fields of the conductive film 106 functioning as a first gate electrode and the conductive film 114 functioning as a second gate electrode to electrically surround the oxide semiconductor film 110 included in the transistor 100A. A device structure of a transistor, like that of the transistor 100A, in which electric fields of a first gate electrode and a second gate electrode electrically surround an oxide semiconductor film where a channel region is formed can be referred to as a surrounded channel (s-channel) structure.

Since the transistor 100A has the s-channel structure, an electric field for inducing a channel can be effectively applied to the oxide semiconductor film 110 by the conductive film 106 functioning as a first gate electrode or the conductive film 114 functioning as a second gate electrode; therefore, the current drive capability of the transistor 100A can be improved and high on-state current characteristics can be obtained. Since the on-state current can be increased, it is possible to reduce the size of the transistor 100A. In addition, since the transistor 100A has a structure in which the oxide semiconductor film 110 is surrounded by the conductive film 106 functioning as a first gate electrode and the conductive film 114 functioning as a second gate electrode, the mechanical strength of the transistor 100A can be increased.

Note that in the channel width direction of the transistor 100A, an opening portion which is different from the opening portion 139 may be formed on the side of the oxide semiconductor film 110 where the opening portion 139 is not formed.

A material similar to the material of the insulating film 108 can be used for the insulating film 104 included in the transistor 100A and the capacitor 150A. Here, a 100-nm-thick silicon nitride film is formed using a PECVD apparatus as the insulating film 104.

A material similar to the material of each of the conductive films 114, 122, and 124 can be used for the conductive film 106 included in the transistor 100A. Here, a 10-nm-thick tantalum nitride film is formed using a sputtering apparatus as the conductive film 106a, and a 300-nm-thick copper film is formed using a sputtering apparatus as the conductive film 106b.

Next, another structure of the semiconductor devices illustrated in FIGS. 1A to 1D and FIGS. 5A to 5D is described with reference to FIGS. 7A to 7D, FIGS. 8A to 8D, FIGS. 9A to 9D, FIG. 10, and FIG. 11A. Note that the semiconductor devices illustrated in FIGS. 7A to 7D, FIGS. 8A to 8D, FIGS. 9A to 9D, FIG. 10, and FIG. 11A are modification examples of the semiconductor device illustrated in FIGS. 5A to 5D.

Figure 7A:
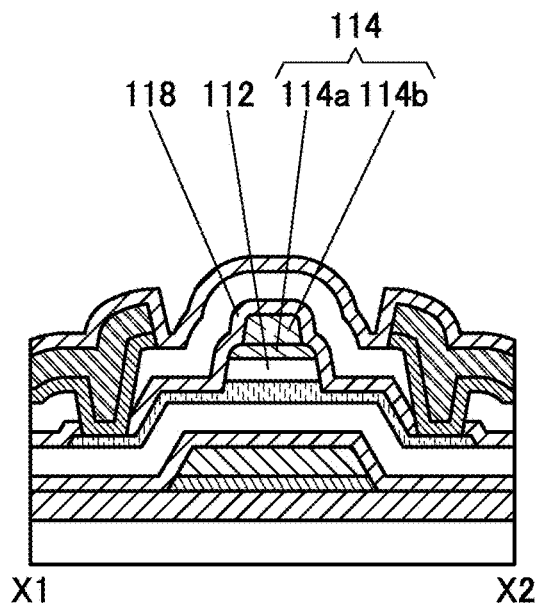
FIGS. 7A to 7D are cross-sectional views each illustrating one embodiment of a semiconductor device.
Figure 7B:
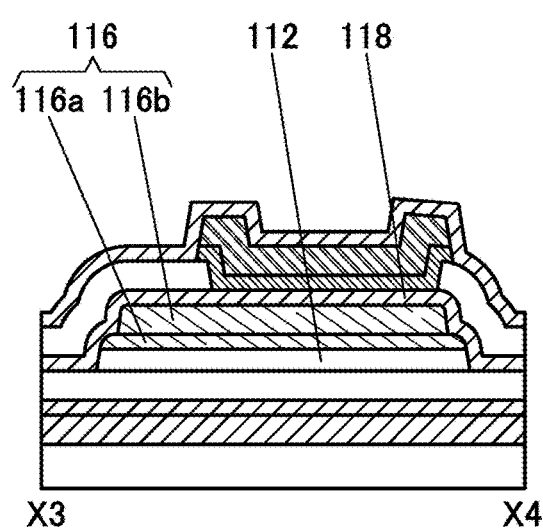

FIG. 7A is a cross-sectional view of a transistor 100B included in a semiconductor device. FIG. 7B is a cross-sectional view of a capacitor 150B included in a semiconductor device. Note that top views of the transistor 100B and the capacitor 150B are similar to the top views illustrated in FIGS. 5A and 5B; thus, they are not described here. Similarly, top views of a transistor 100C illustrated in FIG. 7C, a capacitor 150C illustrated in FIG. 7D, a transistor 100D illustrated in FIG. 8A, a capacitor 150D illustrated in FIG. 8B, a transistor 100E illustrated in FIG. 8C, a capacitor 150E illustrated in FIG. 8D, a transistor 100F illustrated in FIG. 9A, a capacitor 150F illustrated in FIG. 9B, a transistor 100G illustrated in FIG. 9C, and a capacitor 150G illustrated in FIG. 9D are similar to the top views illustrated in FIGS. 5A and 5B; thus, they are not described here.

Furthermore, in the case where a portion illustrated in any of FIGS. 7A to 7D, FIGS. 8A to 8D, FIGS. 9A to 9D, FIG. 10, and FIG. 11A has a function similar to that described above, the same hatch pattern is applied to the portion, and the portion is not especially denoted by a reference numeral in some cases.

<Structure 3 of Semiconductor Device>

The transistor 100B illustrated in FIG. 7A differs from the transistor 100A illustrated in FIG. 5C in the shape of the conductive film 114. Specifically, the conductive film 114 included in the transistor 100B has a stacked-layer structure of the conductive film 114a and the conductive film 114b over the conductive film 114a, a lower end portion of the conductive film 114a agrees with or substantially agrees with an upper end portion of the insulating film 112, and a lower end portion of the conductive film 114b is positioned on the inner side than an upper end portion of the conductive film 114a. Furthermore, an end portion of the conductive film 114b is partly arc-shaped.

The capacitor 150B illustrated in FIG. 7B differs from the capacitor 150A illustrated in FIG. 5D in the shape of the conductive film 116. Specifically, the conductive film 116 included in the capacitor 150B has a stacked-layer structure of the conductive film 116a and the conductive film 116b over the conductive film 116a, a lower end portion of the conductive film 116a agrees with or substantially agrees with an upper end portion of the insulating film 112, and a lower end portion of the conductive film 116b is positioned on the inner side than an upper end portion of the conductive film 116a.

When the insulating film 112 and/or the conductive films 114 and 116 have the shape illustrated in FIGS. 7A and 7B, the coverage with the insulating film 118 can be increased.

<Structure 4 of Semiconductor Device>

Figure 7C:
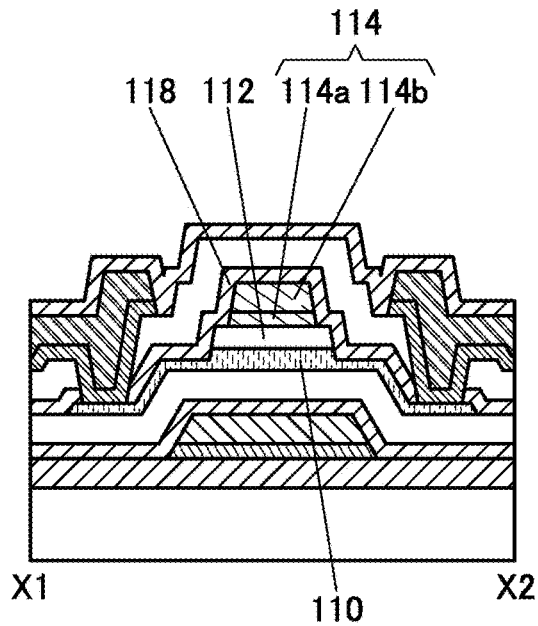

The transistor 100C illustrated in FIG. 7C differs from the transistor 100A illustrated in FIG. 5C in the shape of the insulating film 112. Specifically, a lower end portion and an upper end portion of the insulating film 112 included in the transistor 100C are positioned on the outer side than a lower end portion of the conductive film 114. That is, the insulating film 112 has a shape projecting from the conductive film 114. When the insulating film 112 has the shape illustrated in FIG. 7C, the insulating film 118 can be kept away from the channel region of the oxide semiconductor film 110; thus, entry of nitrogen, hydrogen, and the like contained in the insulating film 118 into the channel region of the oxide semiconductor film 110 can be suppressed.

Figure 7D:
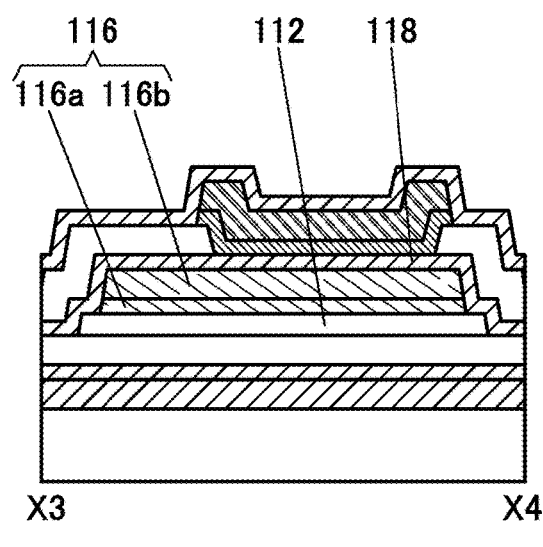

The capacitor 150C illustrated in FIG. 7D differs from the capacitor 150A illustrated in FIG. 5D in the shape of the insulating film 112. Specifically, a lower end portion and an upper end portion of the insulating film 112 included in the capacitor 150C are positioned on the outer side than a lower end portion of the conductive film 116.

When the insulating film 112 has the shape illustrated in FIGS. 7C and 7D, the coverage with the insulating film 118 can be increased.

<Structure 5 of Semiconductor Device>

Figure 8A:
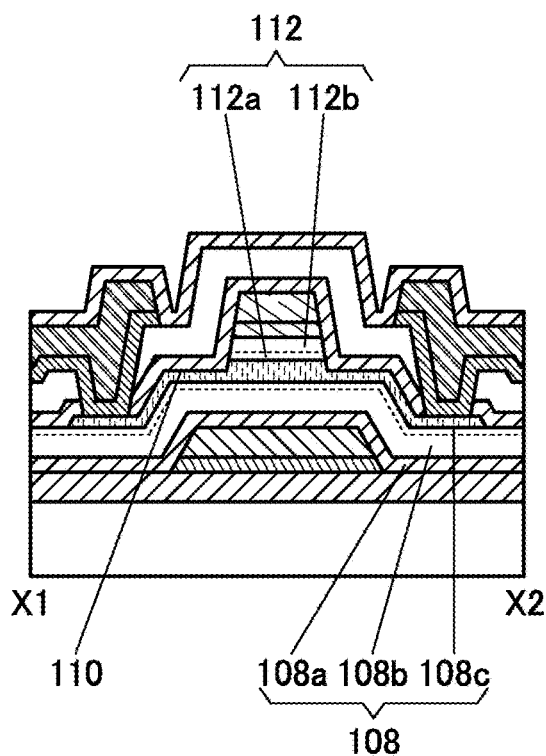
FIGS. 8A to 8D are cross-sectional views each illustrating one embodiment of a semiconductor device.

The transistor 100D illustrated in FIG. 8A differs from the transistor 100A illustrated in FIG. 5C in the structures of the insulating film 108 and the insulating film 112. Specifically, the insulating film 108 included in the transistor 100D illustrated in FIG. 8A has a stacked-layer structure of the insulating film 108a, the insulating film 108b, and an insulating film 108c. The insulating film 112 included in the transistor 100D shown in FIG. 8A has a stacked-layer structure of an insulating film 112a and an insulating film 112b.

Figure 8B:
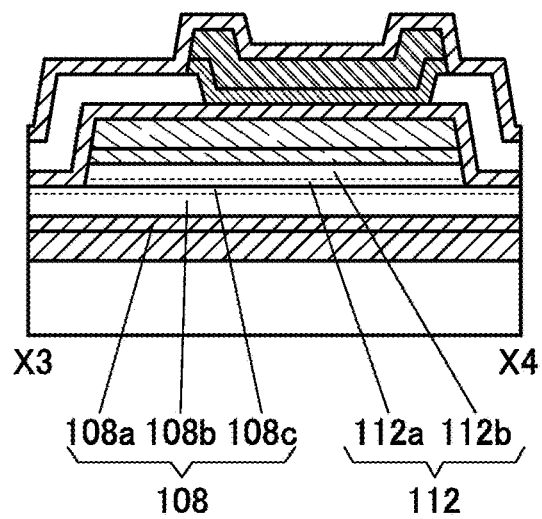

The capacitor 150D illustrated in FIG. 8B differs from the capacitor 150A illustrated in FIG. 5D in the structures of the insulating film 108 and the insulating film 112. Specifically, the insulating film 108 included in the capacitor 150D illustrated in FIG. 8B has a stacked-layer structure of the insulating film 108a, the insulating film 108b, and the insulating film 108c. The insulating film 112 included in the capacitor 150D illustrated in FIG. 8B has a stacked-layer structure of the insulating film 112a and the insulating film 112b.

The insulating film 108c and the insulating film 112a can be formed using an oxide insulating film having a low density of states of nitrogen oxide. Note that the density of states of the nitrogen oxide can be formed between the energy at the valence band maximum ($E_{v\_os}$) and the energy at the conduction band minimum ($E_{c\_os}$) of the oxide semiconductor film. A silicon oxynitride film that releases less nitrogen oxide, an aluminum oxynitride film that releases less nitrogen oxide, or the like can be used as the oxide insulating film in which the density of states of nitrogen oxide is low between $E_{v\_os}$ and $E_{c\_os}$. Note that the average thickness of each of the insulating films 108 and 112a is greater than or equal to 0.1 nm and less than or equal to 50 nm, or greater than or equal to 0.5 nm and less than or equal to 10 nm.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1\times10^{18}$ molecules/cm$^3$ and less than or equal to $5\times10^{19}$ molecules/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

The insulating films 108b and 112b can be formed using an oxide insulating film that releases oxygen by being heated. Note that the average thicknesses of the insulating films 108b and 112b are each greater than or equal to 5 nm and less than or equal to 1000 nm, or greater than or equal to 10 nm and less than or equal to 500 nm.

Typical examples of the oxide insulating film that releases oxygen by being heated include a silicon oxynitride film and an aluminum oxynitride film.

Nitrogen oxide (NO$_x$; x is greater than or equal to 0 and less than or equal to 2, preferably greater than or equal to 1 and less than or equal to 2), typically NO$_2$ or NO, forms levels in the insulating film 108, the insulating film 112, and the like. The level is positioned in the energy gap of the oxide semiconductor film 110. Therefore, when nitrogen oxide is diffused to the interface between the insulating film 108 and the oxide semiconductor film 110, the interface between the insulating film 112 and the oxide semiconductor film 110, and the interface between the insulating film 108 and the insulating film 112, an electron is trapped by the level on the insulating film 108 side and the insulating film 112 side. As a result, the trapped electron remains in the vicinity of the interface between the insulating film 108 and the oxide semiconductor film 110, the interface between the insulating film 112 and the oxide semiconductor film 110, and the interface between the insulating film 108 and the insulating film 112; thus, the threshold voltage of the transistor is shifted in the positive direction.

Nitrogen oxide reacts with ammonia and oxygen in heat treatment. Since nitrogen oxide contained in the insulating films 108b and 112b reacts with ammonia contained in the insulating films 108c and 112a in heat treatment, nitrogen oxide contained in the insulating films 108b and 112b is reduced. Therefore, an electron is hardly trapped at the interface between the insulating film 108 and the oxide semiconductor film 110, the interface between the insulating film 112 and the oxide semiconductor film 110, and the interface between the insulating film 108 and the insulating film 112.

By using, for the insulating films 108c and 112a, the oxide insulating film having a low density of states of nitrogen oxide between $E_{v\_os}$ and $E_{c\_os}$, the shift in the threshold voltage of the transistor can be reduced, which leads to a smaller change in the electrical characteristics of the transistor.

Note that in an ESR spectrum at 100 K or lower of the insulating films 108 and 112, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10_{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and smaller than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

An oxide insulating film containing nitrogen and having a small amount of defects has a nitrogen concentration measured by SIMS of lower than or equal to $6 \times 10^{20}$ atoms/cm$^3$.

By forming an oxide insulating film containing nitrogen and having a small amount of defects by a PECVD method using silane and dinitrogen monoxide at a substrate temperature higher than or equal to 220° C., higher than or equal to 280° C., or higher than or equal to 350° C., a dense and hard film can be formed.

<Structure 6 of Semiconductor Device>

Figure 8C:
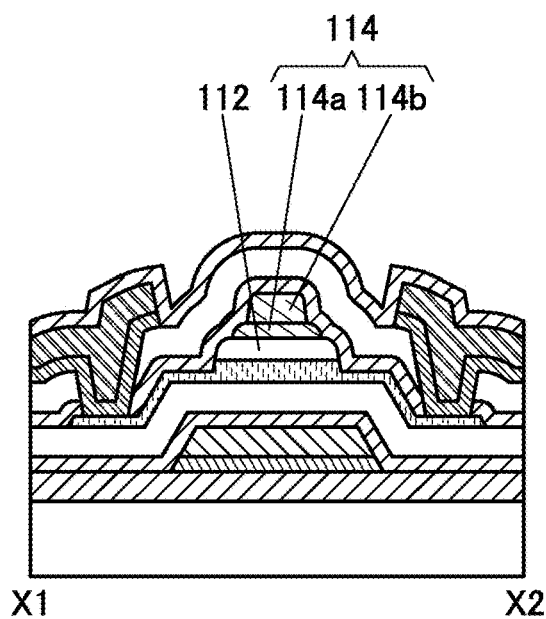

The transistor 100E illustrated in FIG. 8C differs from the transistor 100A illustrated in FIG. 5C in the shapes of the insulating film 112 and the conductive film 114. Specifically, an end portion of the insulating film 112 included in the transistor 100E is partly arc-shaped. Furthermore, the lower end portion and the upper end portion of the conductive film 114a are positioned on the inner side than the upper end portion of the insulating film 112. Furthermore, the lower end portion of the conductive film 114b is positioned on the inner side than the upper end portion of the conductive film 114a. Furthermore, the end portions of the conductive film 114a and the conductive film 114b are partly arc-shaped.

Figure 8D:
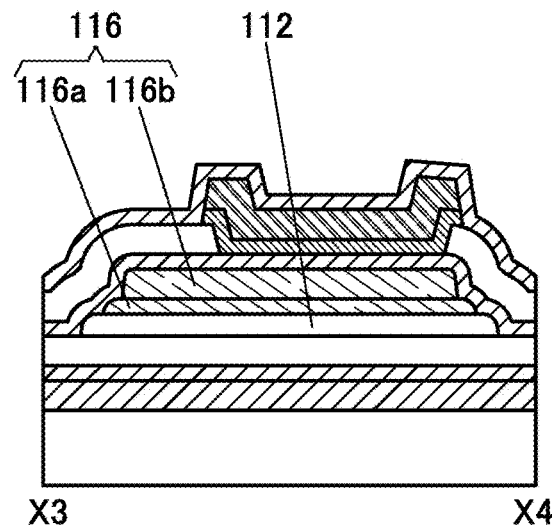

The capacitor 150E illustrated in FIG. 8D differs from the capacitor 150A illustrated in FIG. 5D in the shapes of the insulating film 112 and the conductive film 116. Specifically, the end portion of the insulating film 112 included in the capacitor 150E is partly arc-shaped. Furthermore, the lower end portion and the upper end portion of the conductive film 116a are positioned on the inner side than the upper end portion of the insulating film 112. Furthermore, the lower end portion of the conductive film 116b is positioned on the inner side than the upper end portion of the conductive film 116a. Note that end portions of the conductive film 116a and the conductive film 116b are partly arc-shaped.

<Structure 7 of Semiconductor Device>

Figure 9A:
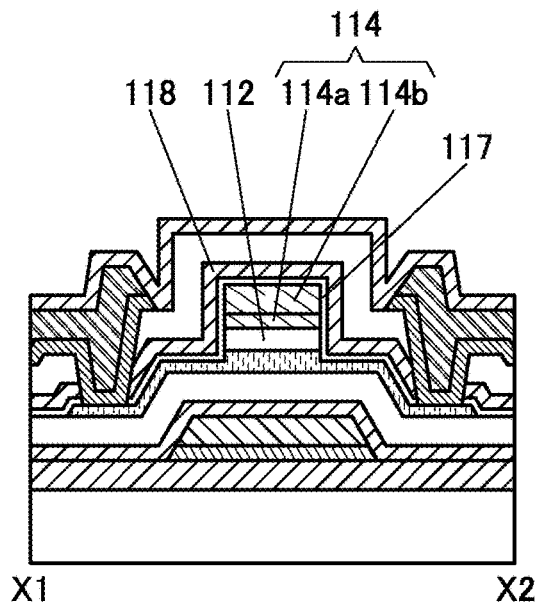
FIGS. 9A to 9D are cross-sectional views each illustrating one embodiment of a semiconductor device.

The transistor 100F illustrated in FIG. 9A differs from the transistor 100A illustrated in FIG. 5C in the shapes of the insulating film 112 and the conductive film 114 and the like. Specifically, the insulating film 112 and the conductive film 114 included in the transistor 100F have a rectangular shape in a cross section. Furthermore, the transistor 100F includes an insulating film 117 between the oxide semiconductor film 110 and the insulating film 118.

Figure 9B:
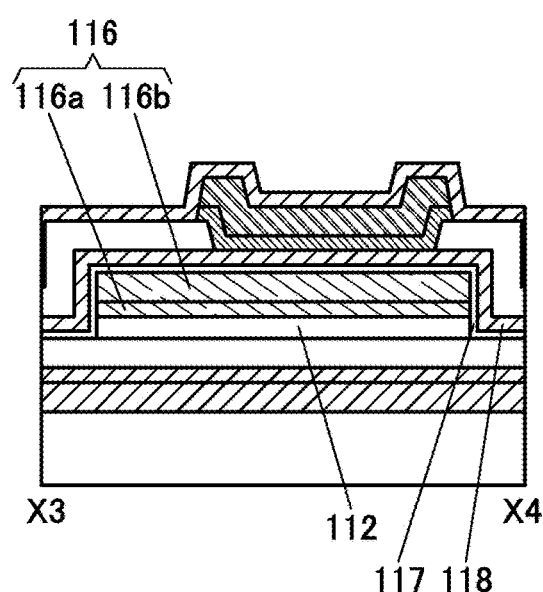

The capacitor 150F illustrated in FIG. 9B differs from the capacitor 150A illustrated in FIG. 5D in the shapes of the insulating film 112 and the conductive film 116 and the like. Specifically, the insulating film 112 and the conductive film 116 included in the capacitor 150F have a rectangular shape in a cross section. Furthermore, the capacitor 150F includes the insulating film 117 between the conductive film 116 and the insulating film 118.

The insulating film 117 illustrated in FIGS. 9A and 9B can be formed using an oxide insulating film containing nitrogen and having a small amount of defects which can be used for the insulating film 108c and the insulating film 112a in the transistor 100D and the capacitor 150D which are illustrated in FIGS. 8A and 8B.

Figure 10:
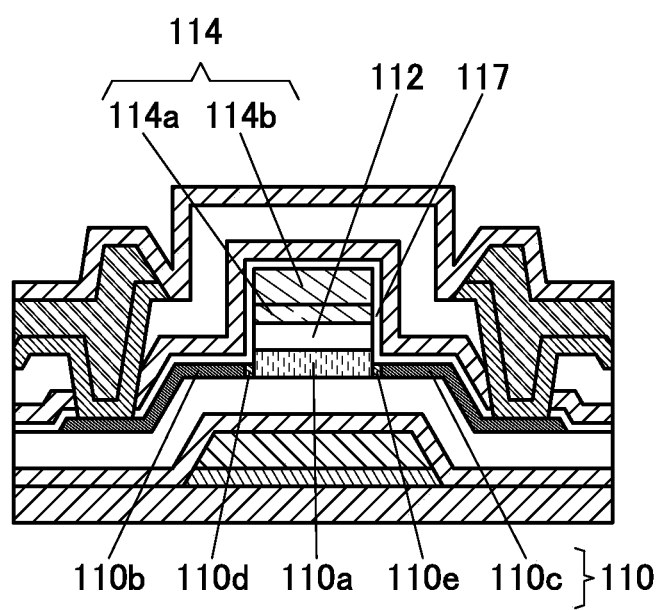
FIG. 10 is a cross-sectional view illustrating one embodiment of a semiconductor device.

When the structure of the transistor 100F has the shape illustrated in FIG. 9A, the shapes of low-resistance regions formed in the oxide semiconductor film 110 have a structure shown in FIG. 10.

FIG. 10 is an enlarged view of the vicinity of the oxide semiconductor film 110 of the transistor 100F illustrated in FIG. 9A. A region in which the carrier density of the oxide semiconductor film is increased and the conductivity thereof is increased (low-resistance region) is formed in a cross section of the oxide semiconductor film 110 in the channel length direction, as illustrated in FIG. 10. In FIG. 10, a channel length L corresponds to a length of a region between the pair of low-resistance regions.

As illustrated in FIG. 10, in a cross-sectional shape in the channel length direction, the oxide semiconductor film 110 includes the low-resistance region 110d between the channel region 110a and the low-resistance region 110b, and the low-resistance region 110e between the channel region 110a and the low-resistance region 110c. The low-resistance regions 110d and 110e have lower impurity element concentrations and higher resistivity than the low-resistance regions 110b and 110c. Here, the low-resistance regions 110d and 110e overlap with the insulating film 117 in contact with side surfaces of the insulating film 112 and the conductive film 114. Note that the low-resistance regions 110d and 110e may overlap with the insulating film 112 and the conductive film 114.

The oxide semiconductor film 110 includes the low-resistance regions 110d and 110e having lower impurity element concentrations and higher resistivity than the low-resistance regions 110b and 110c, whereby the electric field of the drain region can be relaxed. Thus, change in the threshold voltage of the transistor due to the electric field of the drain region can be reduced.

<Structure 8 of Semiconductor Device>

Figure 9C:
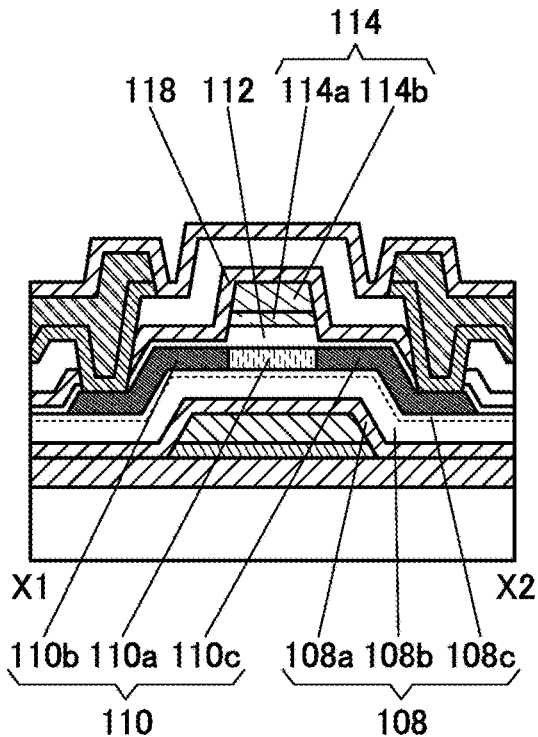
Figure 9D:
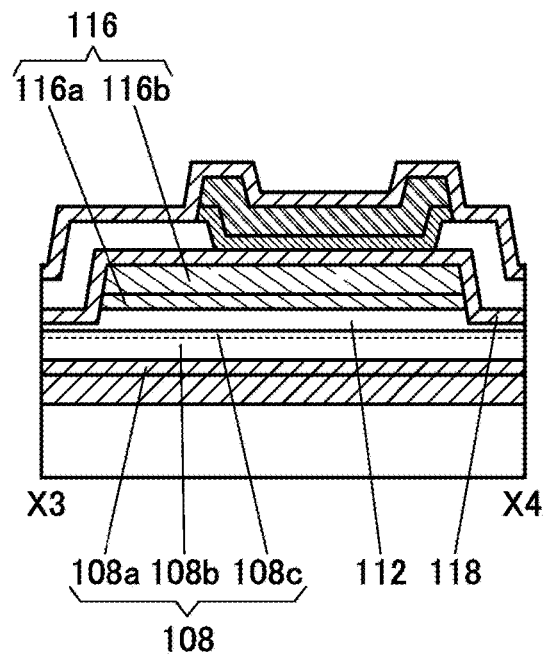

The transistor 100G illustrated in FIG. 9C differs from the transistor 100A illustrated in FIG. 5C in the shapes of the insulating film 112 and the oxide semiconductor film 110. Specifically, the insulating film 112 included in the transistor 100G has two thicknesses; a thickness of a region overlapping with the conductive film 114 is different from a thickness of a region not overlapping with the conductive film 114. The thickness of the region not overlapping with the conductive film 114 is smaller than the thickness of the region overlapping with the conductive film 114. Furthermore, the insulating film 112 covers the oxide semiconductor film 110; therefore, the whole oxide semiconductor film 110 has substantially the same thickness.

The capacitor 150G illustrated in FIG. 9D differs from the capacitor 150A illustrated in FIG. 5D in the shape of the insulating film 112. Specifically, the insulating film 112 included in the capacitor 150G has two thicknesses; a thickness of a region overlapping with the conductive film 116 is different from a thickness of a region not overlapping with the conductive film 116. The thickness of the region not overlapping with the conductive film 116 is smaller than the thickness of the region overlapping with the conductive film 116.

For example, the insulating film 112 illustrated in FIGS. 9C and 9D can be formed as follows: when the insulating film 112 is removed after the conductive film 114 is processed, a region of the insulating film 112 that does not overlap with the conductive film 114 is left.

Note that in the transistor 100G illustrated in FIG. 9C, the insulating film 112 is in contact with the channel region 110a of the oxide semiconductor film 110 and is in contact with the low-resistance regions 110b and 110c. Furthermore, in the insulating film 112, thicknesses of regions in contact with the low-resistance regions 110b and 110c are smaller than a thickness of a region in contact with the channel region 110a; the average thickness of the insulating film 112 is typically greater than or equal to 0.1 nm and less than or equal to 50 nm, or greater than or equal to 0.5 nm and less than or equal to 10 nm. As a result, the impurity element can be added to the oxide semiconductor film 110 through the insulating film 112, and in addition, hydrogen contained in the insulating film 118 can be moved to the oxide semiconductor film 110 through the insulating film 112. Thus, the low-resistance regions 110b and 110c can be formed.

When the insulating film 112 is formed using an oxide insulating film containing nitrogen and having a small amount of defects, nitrogen oxide is hardly generated in the insulating film 112, so that the carrier trap at the interface between the insulating film 112 and the oxide semiconductor film 110 can be reduced. As a result, a shift in the threshold voltage of each of the transistors can be reduced, which leads to a smaller change in the electrical characteristics of the transistors.

Furthermore, the insulating film 108 has a multilayer structure of the insulating films 108a, 108b, and 108c; for example, the insulating film 108a is formed using a nitride insulating film, the insulating film 108b is formed using an oxide insulating film that releases oxygen by being heated, and the insulating film 108c is formed using an oxide insulating film containing nitrogen and having a small amount of defects. Furthermore, the insulating film 112 is formed using an oxide insulating film containing nitrogen and having a small amount of defects. That is, the oxide semiconductor film 110 can be covered with the oxide insulating film containing nitrogen and having a small amount of defects. As a result, the carrier trap at the interfaces between the oxide semiconductor film 110 and the insulating films 108c and 112 can be reduced while oxygen contained in the insulating film 108b is moved to the oxide semiconductor film 110 by heat treatment to reduce oxygen vacancies contained in the channel region 110a of the oxide semiconductor film 110. As a result, a shift in the threshold voltage of the transistor can be reduced, which leads to a smaller change in the electrical characteristics of the transistor.

<Structure 9 of Semiconductor Device>

Figures 11A, 11B, 11C:
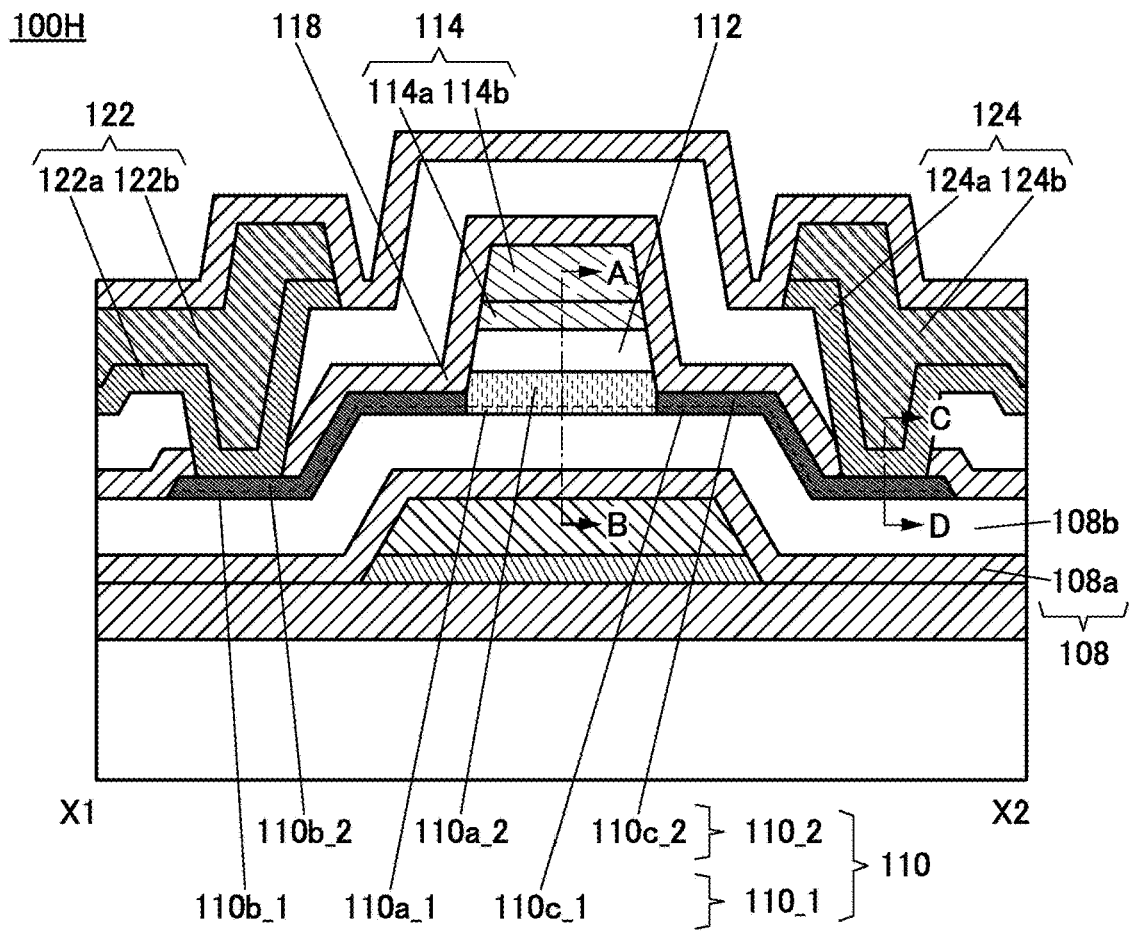
FIG. 11A is a cross-sectional view illustrating one embodiment of a semiconductor device and FIGS. 11B and 11C illustrate one embodiment of a band structure.

The transistor 100H illustrated in FIG. 11A differs from the transistor 100A illustrated in FIG. 5C in the structure of the oxide semiconductor film 110. Specifically, the oxide semiconductor film 110 included in the transistor 100H includes an oxide semiconductor film 110_1 and an oxide semiconductor film 110_2 provided in contact with the oxide semiconductor film 110_1. That is, the oxide semiconductor film 110 has a multilayer structure.

Furthermore, the oxide semiconductor film 110 of the transistor 100H illustrated in FIG. 11A includes the low-resistance regions described above. Specifically, the oxide semiconductor film 110 of the transistor 100H includes a channel region 110a1, a channel region 110a_2, a low-resistance region 110b_1, a low-resistance region 110b_2, a low-resistance region 110c_1, and a low-resistance region 110c_2.

<Band Structure>

Here, a band structure in the A-B cross section including the channel regions of the transistor 100H is illustrated in FIG. 11B. Note that the oxide semiconductor film 110_2 is assumed to have a wider energy gap than the oxide semiconductor film 110_1. Furthermore, the insulating film 108a, the insulating film 108b, and the insulating film 112 are assumed to have wider energy gaps than the oxide semiconductor film 110_1 and the oxide semiconductor film 110_2. Furthermore, the Fermi levels (denoted by Ef) of the oxide semiconductor film 110_1, the oxide semiconductor film 110_2, the insulating film 108a, the insulating film 108b, and the insulating film 112 are assumed to be equal to the intrinsic Fermi levels thereof (denoted by Ei). Furthermore, work functions of the conductive film 106 and the conductive film 114 are assumed to be equal to the Fermi levels.

When a gate voltage is set to be higher than or equal to the threshold voltage of the transistor, an electron flows preferentially in the oxide semiconductor film 110_1 owing to the difference between the energies of the conduction band minimums of the oxide semiconductor film 110_1 and the oxide semiconductor film 110_2. That is, it is probable that an electron is embedded in the oxide semiconductor film 110_1. Note that the energy at the conduction band minimum is denoted by Ec, and the energy at the valence band maximum is denoted by Ev.

Accordingly, in the transistor according to one embodiment of the present invention, the embedment of an electron reduces the influence of interface scattering. Therefore, the channel resistance of the transistor according to one embodiment of the present invention is low.

Next, FIG. 11C shows a band structure in the C-D cross section including the source region or the drain region of the transistor. Note that the low-resistance region 110c_1 and the low-resistance region 110c_2 are assumed to be in a degenerate state. Furthermore, the Fermi level of the oxide semiconductor film 110_1 is assumed to be approximately the same as the energy of the conduction band minimum in the low-resistance region 110c_1. Furthermore, the Fermi level of the oxide semiconductor film 110_2 is assumed to be approximately the same as the energy of the conduction band minimum in the low-resistance region 110c_2.

At this time, an ohmic contact is made between the conductive film 124 functioning as a source electrode or a drain electrode and the low-resistance region 110c_2 because an energy barrier therebetween is sufficiently low. Furthermore, an ohmic contact is made between the low-resistance region 110c_2 and the low-resistance region 110c_1. Therefore, electron transfer is conducted smoothly between the conductive film 124 and the oxide semiconductor films 110_1 and 110_2.

Note that description similar to that of FIG. 11C can be made on a region where the conductive film 122 functioning as one of a source electrode and a drain electrode of the transistor is in contact with the low-resistance region 110b_1 and the low-resistance region 110b_2 of the oxide semiconductor film 110.

As described above, the transistor according to one embodiment of the present invention is a transistor in which the channel resistance is low and electron transfer between the channel region and the source and the drain electrodes is conducted smoothly. That is, the transistor has excellent switching characteristics.

<Connection Portions and Intersection Portion of Conductive Films of Semiconductor Device>

Next, structures of connection portions and an intersection portion of conductive films of the semiconductor device of one embodiment of the present invention illustrated in FIGS. 5A to 5D are described with reference to FIGS. 30A to 30D. Note that FIGS. 30A to 30C are cross-sectional views showing structures of connection portions of conductive films, and FIG. 30D is a cross-sectional view showing a structure of an intersection portion of two different conductive films.

Figure 30A:
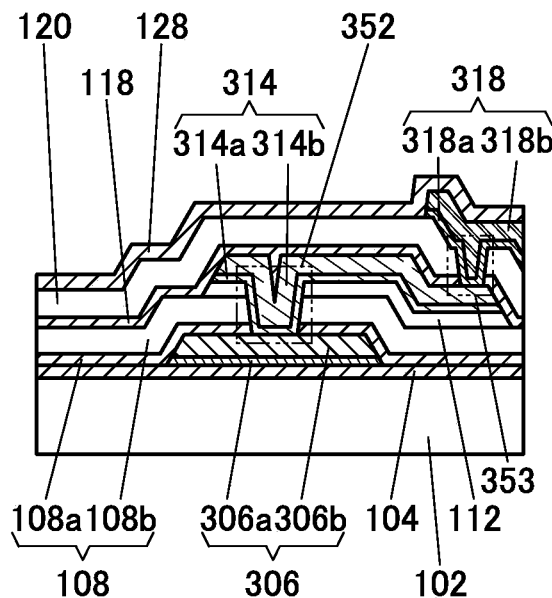
FIGS. 30A to 30D are cross-sectional views of a semiconductor device.

The connection portion illustrated in FIG. 30A includes the insulating film 104 over the substrate 102, a conductive film 306 over the insulating film 104, the insulating film 108 covering the conductive film 306, the insulating film 112 over the insulating film 108, a conductive film 314 which is provided over the insulating film 112 and is connected to the conductive film 306 in an opening portion 352 provided in the insulating film 112 and the insulating film 108, the insulating film 118 covering the insulating films 108 and 112 and the conductive film 314, the insulating film 120 over the insulating film 118, a conductive film 318 which is provided over the insulating film 120 and is connected to the conductive film 314 in an opening portion 353 provided in the insulating films 118 and 120, and the insulating film 128 covering the insulating film 120 and the conductive film 318.

Figure 30B:
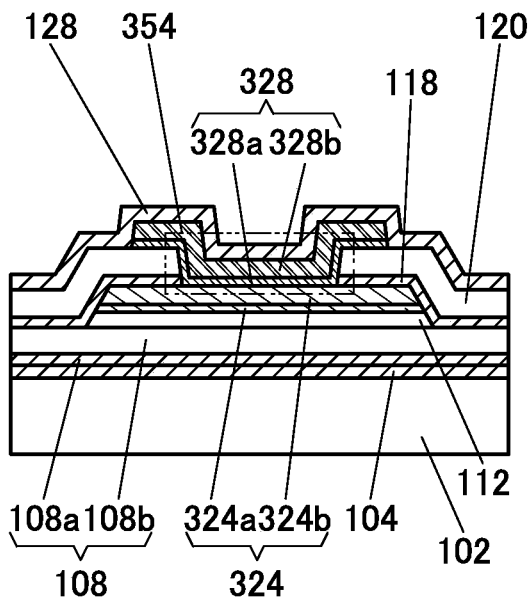

The connection portion illustrated in FIG. 30B includes the insulating film 104 over the substrate 102, the insulating film 108 over the insulating film 104, the insulating film 112 over the insulating film 108, a conductive film 324 over the insulating film 112, the insulating film 118 covering the insulating films 108 and 112 and the conductive film 324, the insulating film 120 over the insulating film 118, a conductive film 328 which is provided over the insulating film 120 and is connected to the conductive film 324 in an opening portion 354 provided in the insulating films 118 and 120, and the insulating film 128 covering the insulating film 120 and the conductive film 328.

Figure 30C:
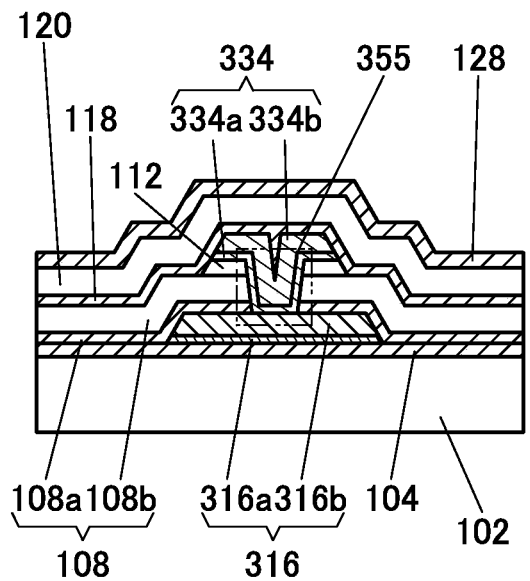
Figure 30D:
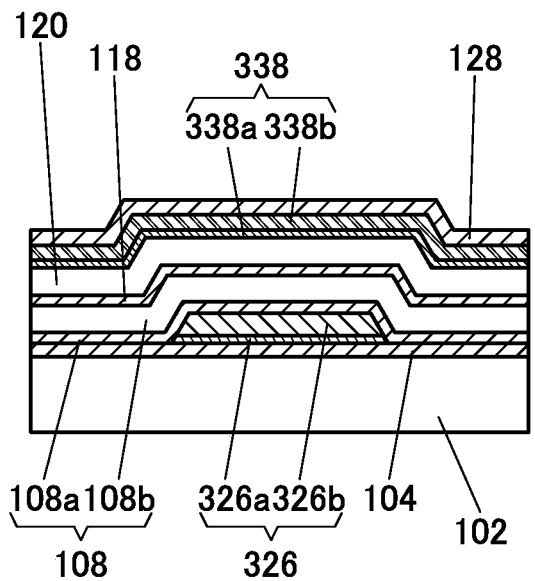

The connection portion illustrated in FIG. 30C includes the insulating film 104 over the substrate 102, a conductive film 316 over the insulating film 104, the insulating film 108 covering the conductive film 316, the insulating film 112 over the insulating film 108, a conductive film 334 which is provided over the insulating film 112 and is connected to the conductive film 316 in an opening portion 355 provided in the insulating film 112 and the insulating film 108, the insulating film 118 covering the insulating film 108 and the conductive film 334, the insulating film 120 over the insulating film 118, and the insulating film 128 over the insulating film 120.

The intersection portion illustrated in FIG. 30D includes the insulating film 104 over the substrate 102, a conductive film 326 over the insulating film 104, the insulating film 108 covering the conductive film 326, the insulating film 118 over the insulating film 108, the insulating film 120 over the insulating film 118, a conductive film 338 over the insulating film 120, and the insulating film 128 over the conductive film 338.

Note that in FIGS. 30A to 30D, the insulating film 108 has a stacked-layer structure of the insulating film 108a and the insulating film 108b over the insulating film 108a. Furthermore, in FIG. 30A, the conductive film 306 has a stacked-layer structure of a conductive film 306a and a conductive film 306b over the conductive film 306a, the conductive film 314 has a stacked-layer structure of a conductive film 314a and a conductive film 314b over the conductive film 314a, and the conductive film 318 has a stacked-layer structure of a conductive film 318a and a conductive film 318b over the conductive film 318a. Furthermore, in FIG. 30B, the conductive film 324 has a stacked-layer structure of a conductive film 324a and a conductive film 324b over the conductive film 324a, and the conductive film 328 has a stacked-layer structure of a conductive film 328a and a conductive film 328b over the conductive film 328a. Furthermore, in FIG. 30C, the conductive film 316 has a stacked-layer structure of a conductive film 316a and a conductive film 316b over the conductive film 316a, and the conductive film 334 has a stacked-layer structure of a conductive film 334a and a conductive film 334b over the conductive film 334a. Furthermore, in FIG. 30D, the conductive film 326 has a stacked-layer structure of a conductive film 326a and a conductive film 326b over the conductive film 326a, and the conductive film 338 has a stacked-layer structure of a conductive film 338a and a conductive film 338b over the conductive film 338a.

The conductive films 306, 316, and 326 are formed in the same step as a step of forming the conductive film 106 included in the transistor 100A. That is, the conductive film 106, the conductive film 306, the conductive film 316, and the conductive film 326 are at least partly formed over the same surface. Furthermore, the conductive films 314, 324, and 334 are formed in the same step as a step of forming the conductive film 114 included in the transistor 100A and the conductive film 116 included in the capacitor 150A. That is, the conductive film 114, the conductive film 116, the conductive film 314, the conductive film 324, and the conductive film 334 are at least partly formed over the same surface. Furthermore, the conductive films 318, 328, and 338 are formed in the same step as a step of forming the conductive films 122 and 124 included in the transistor 100A and the conductive film 126 included in the capacitor 150A. That is, the conductive film 124, the conductive film 126, the conductive film 318, the conductive film 328, and the conductive film 338 are at least partly formed over the same surface.

Furthermore, as illustrated in FIG. 30D, the insulating film 108, the insulating film 118, and the insulating film 120 are provided between the conductive film 326 and the conductive film 338. That is, the intersection portion of the conductive film 326 and the conductive film 338 has a structure in which a plurality of insulating films is stacked. When the intersection portion of the conductive films has the structure as illustrated in FIG. 30D, parasitic capacitance in a portion where the conductive films intersect each other can be reduced. As a result, signal delay due to the parasitic capacitance can be reduced.

<Method 1 for Manufacturing Semiconductor Device>

Next, an example of a method for manufacturing the transistor 100 and the capacitor 150 in FIGS. 1A to 1D is described with reference to FIGS. 12A to 12H, FIGS. 13A to 13F, FIGS. 14A to 14F, FIGS. 15A to 15F, and FIGS. 16A to 16F.

Note that the films included in the transistor 100 and the capacitor 150 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a plasma-enhanced chemical vapor deposition (PECVD) method are typical examples of the film formation method, a thermal CVD method may be used. As the thermal CVD method, a metal organic chemical vapor deposition (MOCVD) method or an atomic layer deposition (ALD) method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). In such a case, a first source gas is introduced, an inert gas (e.g., argon or nitrogen) or the like is introduced at the same time or after the first source gas is introduced so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

Note that FIGS. 12A, 12C, 12E, and 12G, FIGS. 13A, 13C, and 13E, FIGS. 14A, 14C, and 14E, FIGS. 15A, 15C, and 15E, and FIGS. 16A, 16C, and 16E are cross-sectional views illustrating a method for manufacturing the transistor 100, and FIGS. 12B, 12D, 12F, and 12H, FIGS. 13B, 13D, and 13F, FIGS. 14B, 14D, and 14F, FIGS. 15B, 150, and 15F, and FIGS. 16B, 16D, and 16F are cross-sectional views illustrating a method for manufacturing the capacitor 150.

Figure 12A:
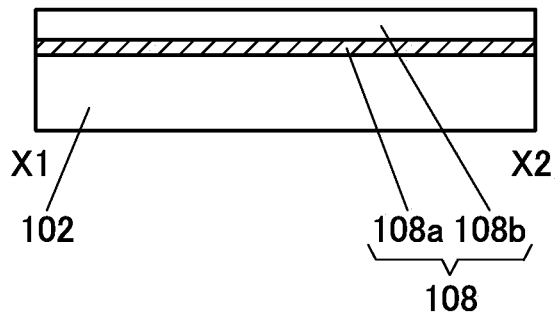
FIGS. 12A to 12H are cross-sectional views illustrating an example of a manufacturing process of a semiconductor device.
Figure 12B:
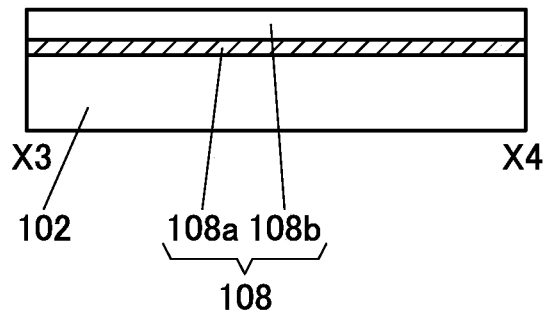

First, the insulating film 108 (the insulating film 108a and the insulating film 108b) is formed over the substrate 102 (see FIGS. 12A and 12B).

The insulating film 108 can be formed by a sputtering method, a CVD method, an evaporation method, a pulsed laser deposition (PLD) method, a printing method, a coating method, or the like as appropriate. In this embodiment, a 100-nm-thick silicon nitride film is formed using a PECVD apparatus as the insulating film 108a. Furthermore, a 400-nm-thick silicon oxynitride film is formed using a PECVD apparatus as the insulating film 108b.

After the insulating film 108b is formed, oxygen may be added to the insulating film 108b. Examples of oxygen added to the insulating film 108b include an oxygen radical, an oxygen atom, an oxygen atomic ion, and an oxygen molecular ion. As a method for adding the oxygen, an ion doping method, an ion implantation method, plasma treatment, or the like can be given. Alternatively, after a film that suppresses release of oxygen is formed over the insulating film, oxygen may be added to the insulating film 108b through the film.

Alternatively, as the insulating film 108b, a silicon oxide film or a silicon oxynitride film that can release oxygen by heat treatment can be formed under the following conditions: the substrate placed in a treatment chamber of the PECVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 $W/cm^2$ and less than or equal to 0.5 $W/cm^2$, or greater than or equal to 0.25 $W/cm^2$ and less than or equal to 0.35 $W/cm^2$ is supplied to an electrode provided in the treatment chamber.

Here, a method in which a film that suppresses release of oxygen is formed over the insulating film 108b and then oxygen is added to the insulating film 108b through the film is described.

Figure 12C:
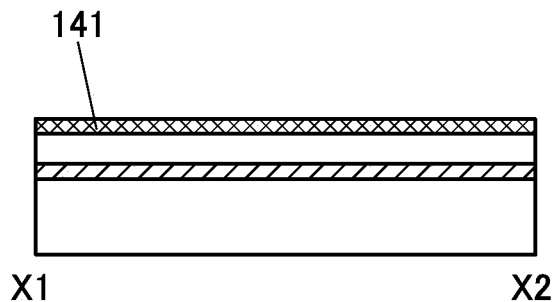
Figure 12D:
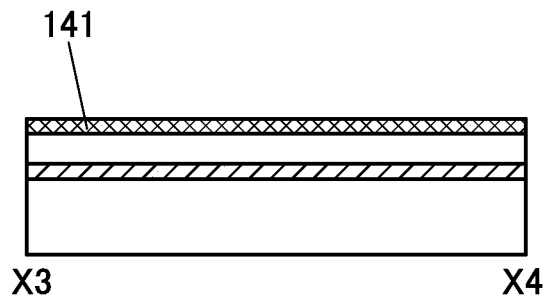

A film 141 that suppresses release of oxygen is formed over the insulating film 108b (see FIGS. 12C and 12D).

Figure 12E:
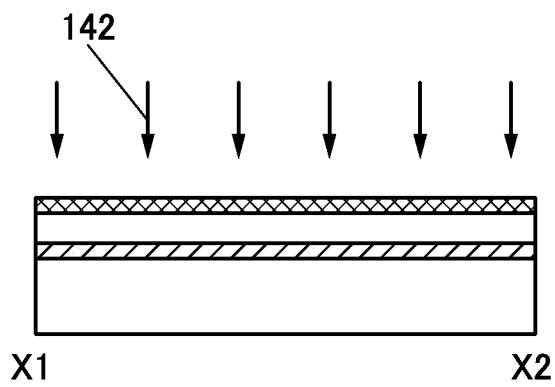
Figure 12F:
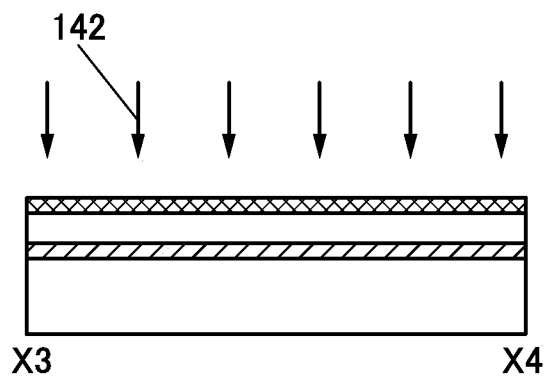

Next, oxygen 142 is added to the insulating film 108b through the film 141 (see FIGS. 12E and 12F).

The film 141 that suppresses release of oxygen is formed using any of the following conductive materials: a metal element selected from aluminum, chromium, tantalum, titanium, molybdenum, nickel, iron, cobalt, and tungsten; an alloy containing the above-described metal element as a component; an alloy containing any of the above-described metal elements in combination; a metal nitride containing the above-described metal element; a metal oxide containing the above-described metal element; a metal nitride oxide containing the above-described metal element; and the like.

The thickness of the film 141 that suppresses release of oxygen can be greater than or equal to 1 nm and less than or equal to 20 nm, or greater than or equal to 2 nm and less than or equal to 10 nm.

As a method for adding the oxygen 142 to the insulating film 108b through the film 141, an ion doping method, an ion implantation method, plasma treatment, or the like is given. By adding oxygen to the insulating film 108b with the film 141 provided over the insulating film 108b, the film 141 functions as a protective film that suppresses release of oxygen from the insulating film 108b. Thus, more oxygen can be added to the insulating film 108b.

In the case where oxygen is added by plasma treatment, by making oxygen excited by a microwave to generate high-density oxygen plasma, the amount of oxygen added to the insulating film 108b can be increased.

Figure 12G:
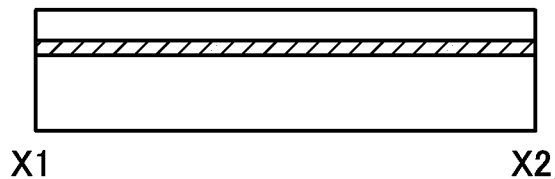
Figure 12H:
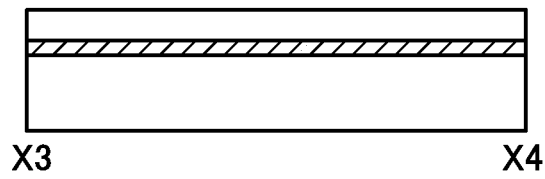

Then, the film 141 is removed (see FIGS. 12G and 12H).

Note that the treatment for adding oxygen which is illustrated in FIGS. 12C and 12D and FIGS. 12E and 12F is not necessarily performed in the case where the insulating film 108b to which a sufficient amount of oxygen is added can be formed after its deposition.

Next, an oxide semiconductor film is formed over the insulating film 108b, and the oxide semiconductor film is processed into a desired shape, whereby the oxide semiconductor film 110 is formed. After that, the insulating film 112 is formed over the insulating film 108b and the oxide semiconductor film 110 (see FIGS. 13A and 13B).

Figure 13A:
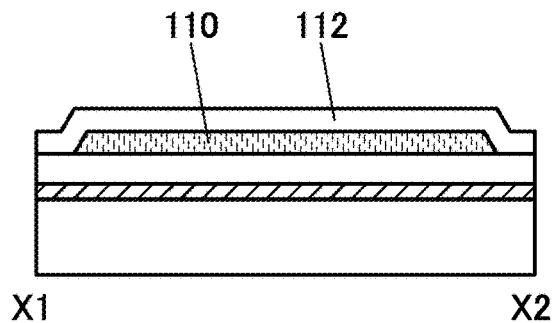
FIGS. 13A to 13F are cross-sectional views illustrating an example of a manufacturing process of a semiconductor device.
Figure 13B:
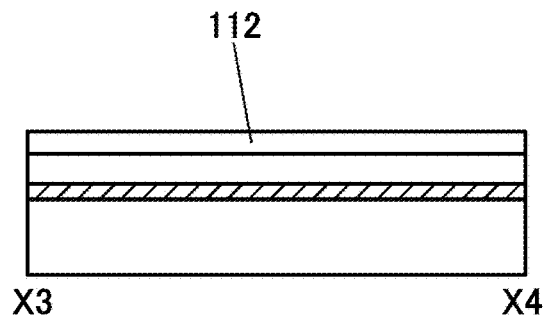

A formation method of the oxide semiconductor film 110 is described below. An oxide semiconductor film is formed over the insulating film 108b by a sputtering method, a coating method, a pulsed laser deposition method, a laser ablation method, a thermal CVD method, or the like. Then, after a mask is formed over the oxide semiconductor film by a lithography step, the oxide semiconductor film is partly etched using the mask. Accordingly, the oxide semiconductor film 110 can be formed as illustrated in FIG. 13A. After that, the mask is removed. Note that heat treatment may be performed after the oxide semiconductor film 110 is formed.

Alternatively, by using a printing method for forming the oxide semiconductor film 110, the oxide semiconductor film 110 subjected to element isolation can be formed directly.

As a power supply device for generating plasma in the case of forming the oxide semiconductor film by a sputtering method, an RF power supply device, an AC power supply device, a DC power supply device, or the like can be used as appropriate. Note that a CAAC-OS film can be formed using an AC power supply device or a DC power supply device. In forming the oxide semiconductor film, a sputtering method using an AC power supply device or a DC power supply device is preferable to a sputtering method using an RF power supply device because the oxide semiconductor film can be uniform in film thickness, film composition, or crystallinity.

In the case where the oxide semiconductor film is formed by a sputtering method, as a sputtering gas, a rare gas (typically argon), an oxygen gas, or a mixed gas of a rare gas and an oxygen gas is used as appropriate. In the case of using the mixed gas of a rare gas and an oxygen gas, the proportion of oxygen to a rare gas is preferably increased.

Furthermore, in the case where the oxide semiconductor film is formed by a sputtering method, a sputtering target may be appropriately selected in accordance with the composition of the oxide semiconductor film to be formed.

Note that in the case where the oxide semiconductor film is formed by, for example, a sputtering method at a substrate temperature higher than or equal to 150° C. and lower than or equal to 750° C., higher than or equal to 150° C. and lower than or equal to 450° C., or higher than or equal to 200° C. and lower than or equal to 350° C. to deposit an oxide semiconductor film, a CAAC-OS film can be formed. In the case where the substrate temperature is higher than or equal to 25° C. and lower than 150° C., a microcrystalline oxide semiconductor film can be formed.

For the deposition of the CAAC-OS film to be described later, the following conditions are preferably used.

By suppressing entry of impurities into the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, or −100° C. or lower is used.

Furthermore, it is preferable that the proportion of oxygen in the deposition gas be increased and the power be optimized in order to reduce plasma damage at the deposition. The proportion of oxygen in the deposition gas is set to be higher than or equal to 30 vol. %, or is set to be 100 vol. %.

After the oxide semiconductor film is formed, dehydrogenation or dehydration may be performed by heat treatment. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

The heat treatment is performed under an inert gas atmosphere containing nitrogen or a rare gas such as helium, neon, argon, xenon, or krypton. The heat treatment may be performed under an inert gas atmosphere first, and then under an oxygen atmosphere. It is preferable that the above inert gas atmosphere and the above oxygen atmosphere do not contain hydrogen, water, and the like. The treatment time is from 3 minutes to 24 hours.

An electric furnace, an RTA apparatus, or the like can be used for the heat treatment. With the use of an RTA apparatus, the heat treatment can be performed at a temperature higher than or equal to the strain point of the substrate if the heating time is short. Therefore, the heat treatment time can be shortened.

By depositing the oxide semiconductor film while it is heated or performing heat treatment after the formation of the oxide semiconductor film, the hydrogen concentration in the oxide semiconductor film which is measured by SIMS can be $5\times10^{19}$ atoms/cm$^3$ or lower, $1\times10^{19}$ atoms/cm$^3$ or lower, $5\times10^{18}$ atoms/cm$^3$ or lower, $1\times10^{18}$ atoms/cm$^3$ or lower, $5\times10^{17}$ atoms/cm$^3$ or lower, or $1\times10^{16}$ atoms/cm$^3$ or lower.

For example, in the case where an oxide semiconductor film, e.g., an InGaZnO$_x$ (X>0) film is deposited using a deposition apparatus employing ALD, an In(CH$_3$)$_3$ gas and an O$_3$ gas are sequentially introduced plural times to form an InO$_2$ layer, a Ga(CH$_3$)$_3$ gas and an O$_3$ gas are introduced at a time to form a GaO layer, and then a Zn(CH$_3$)$_2$ gas and an O$_3$ gas are introduced at a time to form a ZnO layer. Note that the order of these layers is not limited to this example. A mixed compound layer such as an InGaO$_2$ layer, an InZnO$_2$ layer, a GaInO layer, a ZnInO layer, or a GaZnO layer may be formed by mixing of these gases. Note that although an H$_2$O gas which is obtained by bubbling with an inert gas such as Ar may be used instead of an O$_3$ gas, it is preferable to use an O$_3$ gas, which does not contain H. Instead of an In(CH$_3$)$_3$ gas, an In(C$_2$H$_5$)$_3$ may be used. Instead of a Ga(CH$_3$)$_3$ gas, a Ga(C$_2$H$_5$)$_3$ gas may be used. Furthermore, a Zn(CH$_3$)$_2$ gas may be used.

Note that in this embodiment, the oxide semiconductor film 110 is formed as follows. A 50-nm-thick oxide semiconductor film is deposited using a sputtering apparatus and using an In—Ga—Zn metal oxide (In:Ga:Zn 1:1:1.2 [atomic ratio]) as a sputtering target, and then, heat treatment is performed, whereby oxygen contained in the insulating film 108b is moved to the oxide semiconductor film. Next, a mask is formed over the oxide semiconductor film, and part of the oxide semiconductor film is selectively etched. Thus, the oxide semiconductor film 110 is formed.

When the heat treatment is performed at a temperature higher than 350° C. and lower than or equal to 650° C., or higher than or equal to 450° C. and lower than or equal to 600° C., it is possible to obtain an oxide semiconductor film whose proportion of CAAC, which is described later, is greater than or equal to 60% and less than 100%, greater than or equal to 80% and less than 100%, greater than or equal to 90% and less than 100%, or greater than or equal to 95% and less than or equal to 98%. Furthermore, it is possible to obtain an oxide semiconductor film having a low content of hydrogen, water, and the like. That is, an oxide semiconductor film with a low impurity concentration and a low density of defect states can be formed.

The insulating film 112 can be formed by the formation method of the insulating film 108b as appropriate. As the insulating film 112, a silicon oxide film or a silicon oxynitride film can be formed by a PECVD method. In this case, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, and nitrogen dioxide can be given as examples.

The silicon oxynitride film having a small amount of defects can be formed as the insulating film 112 by a PECVD method under the conditions where the ratio of an oxidizing gas to a deposition gas is higher than 20 times and lower than 100 times or higher than or equal to 40 times and lower than or equal to 80 times and the pressure in a treatment chamber is lower than 100 Pa or lower than or equal to 50 Pa.

As the insulating film 112, a silicon oxide film or a silicon oxynitride film which is dense can be formed under the following conditions: the substrate placed in a treatment chamber of a PECVD apparatus that is vacuum-evacuated is held at a temperature higher than or equal to 280° C. and lower than or equal to 400° C., the pressure is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

The insulating film 112 can be formed by a plasma CVD method using a microwave. The microwave refers to a wave in the frequency range of 300 MHz to 300 GHz. In the case of a microwave, electron temperature is low and electron energy is low. Further, in supplied power, the proportion of power used for acceleration of electrons is low, and therefore, power can be used for dissociation and ionization of more molecules. Thus, plasma with high density (high-density plasma) can be excited. Therefore, a deposition surface and a deposit are less damaged by plasma, and the insulating film 112 with few defects can be formed.

Alternatively, the insulating film 112 can be formed by a CVD method using an organosilane gas. As the organosilane gas, any of the following silicon-containing compound can be used: tetraethyl orthosilicate (TEOS) (chemical formula: $Si(OC_2H_5)_4$); tetramethylsilane (TMS) (chemical formula: $Si(CH_3)_4$); tetramethylcyclotetrasiloxane (TMCTS); octamethylcyclotetrasiloxane (OMCTS); hexamethyldisilazane (HMDS); triethoxysilane ($SiH(OC_2H_5)_3$); trisdimethylaminosilane ($SiH(N(CH_3)_2)_3$); or the like. By a CVD method using the organosilane gas, the insulating film 112 having high coverage can be formed.

In the case where a gallium oxide film is formed as the insulating film 112, metal organic chemical vapor deposition (MOCVD) can be used.

In the case where a hafnium oxide film is formed as the insulating film 112 by a thermal CVD method such as an MOCVD method or an ALD method, two kinds of gases, i.e. ozone ($O_3$) as an oxidizer and a source gas that is obtained by vaporizing liquid containing a solvent and a hafnium precursor compound (a hafnium alkoxide solution, typically tetrakis (dimethylamide) hafnium (TDMAH)) are used. Note that the chemical formula of tetrakis(dimethylamide) hafnium is $Hf[N(CH_3)_2]_4$. Examples of another material liquid include tetrakis(ethylmethylamide)hafnium.

In the case where an aluminum oxide film is formed as the insulating film 112 by a thermal CVD method such as an MOCVD method or an ALD method, two kinds of gases, e.g., $H_2O$ as an oxidizer and a source gas that is obtained by vaporizing liquid containing a solvent and an aluminum precursor compound (e.g., trimethylaluminum (TMA)) are used. Note that the chemical formula of trimethylaluminum is $Al(CH_3)^3$. Examples of another material liquid include tris(dimethylamide)aluminum, triisobutylaluminum, and aluminum tris(2,2,6,6-tetramethyl-3,5-heptanedionate). Note that the ALD method enables the insulating film 112 to have excellent coverage and small thickness.

In the case where a silicon oxide film is formed as the insulating film 112 by a thermal CVD method such as an MOCVD method or an ALD method, hexachlorodisilane is adsorbed on a deposition surface, chlorine contained in adsorbate is removed, and radicals of an oxidizing gas (e.g., $O_2$ or dinitrogen monoxide) are supplied to react with the adsorbate.

Here, a 100-nm-thick silicon oxynitride film is formed using a PECVD apparatus as the insulating film 112.

Figure 13C:
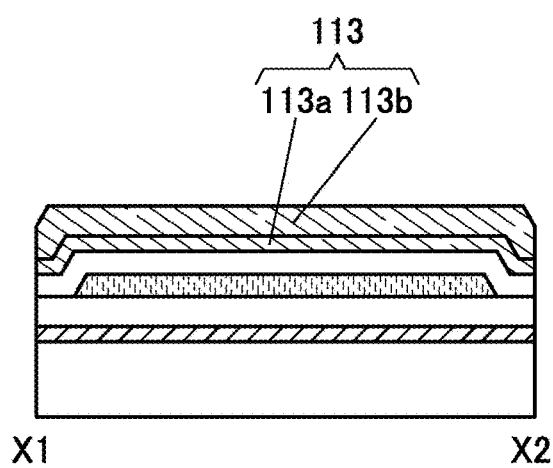
Figure 13D:
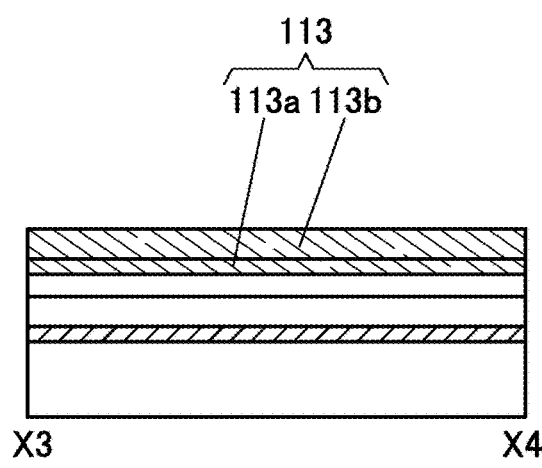

Next, a conductive film 113 (including a conductive film 113a and a conductive film 113b) is formed over the insulating film 112 (see FIGS. 13C and 13D).

The conductive film 113 can be formed by a sputtering method, a vacuum evaporation method, a pulsed laser deposition (PLD) method, a thermal CVD method, or the like. In this embodiment, a 10-nm-thick tantalum nitride film is formed using a sputtering apparatus as the conductive film 113a. Furthermore, a 300-nm-thick copper film is formed using a sputtering apparatus as the conductive film 113b. Note that the successive formation of the conductive film 113a and the conductive film 113b in a vacuum is preferable because entry of impurities into an interface between the conductive film 113a and the conductive film 113b can be suppressed.

Alternatively, a tungsten film can be formed as the conductive film 113b with a deposition apparatus employing an ALD method. In that case, a $WF_6$ gas and a $B_2H_6$ gas are sequentially introduced more than once to form an initial tungsten film, and then a $WF_6$ gas and an $H_2$ gas are introduced at a time, so that a tungsten film is formed. Note that an $SiH_4$ gas may be used instead of a $B_2H_6$ gas.

Figure 13E:
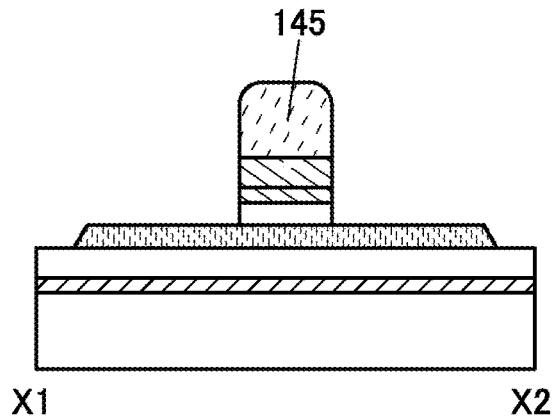
Figure 13F:
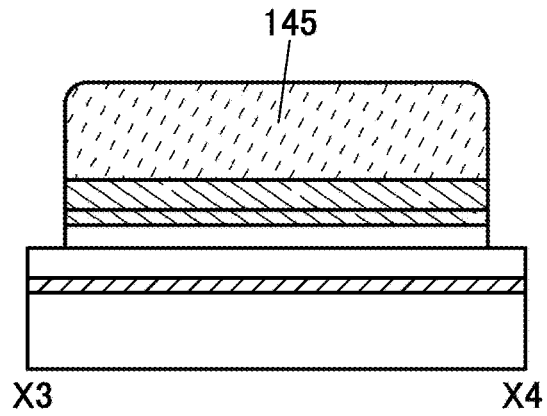

Next, a mask 145 is formed over the conductive film 113b by a lithography step, and then, the conductive film 113b, the conductive film 113a, and the insulating film 112 are partly etched (see FIGS. 13E and 13F).

As a method for etching the conductive film 113 and the insulating film 112, a wet etching method or/and a dry etching method can be used as appropriate.

Figure 14A:
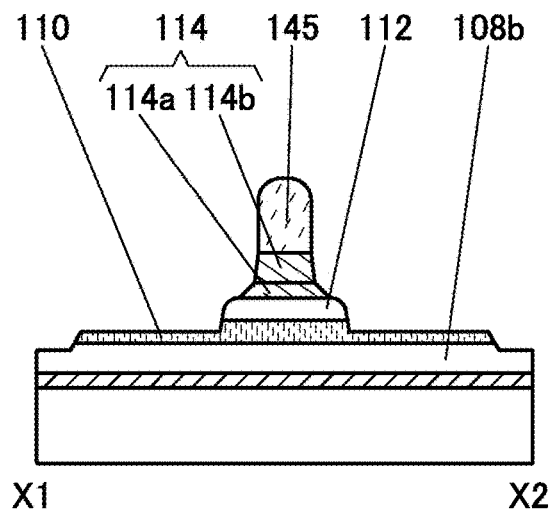
FIGS. 14A to 14F are cross-sectional views illustrating an example of a manufacturing process of a semiconductor device.
Figure 14B:
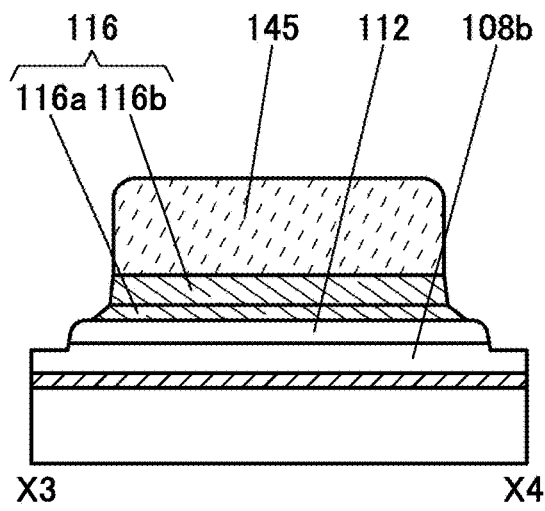

Next, the conductive film 113 and the insulating film 112 are processed while the mask 145 is reduced, whereby the conductive films 114a, 114b, 116a, and 116b are formed (see FIGS. 14A and 14B).

In the transistor 100, the oxide semiconductor film 110 is partly exposed in a step of etching the conductive film 113 and the insulating film 112. Note that a region where part of the oxide semiconductor film 110 is exposed has a smaller thickness than the oxide semiconductor film 110 overlapping with the conductive film 114 by a step of etching the conductive film 114 and the insulating film 112, in some cases. Furthermore, in the transistor 100, a region of the insulating film 108b functioning as a base film which is exposed from the oxide semiconductor film 110 is partly removed in a step of etching the conductive film 113 and the insulating film 112, and thus, the thickness of the region is smaller than that of a region overlapping with the oxide semiconductor film 110 in some cases. Furthermore, in the capacitor 150, a region of the insulating film 108b functioning as a base film which is exposed from the insulating film 112 is partly removed in a step of etching the conductive film 113 and the insulating film 112, and thus, the thickness of the region is smaller than that of a region overlapping with the insulating film 112 in some cases.

Figure 14C:
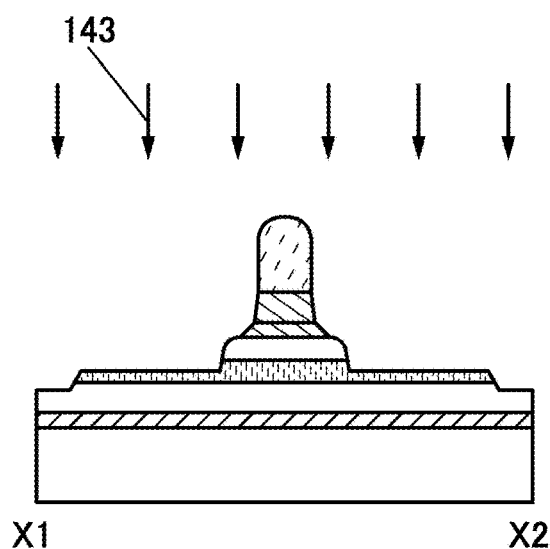
Figure 14D:
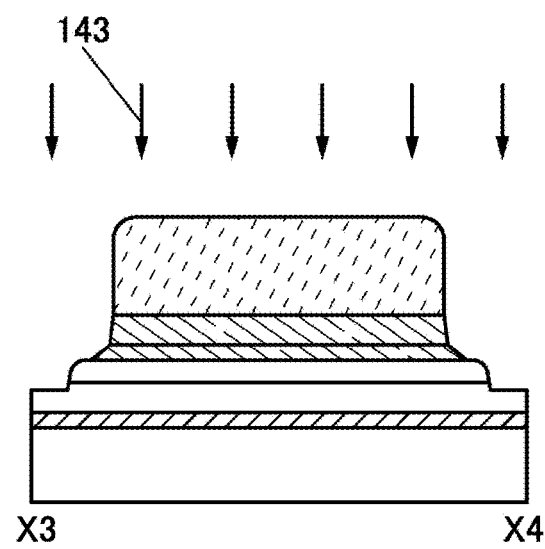

Next, an impurity element 143 is added over the insulating film 108b, the insulating film 112, the oxide semiconductor film 110, the conductive film 114, and the mask 145 (see FIGS. 14C and 14D).

In a step of adding the impurity element 143, the impurity element is added to regions of the oxide semiconductor film 110 which are not covered with the conductive film 114, the insulating film 112, and the mask 145. Note that an oxygen vacancy is formed in the oxide semiconductor film 110 by the addition of the impurity element 143.

As a method for adding the impurity element 143, an ion doping method, an ion implantation method, plasma treatment, or the like can be given. In the case of plasma treatment, plasma is generated in a gas atmosphere containing an impurity element to be added and plasma treatment is performed, whereby the impurity element can be added. A dry etching apparatus, an ashing apparatus, a plasma CVD apparatus, a high-density plasma CVD apparatus, or the like can be used to generate the plasma.

Note that, as a source gas of the impurity element 143, one or more of $B_2H_6$, $PH_3$, $CH_4$, $N_2$, $NH_3$, $AlH_3$, $AlCl_3$, $SiH_4$, $Si_2H_6$, $F_2$, HF, $H_2$, and a rare gas can be used. Alternatively, one or more of $B_2H_6$, $PH_3$, $N_2$, $NH_3$, $AlH_3$, $AlCl_3$, $F_2$, HF, and $H_2$ which are diluted with a rare gas can be used. By adding the impurity element 143 to the oxide semiconductor film 110 using one or more of $B_2H_6$, $PH_3$, $N_2$, $NH_3$, $AlH_3$, $AlCl_3$, $F_2$, HF, and $H_2$ which are diluted with a rare gas, the rare gas and one or more of hydrogen, boron, carbon, nitrogen, fluorine, aluminum, silicon, phosphorus, and chlorine can be added at a time to the oxide semiconductor film 110.

Alternatively, after a rare gas is added to the oxide semiconductor film 110, one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ may be added to the oxide semiconductor film 110.

Alternatively, after one or more of $B_2H_6$, $PH_3$, $CH_4$, $N_2$, $NH_3$, $AlH_3$, $AlCl_3$, $SiH_4$, $Si_2H_6$, $F_2$, HF, and $H_2$ are added to the oxide semiconductor film 110, a rare gas may be added to the oxide semiconductor film 110.

The addition of the impurity element 143 is controlled by appropriately setting the implantation conditions such as the acceleration voltage and the dose. For example, in the case where argon is added by an ion implantation method, the acceleration voltage may be set to 10 kV and the dose may be set to greater than or equal to $1\times10^{13}$ ions/cm$^2$ and less than or equal to $1\times10^{16}$ ions/cm$^2$, for example, $1\times10^{14}$ ions/cm$^2$. In the case where a phosphorus ion is added by an ion implantation method, the acceleration voltage may be set to 30 kV and the dose may be set to greater than or equal to $1\times10^{13}$ ions/cm$^2$ and Less than or equal to $5\times10^{16}$ ions/cm$^2$, for example, $1\times10^{15}$ ions/cm$^2$.

In the case where argon is added as the impurity element 143 using a dry etching apparatus, the substrate may be set to a parallel plate on the cathode side and an RF power may be supplied so that a bias is applied to the substrate side. As the RF power, for example, power density can be greater than or equal to 0.1 W/cm$^2$ and less than or equal to 2 W/cm$^2$.

It is preferable that the impurity element 143 be added in a state where the mask 145 is left as in this embodiment. By the addition of the impurity element 143 in a state where the mask 145 is left, adhesion of a constituent element of the conductive film 114 to a sidewall of the insulating film 112 can be suppressed. However, a method for adding the impurity element 143 is not limited thereto; for example, the impurity element 143 may be added using the conductive film 114 and the insulating film 112 as masks after the mask 145 is removed.

After that, heat treatment may be performed to further increase the conductivity of the region to which the impurity element 143 is added. The heat treatment is performed typically at a temperature higher than or equal to 150° C. and lower than the strain point of the substrate, higher than or equal to 250° C. and lower than or equal to 450° C., or higher than or equal to 300° C. and lower than or equal to 450° C.

Figure 14E:
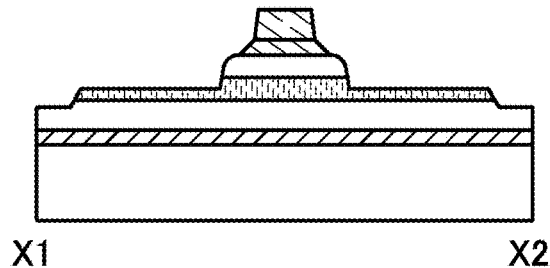
Figure 14F:
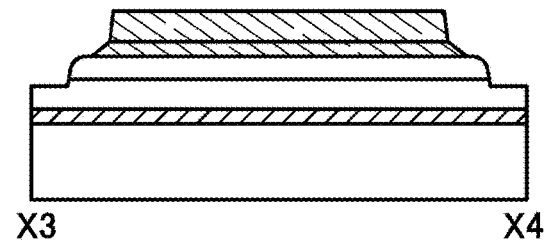

Next, the mask 145 is removed (see FIGS. 14E and 14F).

Figure 15A:
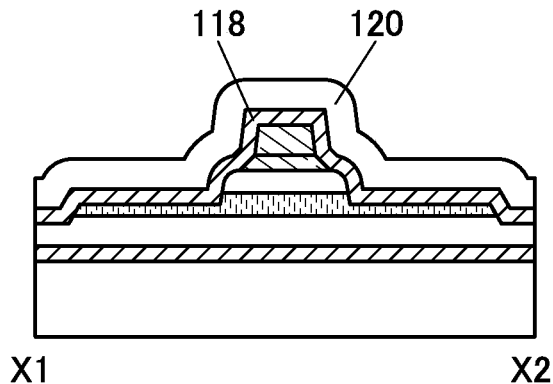
FIGS. 15A to 15F are cross-sectional views illustrating an example of a manufacturing process of a semiconductor device.
Figure 15B:
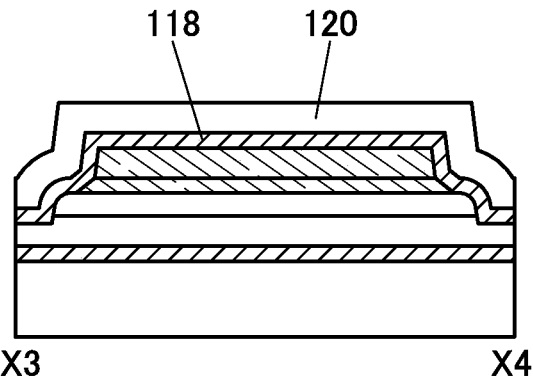

Next, the insulating film 118 is formed over the insulating film 108b, the oxide semiconductor film 110, and the conductive films 114 and 116, and the insulating film 120 is formed over the insulating film 118 (see FIGS. 15A and 15B).

For formation of the insulating film 118 and the insulating film 120, the formation method of the insulating film 108a and the insulating film 108b can be used as appropriate.

In this embodiment, a 100-nm-thick silicon nitride film is formed using a PECVD apparatus as the insulating film 118. Furthermore, a 300-nm-thick silicon oxynitride film is formed using a PECVD apparatus as the insulating film 120.

When the insulating film 118 is formed of a silicon nitride film, hydrogen in the silicon nitride film enters the oxide semiconductor film 110, so that the concentration of carriers in a region of the oxide semiconductor film 110 in contact with the insulating film 118 can be further increased.

Figure 15C:
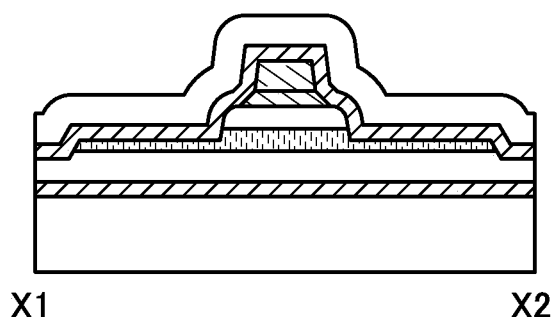
Figure 15D:
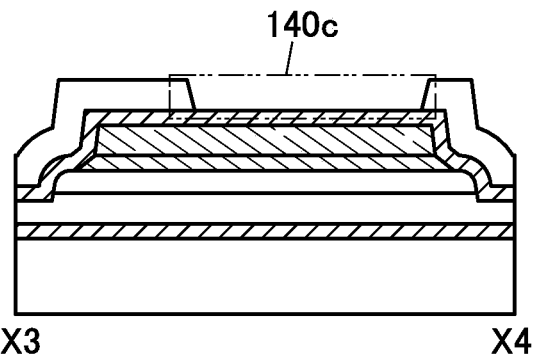

Next, a mask is formed over the insulating film 120 by a lithography step, and then, the insulating film 120 is partly etched, whereby the opening portion 140c that reaches the insulating film 118 is formed (see FIGS. 15C and 15D).

As a method for etching the insulating film 120, a wet etching method or/and a dry etching method can be used as appropriate.

Figure 15E:
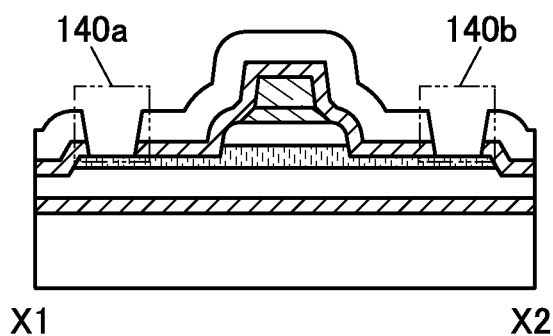
Figure 15F:
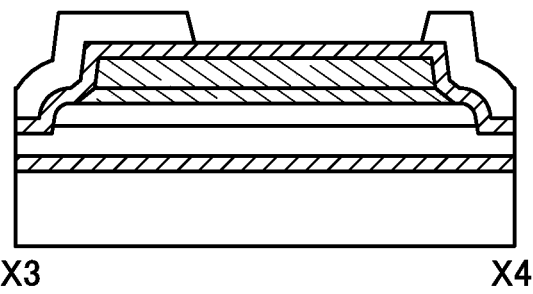

Next, a mask is formed over the insulating film 120 by a lithography step, and then, the insulating film 118 and the insulating film 120 are partly etched, whereby the opening portion 140a and the opening portion 140b that reach the oxide semiconductor film 110 is formed (see FIGS. 15E and 15F).

Note that in this embodiment, the opening portion 140c is formed in a step different from the step in which the opening portion 140a and the opening portion 140b are formed; however, a formation method of the opening portions is not limited thereto. For example, the opening portion 140c, the opening portion 140a, and the opening portion 140b may be formed at a time using a half-tone mask or a gray-tone mask. Using the half-tone mask or the gray-tone mask can reduce one lithography step, which leads to a reduction in a manufacturing cost.

Figure 16A:
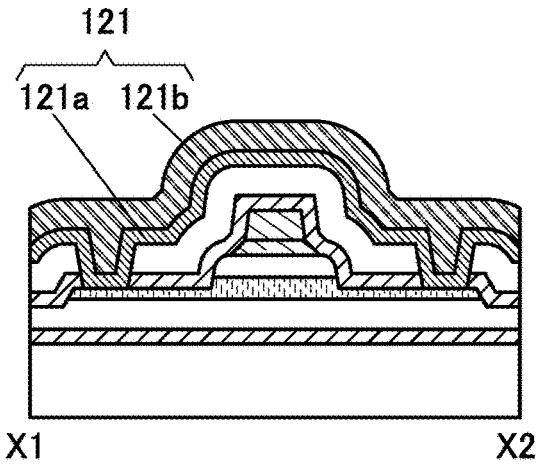
FIGS. 16A to 16F are cross-sectional views illustrating an example of a manufacturing process of a semiconductor device.
Figure 16B:
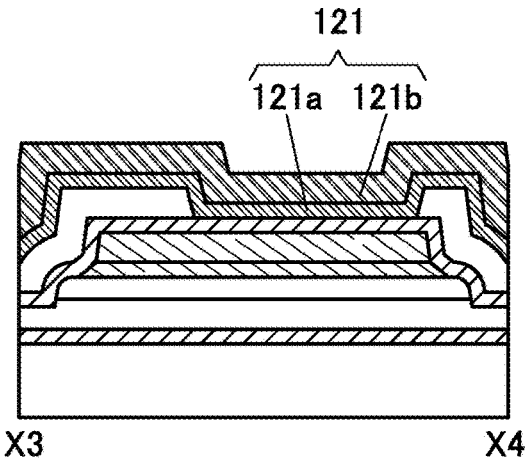

Next, a conductive film 121 (including a conductive film 121a and a conductive film 121b) is formed over the insulating film 120 to cover the opening portion 140a, the opening portion 140b, and the opening portion 140c (see FIGS. 16A and 16B).

The conductive film 121 can be formed by the formation method of the conductive film 113 as appropriate. Here, a 50-nm-thick tungsten film is formed using a sputtering apparatus as the conductive film 121a. Furthermore, a 200-nm-thick copper film is formed using a sputtering apparatus as the conductive film 121b.

Figure 16C:
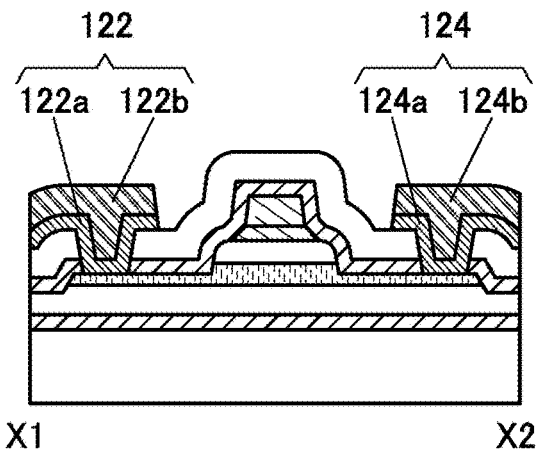
Figure 16D:
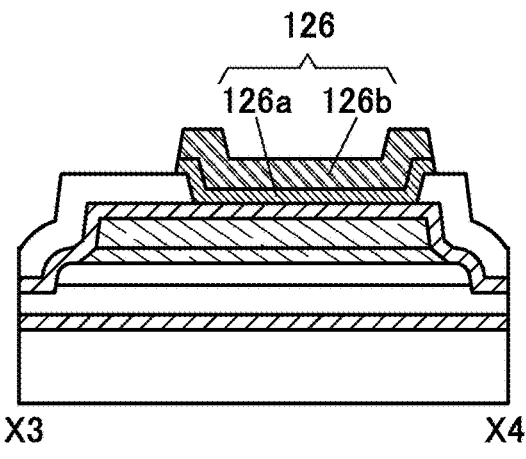

Next, a mask is formed over the conductive film 121b by a lithography step, and then, the conductive film 121a and the conductive film 121b are partly etched, whereby the conductive film 122, the conductive film 124, and the conductive film 126 are formed (see FIGS. 16C and 16D).

Note that the conductive film 122 has a stacked-layer structure of the conductive film 122a and the conductive film 122b over the conductive film 122a. Furthermore, the conductive film 124 has a stacked-layer structure of the conductive film 124a and the conductive film 124b over the conductive film 124a. Furthermore, the conductive film 126 has a stacked-layer structure of the conductive film 126a and the conductive film 126b over the conductive film 126a.

Figure 16E:
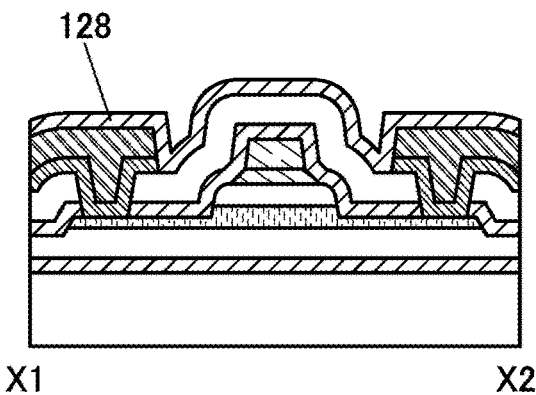
Figure 16F:
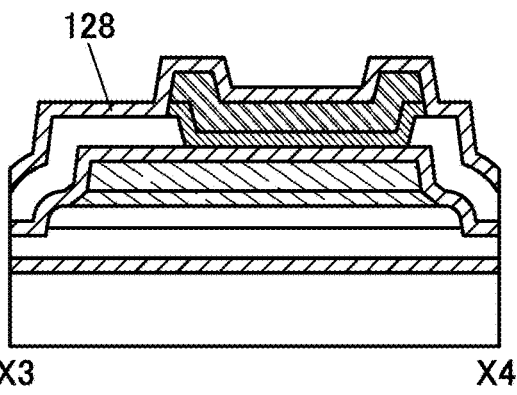

Next, the insulating film 128 is formed over the insulating film 120, the conductive film 122, the conductive film 124, and the conductive film 126 (see FIGS. 16E and 16F).

The insulating film 128 can be formed by the formation method of the insulating film 108a as appropriate. Here, a 200-nm-thick silicon nitride film is formed using a PECVD apparatus as the insulating film 128.

Through the above-described process, the transistor 100 and the capacitor 150 can be manufactured over the same substrate.

<Method 2 for Manufacturing Semiconductor Device>

Next, an example of a method for manufacturing the transistor 100A and the capacitor 150A in FIGS. 5A to 5D is described below.

The insulating film 104 is formed over the substrate 102. Next, a conductive film is formed over the insulating film 104, and the conductive film is processed into a desired shape, whereby the conductive film 106 is formed. Next, steps similar to those illustrated in FIGS. 12A to 12H and FIGS. 13A and 13B are performed. After that, a mask is formed over the insulating film 112 by a lithography step, and then, the insulating film 112 is partly etched, whereby the opening portion 139 that reaches the conductive film 106 is formed. Steps following this can be performed in manners similar to those of the steps illustrated in FIG. 13C and subsequent figures. Thus, the transistor 100A and the capacitor 150A illustrated in FIGS. 5A to 5D can be manufactured over the same substrate.

The structure and method described in this embodiment can be implemented by being combined as appropriate with any of the other structures and methods described in the other embodiments.

Embodiment 2

In this embodiment, the structure of an oxide semiconductor film included in a semiconductor device of one embodiment of the present invention is described below in detail.

First, a structure which can be included in an oxide semiconductor film is described below.

An oxide semiconductor film is classified roughly into a single-crystal oxide semiconductor film and a non-single-crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like.

First, a CAAC-OS film is described.

The CAAC-OS film is one of oxide semiconductor films having a plurality of c-axis aligned crystal parts.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflecting a surface over which the CAAC-OS film is formed (hereinafter, a surface over which the CAAC-OS film is formed is referred to as a formation surface) or a top surface of the CAAC-OS film, and is arranged parallel to the formation surface or the top surface of the CAAC-OS film.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Figure 17A:
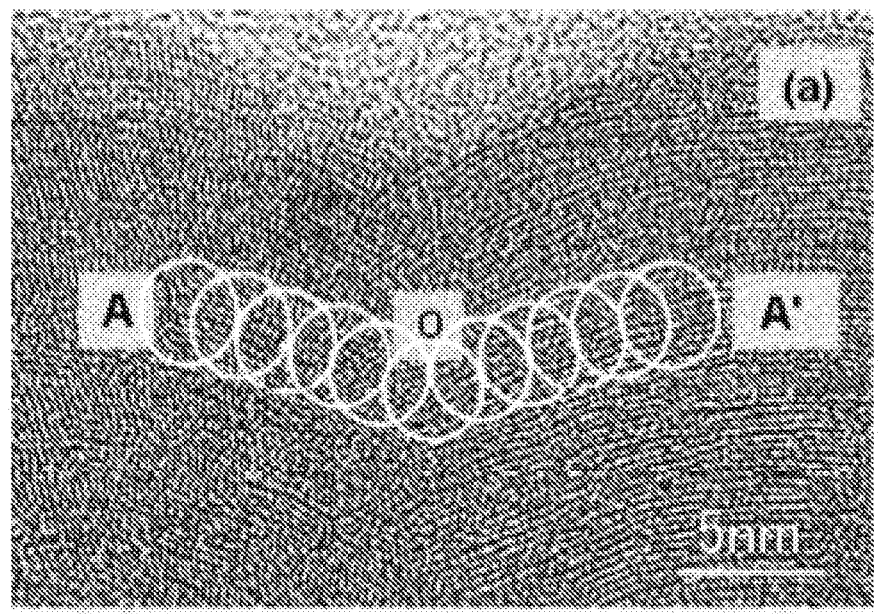
FIGS. 17A to 17C are cross-sectional TEM images and a local Fourier transform image of an oxide semiconductor.
Figure 17B:

FIG. 17A is a cross-sectional TEM image of a CAAC-OS film. FIG. 17B is a cross-sectional TEM image obtained by enlarging the image of FIG. 17A. In FIG. 17B, atomic arrangement is highlighted for easy understanding.

Figure 17C:
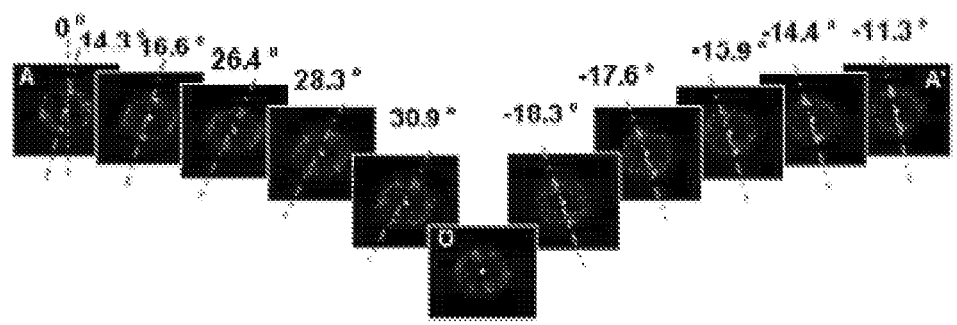

FIG. 17C is local Fourier transform images of regions each surrounded by a circle (the diameter is about 4 nm) between A and O and between O and A' in FIG. 17A. C-axis alignment can be observed in each region in FIG. 17C. The c-axis direction between A and O is different from that between O and A', which indicates that a grain in the region between A and O is different from that between O and A'. In addition, between A and O, the angle of the c-axis gradually and continuously changes from 14.3°, 16.6° to 30.9°. Similarly, between O and A', the angle of the c-axis gradually and continuously changes from −18.3°, −17.6°, to −11.3°.

Note that in an electron diffraction pattern of the CAAC-OS film, spots (bright spots) having alignment are shown. For example, when electron diffraction with an electron beam having a diameter of 1 nm or more and 30 nm or less (such electron diffraction is also referred to as nanobeam electron diffraction) is performed on the top surface of the CAAC-OS film, spots are observed (see FIG. 18A).

From the results of the cross-sectional TEM image and the plan TEM image, alignment is found in the crystal parts in the CAAC-OS film.

Most of the crystal parts included in the CAAC-OS film each fit inside a cube whose one side is less than 100 nm. Thus, there is a case where a crystal part included in the CAAC-OS film fits inside a cube whose one side is less than 10 nm, less than 5 inn, or less than 3 nm. Note that when a plurality of crystal parts included in the CAAC-OS film are connected to each other, one large crystal region is formed in some cases. For example, a crystal region with an area of 2500 nm$^2$ or more, 5 μm$^2$ or more, or 1000 μm$^2$ or more is observed in some cases in the plan TEM image.

A CAAC-OS film is subjected to structural analysis with an X-ray diffraction (XRD) apparatus. For example, when the CAAC-OS film including an InGaZnO$_4$ crystal is analyzed by an out-of-plane method, a peak appears frequently when the diffraction angle (2θ) is around 31°. This peak is derived from the (009) plane of the InGaZnO$_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZnO$_4$ crystal. Here, analysis (ϕscan) is performed under conditions where the sample is rotated around a normal vector of a sample surface as an axis (ϕ axis) with 2θ fixed at around 56°. In the case where the sample is a single-crystal oxide semiconductor film of InGaZnO$_4$, six peaks appear. The six peaks are derived from crystal planes equivalent to the (110) plane. On the other hand, in the case of a CAAC-OS film, a peak is not clearly observed even when ϕ scan is performed with 2θ fixed at around 56°.

According to the above results, in the CAAC-OS film having c-axis alignment, while the directions of a-axes and b-axes are irregularly oriented between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the c-axis aligned crystal parts in the CAAC-OS film varies depending on regions, in some cases.

Note that when the CAAC-OS film with an InGaZnO$_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

Next, a microcrystalline oxide semiconductor film is described.

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 am, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain boundary cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. Note that there is no regularity of crystal orientation between different crystal parts in the nc-OS film. Thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than that of a crystal part, a peak which shows a crystal plane does not appear. Further, a diffraction pattern like a halo pattern appears in a selected-area electron diffraction pattern of the nc-OS film which is obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter close to, or smaller than the diameter of a crystal part. Further, in a nanobeam electron diffraction pattern of the nc-OS film, regions with high luminance in a circular (ring) pattern are shown in some cases. Moreover, in a nanobeam electron diffraction pattern of the nc-OS film, a plurality of spots are shown in a ring-like region in some cases (see FIG. 18B).

The nc-OS film is an oxide semiconductor film that has high regularity as compared to an amorphous oxide semiconductor film. Therefore, the nc-OS film has a lower density of defect states than an amorphous oxide semiconductor film. However, there is no regularity of crystal orientation between different crystal parts in the nc-OS film; hence, the nc-OS film has a higher density of defect states than the CAAC-OS film.

Note that a film which forms the oxide semiconductor layer may be a stacked film including two or more films of an amorphous oxide semiconductor film, a microcrystalline oxide semiconductor film, and a CAAC-OS film, for example.

In the case where the oxide semiconductor film has a plurality of structures, the structures can be analyzed using nanobeam electron diffraction in some cases.

Figure 18A:
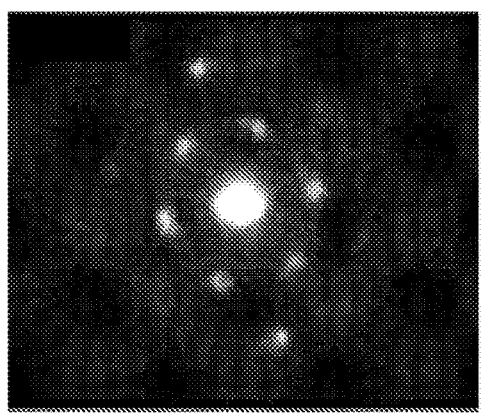
FIGS. 18A and 18B show nanobeam electron diffraction patterns of oxide semiconductor films.
Figure 18B:
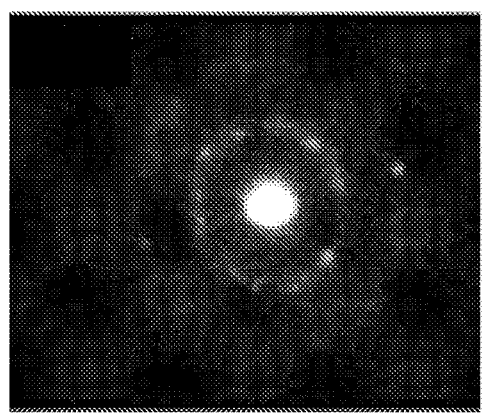
Figure 18C:
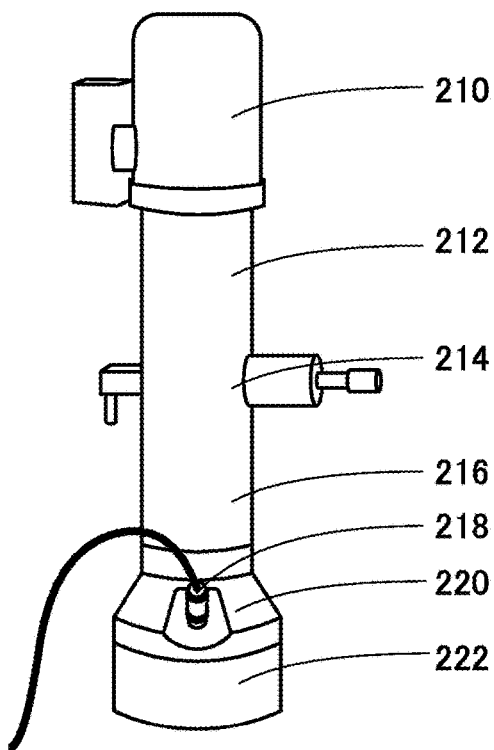
FIGS. 18C and 18D illustrate an example of a transmission electron diffraction measurement apparatus.

FIG. 18C illustrates a transmission electron diffraction measurement apparatus which includes an electron gun chamber 210, an optical system 212 below the electron gun chamber 210, a sample chamber 214 below the optical system 212, an optical system 216 below the sample chamber 214, an observation chamber 220 below the optical system 216, a camera 218 installed in the observation chamber 220, and a film chamber 222 below the observation chamber 220. The camera 218 is provided to face toward the inside of the observation chamber 220. Note that the film chamber 222 is not necessarily provided.

Figure 18D:
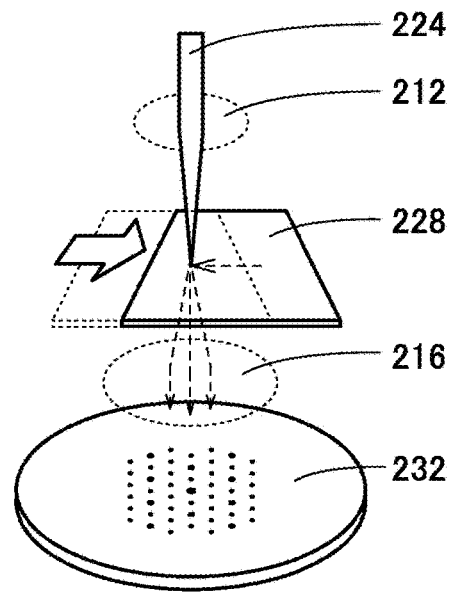

FIG. 18D illustrates an internal structure of the transmission electron diffraction measurement apparatus illustrated in FIG. 18C. In the transmission electron diffraction measurement apparatus, a substance 228 which is positioned in the sample chamber 214 is irradiated with electrons emitted from an electron gun installed in the electron gun chamber 210 through the optical system 212. Electrons passing through the substance 228 enter a fluorescent plate 232 provided in the observation chamber 220 through the optical system 216. A pattern which depends on the intensity of the incident electrons appears in the fluorescent plate 232, so that the transmitted electron diffraction pattern can be measured.

The camera 218 is installed so as to face the fluorescent plate 232 and can take a picture of a pattern appearing in the fluorescent plate 232. An angle formed by a straight line which passes through the center of a lens of the camera 218 and the center of the fluorescent plate 232 and the fluorescent plate 232 is, for example, 15° or more and 80° or less, 30° or more and 75° or less, or 45° or more and 70° or less. As the angle is reduced, distortion of the transmission electron diffraction pattern taken by the camera 218 becomes larger. Note that if the angle is obtained in advance, the distortion of an obtained transmission electron diffraction pattern can be corrected. Note that the camera 218 can be provided in the film chamber 222 in some cases. For example, the camera 218 may be set in the film chamber 222 so as to be opposite to the incident direction of electrons 224 enter. In this case, a transmission electron diffraction pattern with few distortion can be taken from the rear surface of the fluorescent plate 232.

A holder for fixing the substance 228 that is a sample is provided in the sample chamber 214. Electrons which passes through the substance 228 penetrate the holder. The holder may have, for example, a function of moving the substance 228 in the direction of the X, Y, and Z axes. The movement function of the holder may have an accuracy of moving the substance in the range of, for example, 1 nm to 10 nm, 5 nm to 50 nm, 10 nm to 100 nm, 50 nm to 500 nm, and 100 nm to 1 μm. The range is preferably determined to be an optimal range for the structure of the substance 228.

Then, a method for measuring a transmission electron diffraction pattern of a substance by the transmission electron diffraction measurement apparatus described above will be described.

For example, changes in the structure of a substance can be observed by changing the irradiation position of the electrons 224 that are a nanobeam on the substance (or by scanning) as illustrated in FIG. 18D. At this time, when the substance 228 is a CAAC-OS film, a diffraction pattern shown in FIG. 18A is observed. When the substance 228 is an nc-OS film, a diffraction pattern shown in FIG. 18B is observed.

Even when the substance 228 is a CAAC-OS film, a diffraction pattern similar to that of an nc-OS film or the like is partly observed in some cases. Therefore, whether or not a CAAC-OS film is favorable can be determined by the proportion of a region where a diffraction pattern of a CAAC-OS film is observed in a predetermined area (also referred to as proportion of CAAC). For example, in the case of a favorable CAAC-OS film, the proportion of CAAC is 60% or higher, preferably 80% or higher, further preferably 90% or higher, still preferably 95% or higher. Note that a proportion of a region other than that of the CAAC region is referred to as the proportion of non-CAAC.

For example, transmission electron diffraction patterns were obtained by scanning a top surface of a sample including a CAAC-OS film obtained just after deposition (represented as "as-sputtered") and a top surface of a sample including a CAAC-OS film subjected to heat treatment at 450° C. in an atmosphere containing oxygen. Here, the proportion of CAAC was obtained in such a manner that diffraction patterns were observed by scanning for 60 seconds at a rate of 5 nm/second and the obtained diffraction patterns were converted into still images every 0.5 seconds. Note that as an electron beam, a nanobeamn with a probe diameter of 1 nm was used. The above measurement was performed on six samples. The proportion of CAAC was calculated using the average value of the six samples.

Figure 19A:
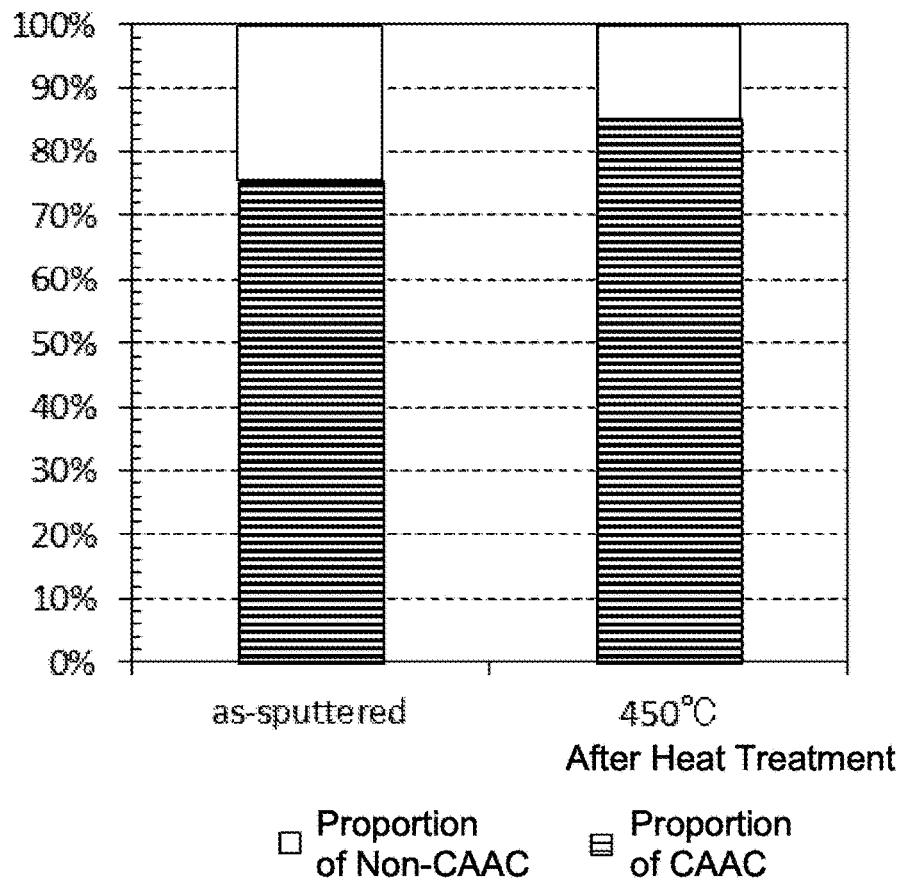
FIG. 19A shows an example of structural analysis by transmission electron diffraction measurement and FIGS. 19B and 19C show plan-view TEM images.

FIG. 19A shows the proportion of CAAC in each sample. The proportion of CAAC of the CAAC-OS film obtained just after the deposition was 75.7% (the proportion of non-CAAC was 24.3%). The proportion of CAAC of the CAAC-OS film subjected to the heat treatment at 450° C. was 85.3% (the proportion of non-CAAC was 14.7%). These results show that the proportion of CAAC obtained after the heat treatment at 450° C. is higher than that obtained just after the deposition. That is, heat treatment at a high temperature (e.g., higher than or equal to 400° C.) reduces the proportion of non-CAAC (increases the proportion of CAAC). Further, the above results also indicate that even when the temperature of the heat treatment is lower than 500° C., the CAAC-OS film can have a high proportion of CAAC.

Here, most of diffraction patterns different from that of a CAAC-OS film are diffraction patterns similar to that of an nc-OS film. Further, an amorphous oxide semiconductor film was not able to be observed in the measurement region. Therefore, the above results suggest that the region having a structure similar to that of an nc-OS film is rearranged by the heat treatment owing to the influence of the structure of the adjacent region, whereby the region becomes CAAC.

Figure 19B:
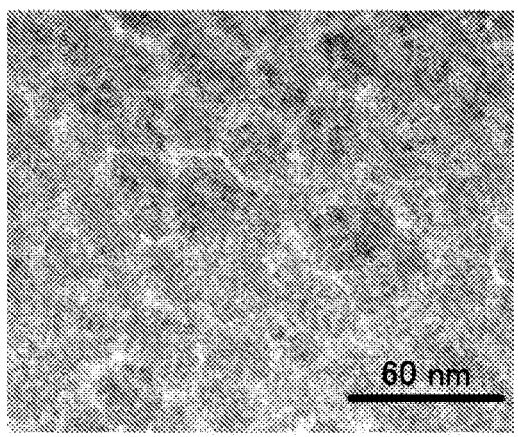
Figure 19C:
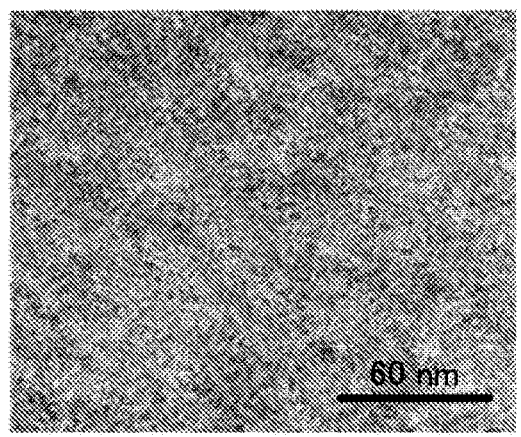

FIGS. 19B and 19C are planar TEM images of the CAAC-OS film obtained just after the deposition and the CAAC-OS film subjected to the heat treatment at 450° C., respectively. Comparison between FIGS. 19B and 19C shows that the CAAC-OS film subjected to the heat treatment at 450° C. has more uniform film quality. That is, the heat treatment at a high temperature improves the film quality of the CAAC-OS film.

With such a measurement method, the structure of an oxide semiconductor film having a plurality of structures can be analyzed in some cases.

The semiconductor device of one embodiment of the present invention can be formed using an oxide semiconductor film having any of the above structures.

<Deposition Model>

Examples of deposition models of a CAAC-OS film and an nc-OS film are described below.

Figure 40A:
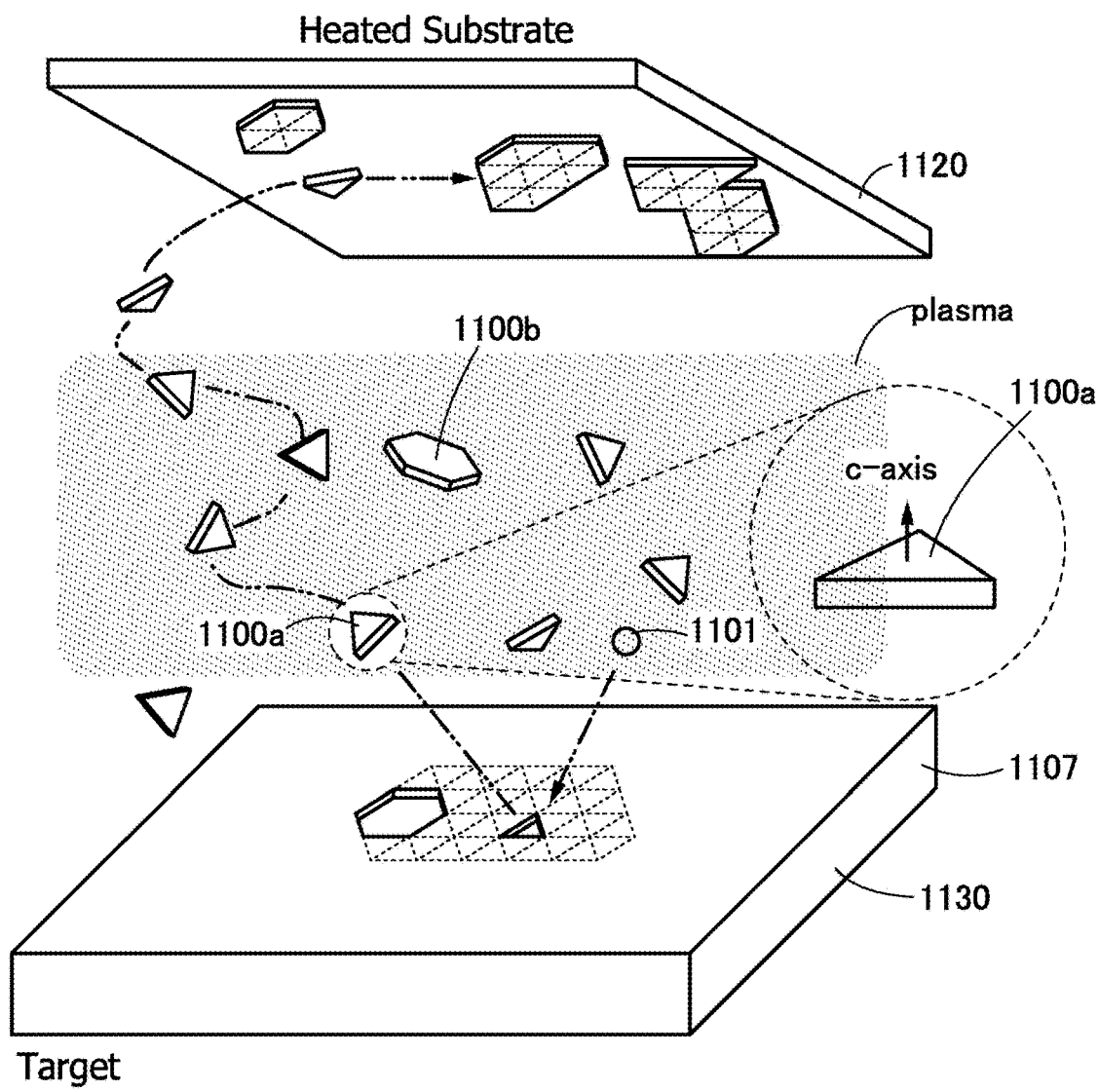
FIGS. 40A to 40C schematically illustrates a CAAC-OS deposition model.

FIG. 40A is a schematic diagram of a deposition chamber illustrating a state where the CAAC-OS film is formed by a sputtering method.

A target 1130 is attached to a backing plate. Under the target 1130 and the backing plate, a plurality of magnets are provided. The plurality of magnets cause a magnetic field over the target 1130. A sputtering method in which the disposition speed is increased by utilizing a magnetic field of magnets is referred to as a magnetron sputtering method.

The target 1130 has a polycrystalline structure in which a cleavage plane exists in at least one crystal grain. Note that the details of the cleavage plane are described later.

A substrate 1120 is placed to face the target 1130, and the distance d (also referred to as a target-substrate distance (T-S distance)) is greater than or equal to 0.01 m and less than or equal to 1 m, preferably greater than or equal to 0.02 m and less than or equal to 0.5 m. The deposition chamber is mostly filled with a deposition gas (e.g., an oxygen gas, an argon gas, or a mixed gas containing oxygen at 50 vol % or higher) and controlled to higher than or equal to 0.01 Pa and lower than or equal to 100 Pa, preferably higher than or equal to 0.1 Pa and lower than or equal to 10 Pa. Here, discharge starts by application of a voltage at a certain value or higher to the target 1130, and plasma is observed. Note that the magnetic field over the target 1130 forms a high-density plasma region. In the high-density plasma region, the deposition gas is ionized, so that an ion 1101 is generated. Examples of the ion 1101 include an oxygen cation ($O^+$) and an argon cation ($Ar^+$).

The ion 1101 is accelerated to the target 1130 side by an electric field, and collides with the target 1130 eventually. At this time, a pellet 1100a and a pellet 1100b which are flat-plate-like or pellet-like sputtered particles are separated and sputtered from the cleavage plane. Note that structures of the pellet 1100a and the pellet 1100b may be distorted by an impact of collision of the ion 1101.

The pellet 1100a is a flat-plate-like or pellet-like sputtered particle having a triangle plane, e.g., a regular triangle plane. The pellet 1100b is a flat-plate-like or pellet-like sputtered particle having a hexagon plane, e.g., regular hexagon plane. Note that flat-plate-like or pellet-like sputtered particles such as the pellet 1100a and the pellet 1100b are collectively called pellets 1100. The shape of a flat plane of the pellet 1100 is not limited to a triangle or a hexagon. For example, the flat plane may have a shape formed by combining greater than or equal to 2 and less than or equal to 6 triangles. For example, a square (rhombus) is formed by combining two triangles (regular triangles) in some cases.

The thickness of the pellet 1100 is determined depending on the kind of the deposition gas and the like. The thicknesses of the pellets 1100 are preferably uniform; the reasons thereof are described later. In addition, the sputtered particle preferably has a pellet shape with a small thickness as compared to a dice shape with a large thickness.

Figure 42:
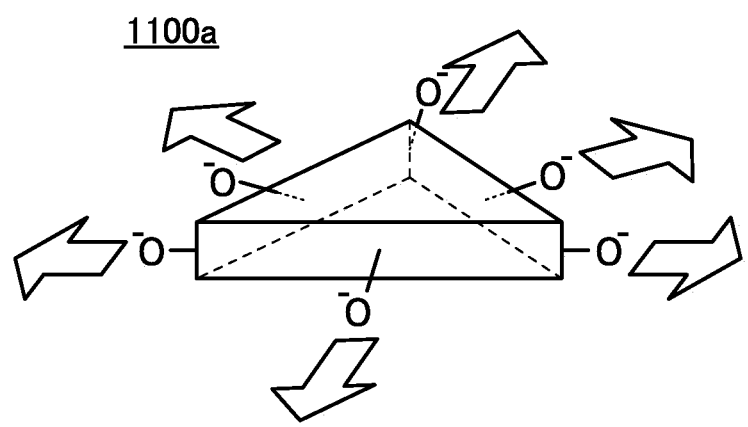
FIG. 42 illustrates a pellet.

The pellet 1100 receives charge when passing through the plasma, so that side surfaces of the pellet 1100 are negatively or positively charged in some cases. The pellet 1100 includes an oxygen atom on its side surface, and the oxygen atom may be negatively charged. For example, a case in which the pellet 1100a includes, on its side surfaces, oxygen atoms that are negatively charged is illustrated in FIG. 42. As in this view, when the side surfaces are charged in the same polarity, charges repel each other, and accordingly, the pellet can maintain a flat-plate shape. In the case where a CAAC-OS is an In—Ga—Zn oxide, there is a possibility that an oxygen atom bonded to an indium atom is negatively charged. There is another possibility that an oxygen atom bonded to an indium atom, a gallium atom, and a zinc atom is negatively charged.

Figure 43:
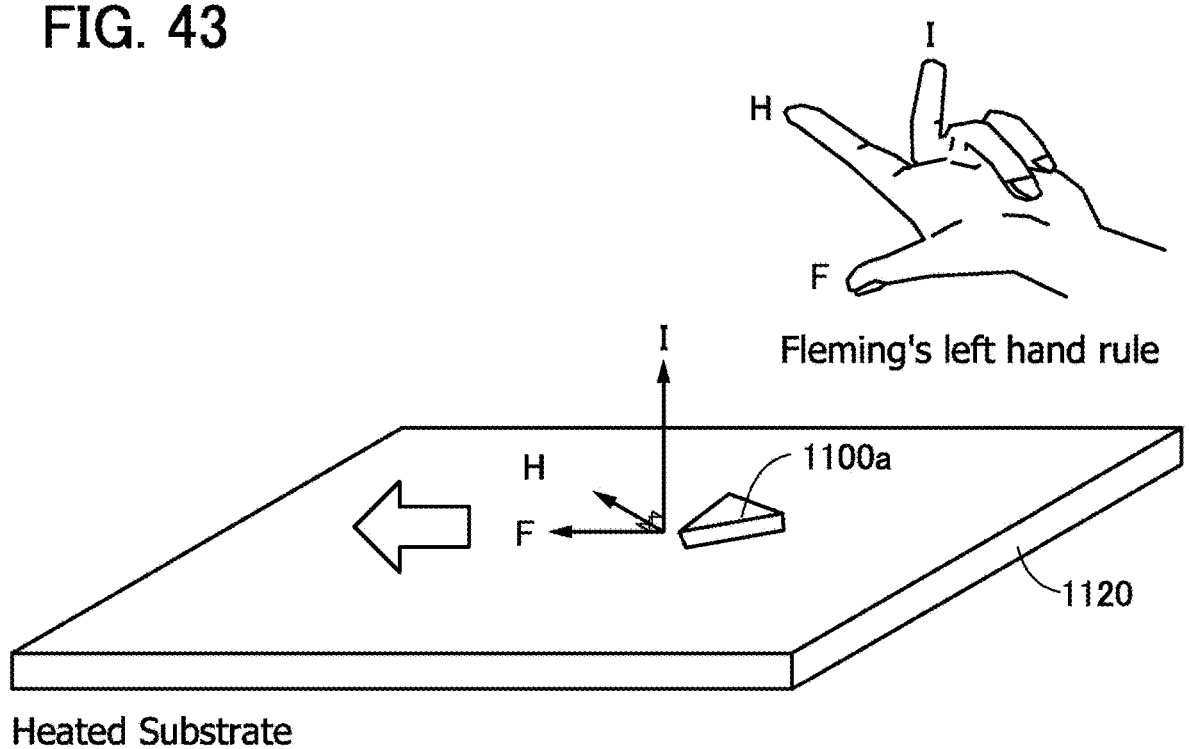
FIG. 43 illustrates force applied to a pellet on a formation surface.

As shown in FIG. 40A, the pellet 1100 flies like a kite in plasma and flutters up to the substrate 1120. Since the pellets 1100 are charged, when the pellet 1100 gets close to a region where another pellet 1100 has already been deposited, repulsion is generated. Here, above the substrate 1120, a magnetic field is generated in a direction parallel to a top surface of the substrate 1120. A potential difference is given between the substrate 1120 and the target 1130, and accordingly, current flows from the substrate 1120 toward the target 1130. Thus, the pellet 1100 is given a force (Lorentz force) on the top surface of the substrate 1120 by an effect of the magnetic field and the current (see FIG. 43). This is explainable with Fleming's left-hand rule. In order to increase a force applied to the pellet 1100, it is preferable to provide, on the top surface, a region where the magnetic field in a direction parallel to the top surface of the substrate 1120 is 10 G or higher, preferably 20 G or higher, further preferably 30 G or higher, still further preferably 50 G or higher. Alternatively, it is preferable to provide, on the top surface, a region where the magnetic field in a direction parallel to the top surface of the substrate is 1.5 times or higher, preferably twice or higher, further preferably 3 times or higher, still further preferably 5 times or higher as high as the magnetic field in a direction perpendicular to the top surface of the substrate 1120.

Figure 44A:
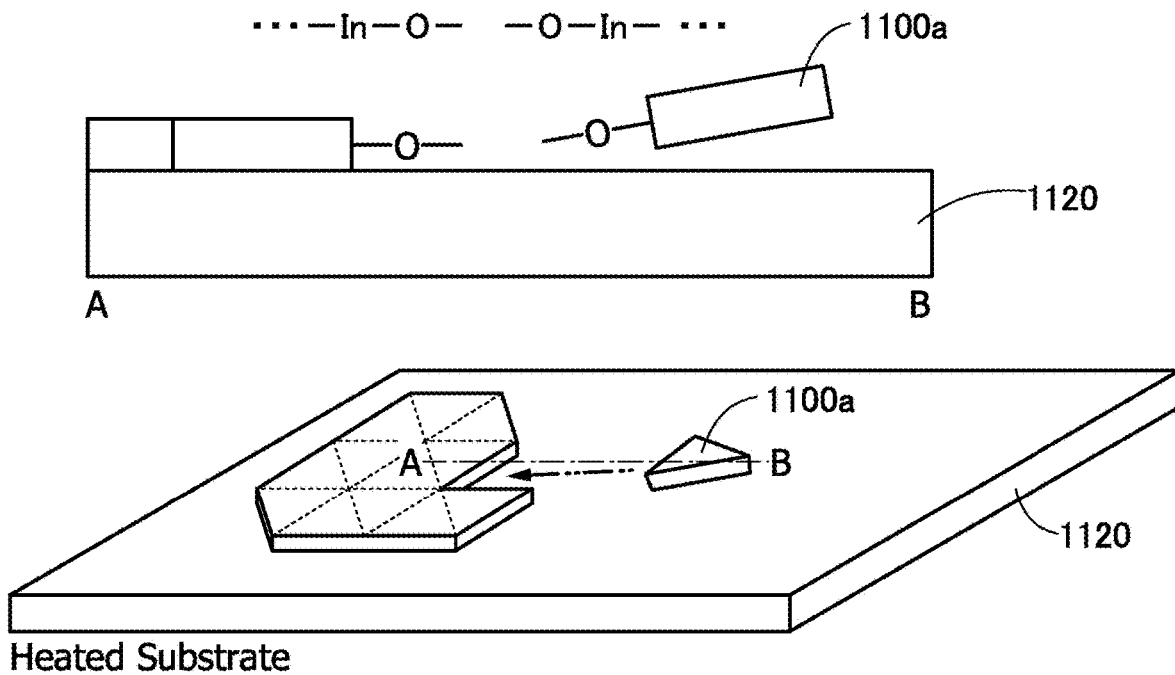
FIGS. 44A and 44B illustrate movement of a pellet on a formation surface.
Figure 44B:
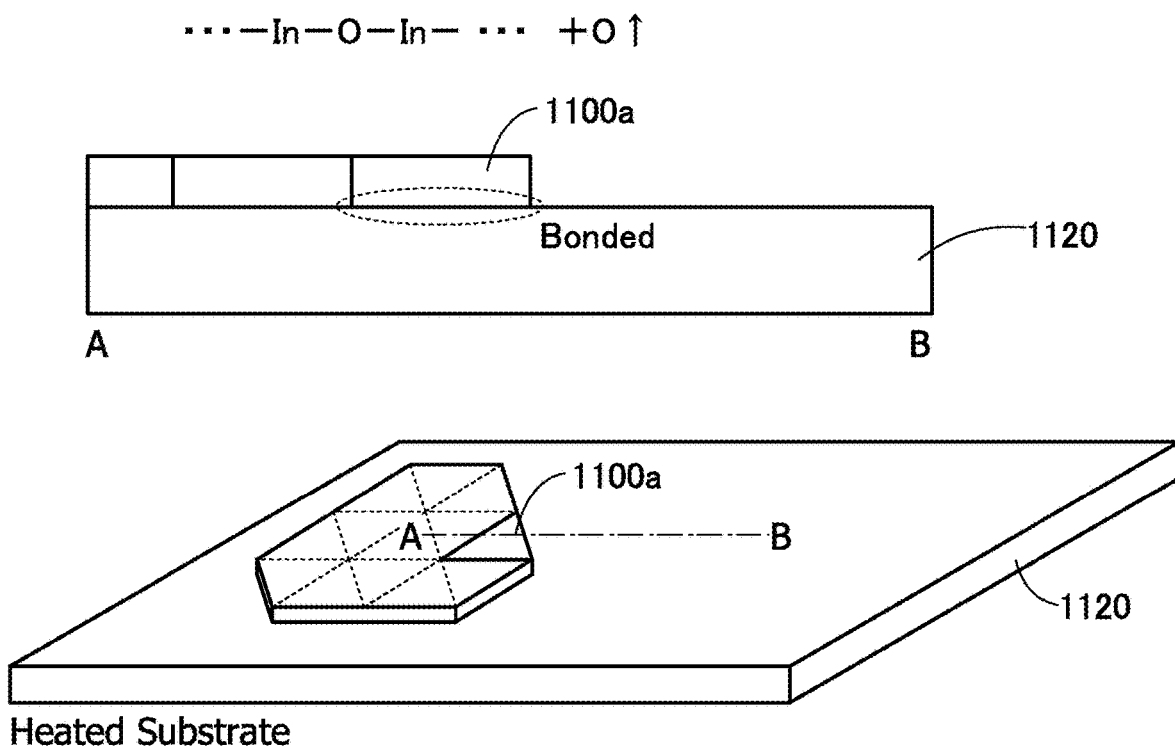

Furthermore, the substrate 1120 is heated, and resistance such as friction between the pellet 1100 and the substrate 1120 is low. As a result, as illustrated in FIG. 44A, the pellet 1100 glides above the surface of the substrate 1120. The glide of the pellet 1100 is caused in a state where the flat plane faces the substrate 1120. Then, as illustrated in FIG. 44B, when the pellet 1100 reaches the side surface of another pellet 1100 that has been already deposited, the side surfaces of the pellets 1100 are bonded. At this time, the oxygen atom on the side surface of the pellet 1100 is released. With the released oxygen atom, oxygen vacancies in a CAAC-OS are filled in some cases; thus, the CAAC-OS has a low density of defect states.

Further, the pellet 1100 is heated on the substrate 1120, whereby atoms are rearranged, and the structure distortion caused by the collision of the ion 1101 can be reduced. The pellet 1100 whose structure distortion is reduced is substantially single crystal. Even when the pellets 1100 are heated after being bonded, expansion and contraction of the pellet 1100 itself hardly occur, which is caused by turning the pellet 1100 into substantially single crystal. Thus, formation of defects such as a grain boundary due to expansion of a space between the pellets 1100 can be prevented, and accordingly, generation of crevasses can be prevented. Further, the space is filled with elastic metal atoms and the like, whereby the elastic metal atoms have a function, like a highway, of jointing side surfaces of the pellets 1100 which are not aligned with each other.

It is considered that as shown in such a model, the pellets 1100 are deposited over the substrate 1120. Thus, a CAAC-OS film can be deposited even when a surface over which a film is formed (film formation surface) does not have a crystal structure, which is different from film deposition by epitaxial growth. For example, even when a surface (film formation surface) of the substrate 1120 has an amorphous structure, a CAAC-OS film can be formed.

Figure 40B:
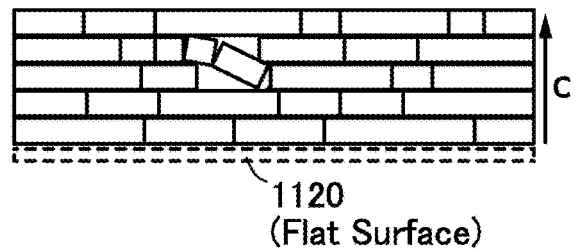

Further, it is found that in formation of the CAAC-OS, the pellets 1100 are arranged in accordance with a surface shape of the substrate 1120 that is the film formation surface even when the film formation surface has unevenness besides a flat surface. For example, in the case where the surface of the substrate 1120 is flat at the atomic level, the pellets 1100 are arranged so that flat planes parallel to the a-b plane face downwards; thus, a layer with a uniform thickness, flatness, and high crystallinity is formed. By stacking n layers (n is a natural number), the CAAC-OS can be obtained (see FIG. 40B).

Figure 40C:
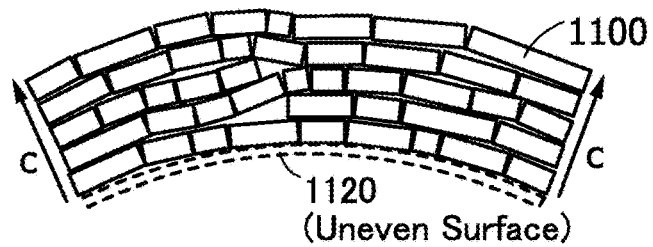

In the case where the top surface of the substrate 1120 has unevenness, a CAAC-OS where n layers (n is a natural number) in each of which the pellets 1100 are arranged along a convex surface are stacked is formed. Since the substrate 1120 has unevenness, a gap is easily generated between in the pellets 1100 in the CAAC-OS in some cases. Note that owing to intermolecular force, the pellets 1100 are arranged so that a gap between the pellets is as small as possible even on the unevenness surface. Therefore, even when the formation surface has unevenness, a CAAC-OS with high crystallinity can be formed (see FIG. 40C).

As a result, laser crystallization is not needed for formation of a CAAC-OS, and a uniform film can be formed even over a large-sized glass substrate.

Since the CAAC-OS film is deposited in accordance with such a model, the sputtered particle preferably has a pellet shape with a small thickness. Note that in the case where the sputtered particle has a dice shape with a large thickness, planes facing the substrate 1120 are not uniform and thus, the thickness and the orientation of the crystals cannot be uniform in some cases.

According to the deposition model described above, a CAAC-OS with high crystallinity can be formed even on a film formation surface with an amorphous structure.

Further, formation of a CAAC-OS can be described with a deposition model including a zinc oxide particle besides the pellet 1100.

The zinc oxide particle reaches the substrate 1120 before the pellet 1100 does because the zinc oxide particle is smaller than the pellet 1100 in mass. On the surface of the substrate 1120, crystal growth of the zinc oxide particle preferentially occurs in the horizontal direction, so that a thin zinc oxide layer is formed. The zinc oxide layer has c-axis alignment. Note that c-axes of crystals in the zinc oxide layer are aligned in the direction parallel to a normal vector of the substrate 1120. The zinc oxide layer serves as a seed layer that makes a CAAC-OS grow and thus has a function of increasing crystallinity of the CAAC-OS. The thickness of the zinc oxide layer is greater than or equal to 0.1 nm and less than or equal to 5 nm, mostly greater than or equal to 1 nm and less than or equal to 3 nm. Since the zinc oxide layer is sufficiently thin, a grain boundary is hardly observed.

Thus, in order to deposit a CAAC-OS with high crystallinity, a target containing zinc at a proportion higher than that of the stoichiometric composition is preferably used.

Figure 41:
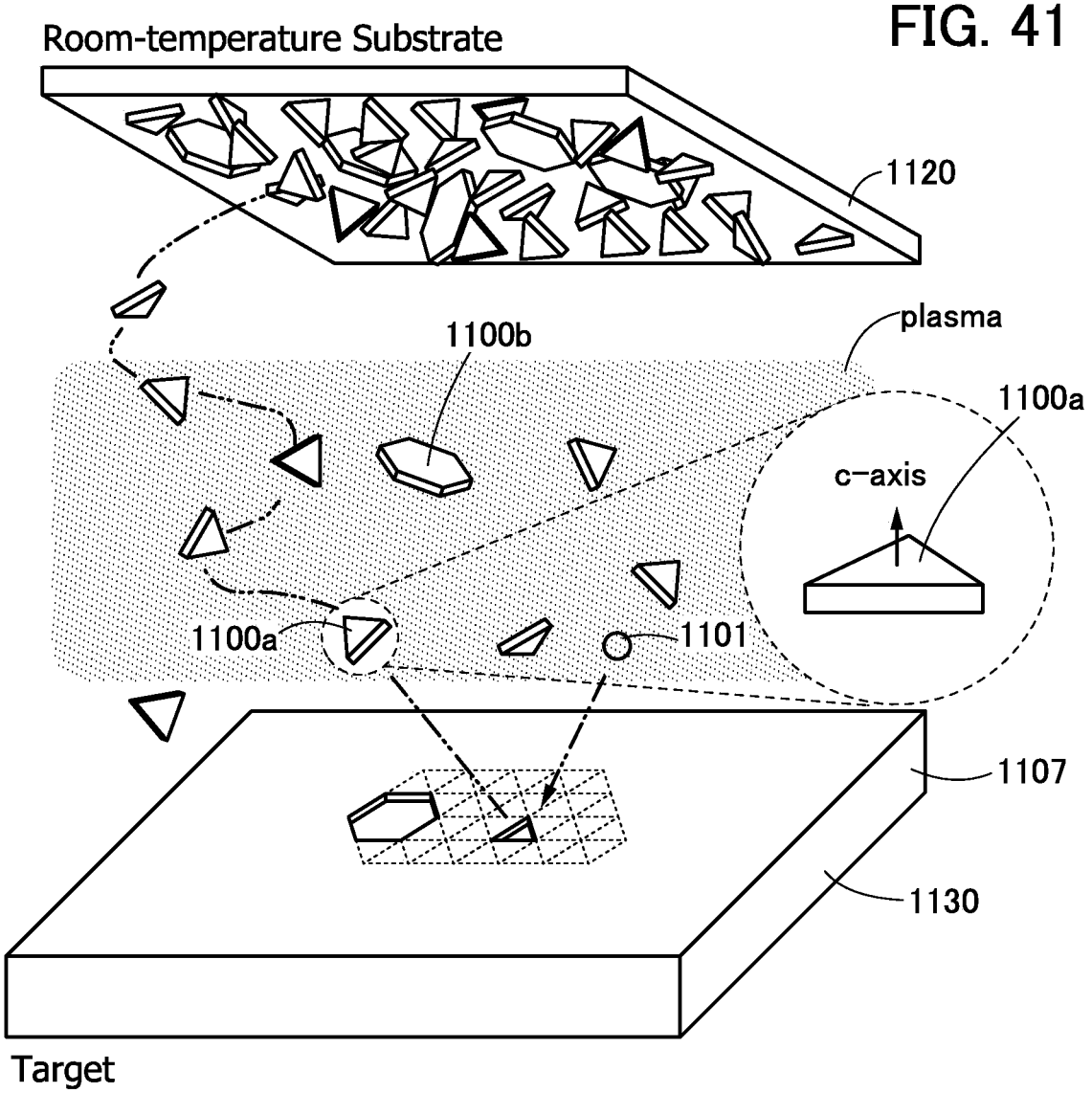
FIG. 41 is a schematic diagram illustrating an nc-OS deposition model and a pellet.

An nc-OS can be understood with a deposition model illustrated in FIG. 41. Note that a difference between FIG. 41 and FIG. 40A lies only in the fact that whether the substrate 1120 is heated or not.

Thus, the substrate 1120 is not heated, and a resistance such as friction between the pellet 1100 and the substrate 1120 is high. As a result, the pellets 1100 cannot glide on the surface of the substrate 1120 and are stacked randomly, thereby forming an nc-OS.

<Cleavage Plane>

A cleavage plane that has been mentioned in the deposition model of the CAAC-OS will be described below.

Figure 45A:
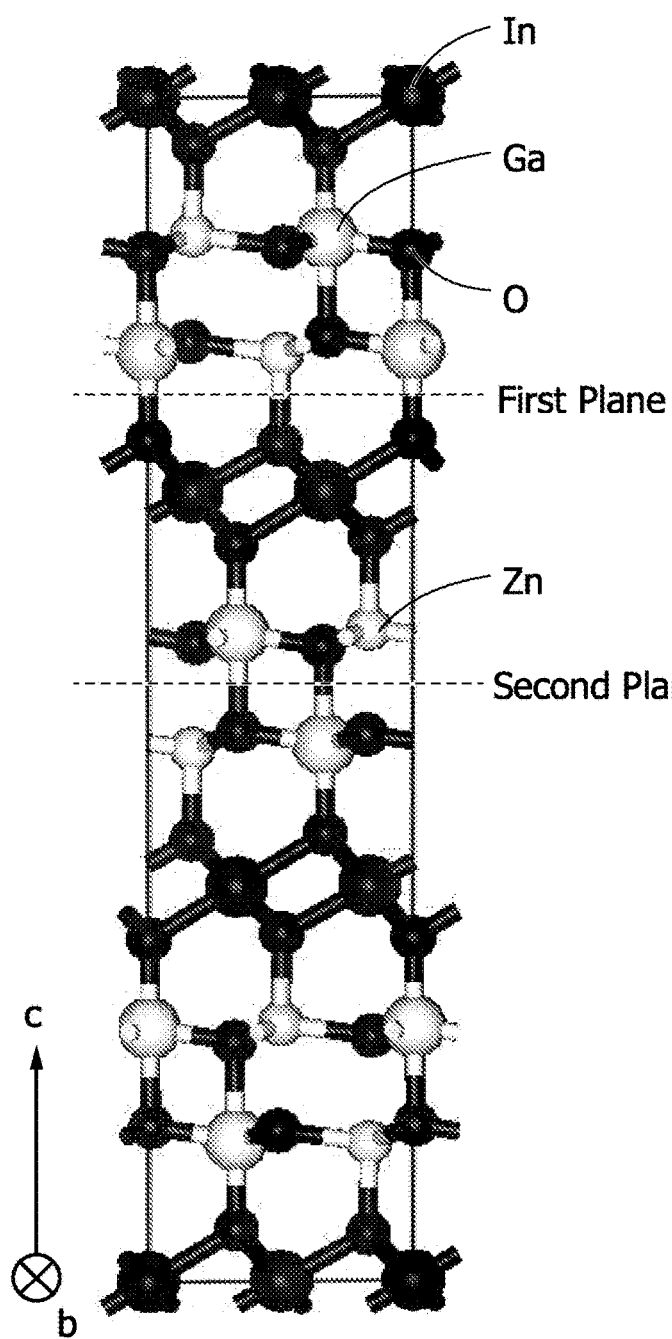
FIGS. 45A and 45B illustrate an $InGaZnO_4$ crystal.
Figure 45B:
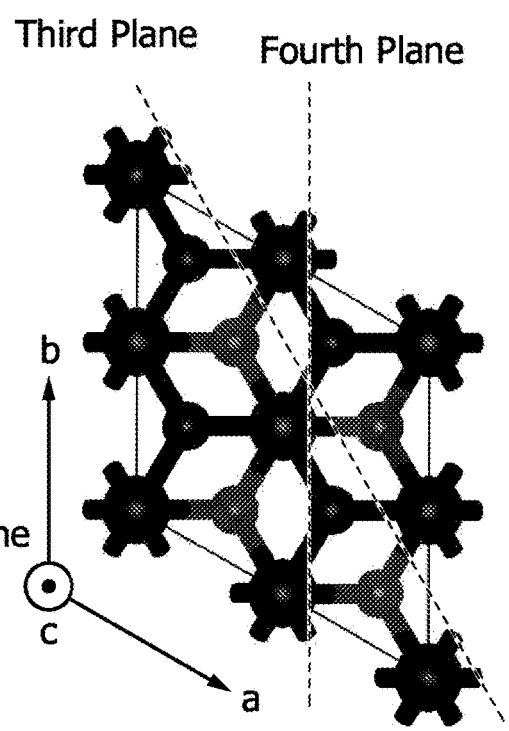

First, a cleavage plane of the target is described with reference to FIGS. 45A and 45B. FIGS. 45A and 45B show the crystal structure of InGaZnO$_4$. Note that FIG. 45A shows the structure of the case where an InGaZnO$_4$ crystal is observed from a direction parallel to the b-axis when the c-axis is in an upward direction. Furthermore, FIG. 45B shows the structure of the case where the InGaZnO$_4$ crystal is observed from a direction parallel to the c-axis.

Energy needed for cleavage at each of crystal planes of the InGaZnO$_4$ crystal is calculated by the first principles calculation. Note that a "pseudopotential" and density functional theory program (CASTEP) using the plane wave basis are used for the calculation. Note that an ultrasoft type pseudopotential is used as the pseudopotential. Further, GGA/PBE is used as the functional. Cut-off energy is 400 eV.

Energy of a structure in an initial state is obtained after structural optimization including a cell size is performed. Further, energy of a structure after the cleavage at each plane is obtained after structural optimization of atomic arrangement is performed in a state where the cell size is fixed.

On the basis of the structure of the InGaZnO$_4$ crystal in FIGS. 45A and 45B, a structure cleaved at any one of a first plane, a second plane, a third plane, and a fourth plane is formed and subjected to structural optimization calculation in which the cell size is fixed. Here, the first plane is a crystal plane between a Ga—Zn—O layer and an In—O layer and is parallel to the (001) plane (or the a-b plane) (see FIG. 45A). The second plane is a crystal plane between a Ga—Zn—O layer and a Ga—Zn—O layer and is parallel to the (001) plane (or the a-b plane) (see FIG. 45A). The third plane is a crystal plane parallel to the (110) plane (see FIG. 45B). The fourth plane is a crystal plane parallel to the (100) plane (or the b-c plane) (see FIG. 45B).

Under the above conditions, the energy of the structure at each plane after the cleavage is calculated. Next, a difference between the energy of the structure after the cleavage and the energy of the structure in the initial state is divided by the area of the cleavage plane; thus, cleavage energy which serves as a measure of easiness of cleavage at each plane is calculated. Note that the energy of a structure indicates energy obtained in such a manner that electronic kinetic energy of electrons included in the structure and interactions between atoms included in the structure, between the atom and the electron, and between the electrons are considered.

As calculation results, the cleavage energy of the first plane was 2.60 J/m$^2$, that of the second plane was 0.68 J/m$^2$, that of the third plane was 2.18 J/m$^2$, and that of the fourth plane was 2.12 J/m$^2$ (see Table 1).

TABLE 1

| | Cleavage energy [J/m$^2$] |
| --- | --- |
| First plane | 2.60 |
| Second plane | 0.68 |
| Third plane | 2.18 |
| Fourth Plane | 2.12 |

From the calculations, in the structure of the InGaZnO$_4$ crystal in FIGS. 45A and 45B, the cleavage energy of the second plane is the lowest. In other words, a plane between a Ga—Zn—O layer and a Ga—Zn—O layer is cleaved most easily (cleavage plane). Therefore, in this specification, the cleavage plane indicates the second plane, which is a plane where cleavage is performed most easily.

Since the cleavage plane is the second plane between the Ga—Zn—O layer and the Ga—Zn—O layer, the InGaZnO$_4$ crystals in FIG. 45A can be separated at a plane equivalent to two second planes. Therefore, in the case where an ion or the like is made to collide with a target, a wafer-like unit (we call this a pellet) which is cleaved at a plane with the lowest cleavage energy is thought to be blasted off as the minimum unit. In that case, a pellet of InGaZnO$_4$ includes three layers: a Ga—Zn—O layer, an In—O layer, and a Ga—Zn—O layer.

The cleavage energies of the third plane (crystal plane parallel to the (110) plane) and the fourth plane (crystal plane parallel to the (100) plane (or the b-c plane)) are lower than that of the first plane (crystal plane between the Ga—Zn—O layer and the In—O layer and plane that is parallel to the (001) plane (or the a-b plane)), which suggests that most of the flat planes of the pellets have triangle shapes or hexagonal shapes.

Figure 46A:
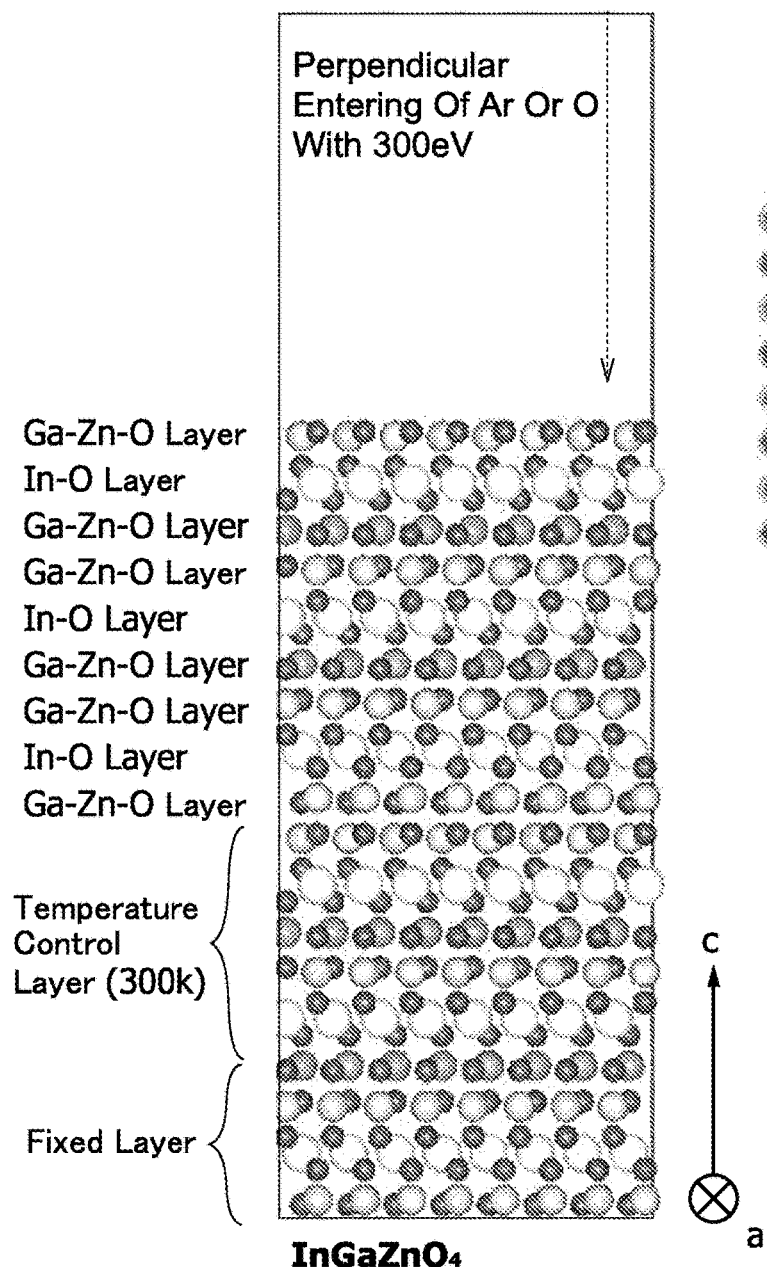
FIGS. 46A and 46B show a structure and the like of $InGaZnO_4$ before collision of an atom.
Figure 46B:
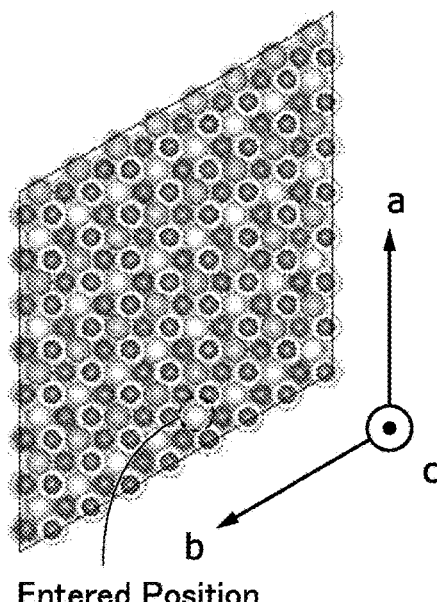

Next, through classical molecular dynamics calculation, on the assumption of an InGaZnO$_4$ crystal having a homologous structure as a target, a cleavage plane in the case where the target is sputtered using argon (Ar) or oxygen (O) is examined. FIG. 46A shows a cross-sectional structure of an InGaZnO$_4$ crystal (2688 atoms) used for the calculation, and FIG. 46B shows a top structure thereof. Note that a fixed layer in FIG. 46A prevents the positions of the atoms from moving. A temperature control layer in FIG. 46A is a layer whose temperature is constantly set to fixed temperature (300 K).

For the classical molecular dynamics calculation, Materials Explorer 5.0 manufactured by Fujitsu Limited. is used. Note that the initial temperature, the cell size, the time step size, and the number of steps are set to be 300 K, a certain size, 0.01 fs, and ten million, respectively. In calculation, an atom to which an energy of 300 eV is applied is made to enter a cell from a direction perpendicular to the a-b plane of the InGaZnO$_4$ crystal under the conditions.

Figure 47A:
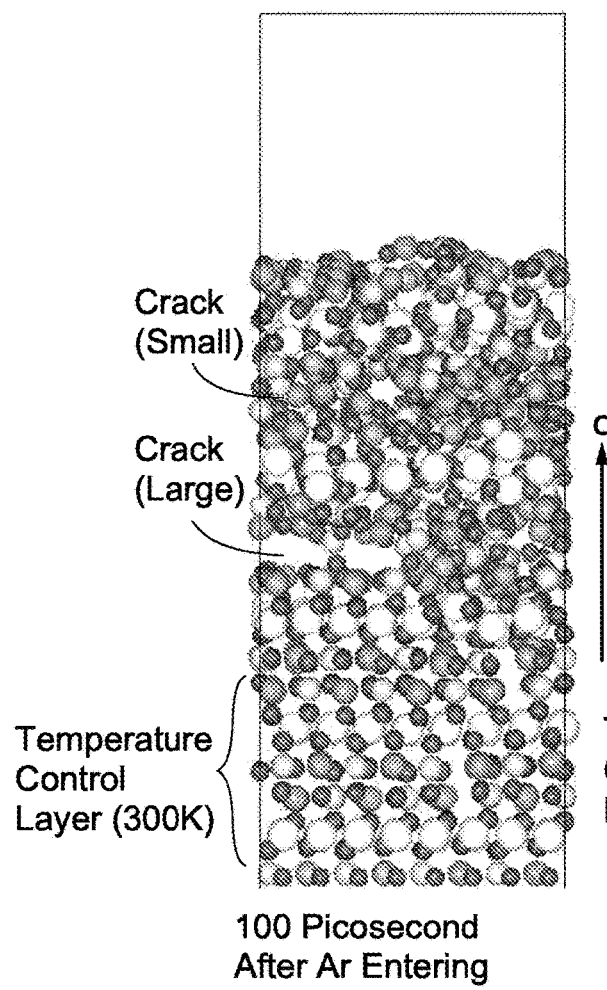
FIGS. 47A and 47B show a structure and the like of $InGaZnO_4$ after collision of an atom.
Figure 47B:
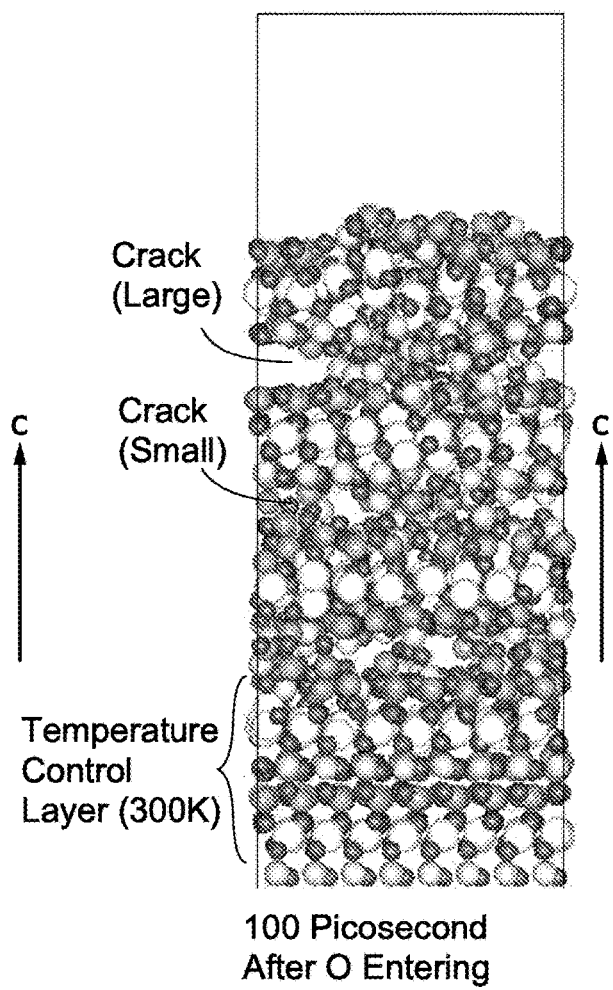

FIG. 47A shows atomic order when 99.9 picoseconds have passed after argon enters the cell including the InGaZnO$_4$ crystal in FIGS. 46A and 46B. FIG. 47B shows atomic order when 99.9 picoseconds have passed after oxygen enters the cell. Note that in FIGS. 47A and 47B, part of the fixed layer in FIG. 46A is omitted.

According to FIG. 47A, in a period from entry of argon into the cell to when 99.9 picoseconds have passed, a crack is formed from the cleavage plane corresponding to the second plane in FIG. 45A. Thus, in the case where argon collides with the InGaZnO$_4$ crystal and the uppermost surface is the second plane (the zero-th), a large crack is found to be formed in the second plane (the second).

On the other hand, according to FIG. 47B, in a period from entry of oxygen into the cell to when 99.9 picoseconds have passed, a crack is found to be formed from the cleavage plane corresponding to the second plane in FIG. 45A. Note that in the case where oxygen collides with the cell, a large crack is found to be formed in the second plane (the first) of the InGaZnO$_4$ crystal.

Accordingly, it is found that an atom (ion) collides with a target including an InGaZnO$_4$ crystal having a homologous structure from the upper surface of the target, the InGaZnO$_4$ crystal is cleaved along the second plane, and a flat-plate-like sputtered particle (pellet) is separated. It is also found that the pellet formed in the case where oxygen collides with the cell is smaller than that formed in the case where argon collides with the cell.

The above calculation suggests that the separated pellet includes a damaged region. In some cases, the damaged region included in the pellet can be repaired in such a manner that a defect caused by the damage reacts with oxygen.

Here, difference in size of the pellet depending on atoms which are made to collide is studied.

Figure 48A:
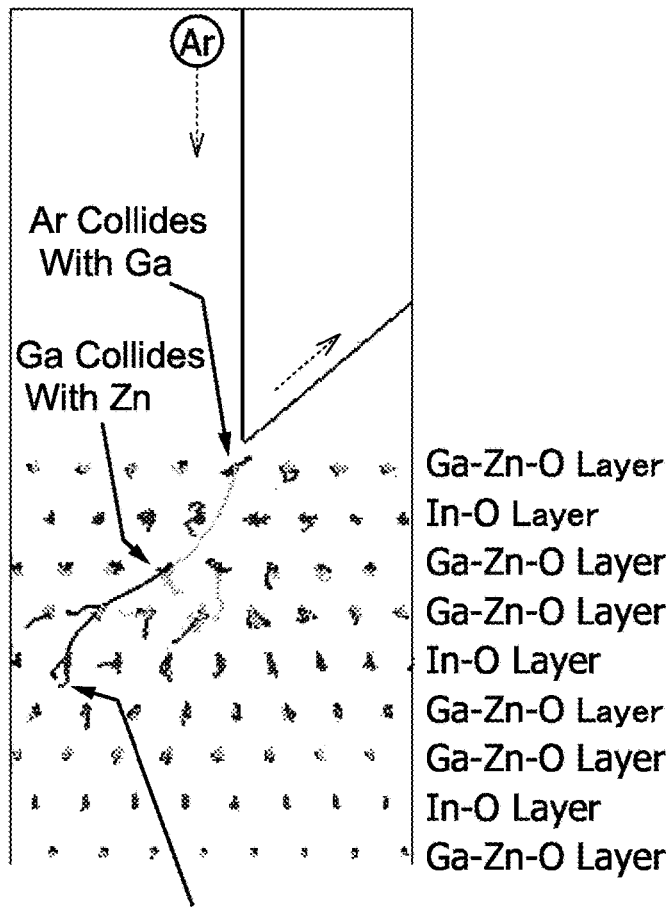
FIGS. 48A and 48B show trajectories of atoms after collision of atoms.

FIG. 48A shows trajectories of the atoms from 0 picosecond to 0.3 picoseconds after argon enters the cell including the InGaZnO$_4$ crystal in FIGS. 46A and 46B. Accordingly, FIG. 48A corresponds to a period from FIGS. 46A and 46B to FIG. 47A.

According to FIG. 48A, when argon collides with gallium (Ga) of the first layer (Ga—Zn—O layer), gallium collides with zinc (Zn) of the third layer (Ga—Zn—O layer) and then, zinc reaches the vicinity of the sixth layer (Ga—Zn—O layer). Note that the argon which collides with the gallium is sputtered to the outside. Accordingly, in the case where argon collides with the target including the InGaZnO$_4$ crystal, a crack is thought to be formed in the second plane (the second) in FIG. 46A.

Figure 48B:
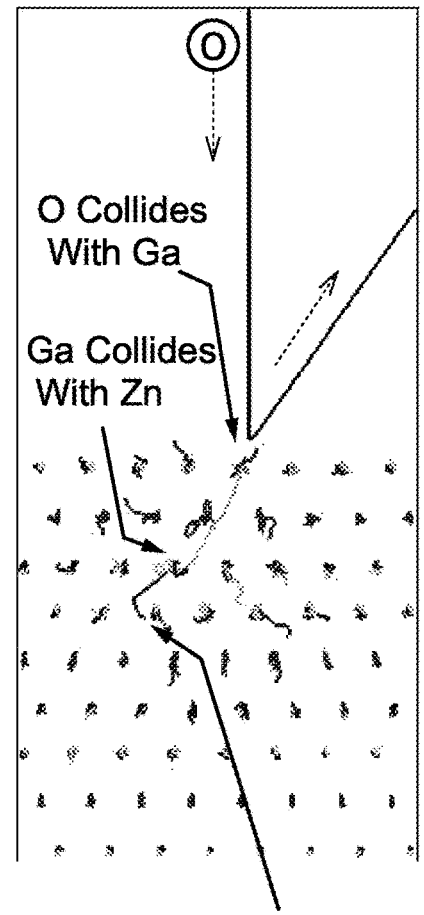

FIG. 48B shows trajectories of the atoms from 0 picosecond to 0.3 picoseconds after oxygen enters the cell including the InGaZnO$_4$ crystal in FIGS. 46A and 46B. Accordingly, FIG. 48B corresponds to a period from FIGS. 46A and 46B to FIG. 47A.

On the other hand, according to FIG. 48B, when oxygen collides with gallium (Ga) of the first layer (Ga—Zn—O layer), gallium collides with zinc (Zn) of the third layer (Ga—Zn—O layer) and then, zinc does not reach the fifth layer (In—O layer). Note that the oxygen which collides with the gallium is sputtered to the outside. Accordingly, in the case where oxygen collides with the target including the InGaZnO$_4$ crystal, a crack is thought to be formed in the second plane (the first) in FIG. 46A.

This calculation also shows that the InGaZnO$_4$ crystal with which an atom (ion) collides is separated from the cleavage plane.

In addition, a difference in depth of a crack is examined in view of conservation laws. The energy conservation law and the law of conservation of momentum can be represented by the following formula (1) and the following formula (2). Here, E represents energy of argon or oxygen before collision (300 eV), $m_A$ represents mass of argon or oxygen, $v_A$ represents the speed of argon or oxygen before collision, $V'_A$ represents the speed of argon or oxygen after collision, $m_{Ga}$ represents mass of gallium, $v_{Ga}$. represents the speed of gallium before collision, and $v'_{Ga}$ represents the speed of gallium after collision.

[Formula 1]
$$E = \frac{1}{2}m_A v_A^2 + \frac{1}{2}m_{Ga} v_{Ga}^2 \quad (1)$$

[Formula 2]
$$m_A v_A + m_{Ga} v_{Ga} = m_A v'_A + m_{Ga} v'_{Ga} \quad (2)$$

On the assumption that collision of argon or oxygen is elastic collision, the relationship among $v_A$, $V'_A$, $v_{Ga}$, and $V'_{Ga}$ can be represented by the following formula (3).

[Formula 3]
$$v'_A - v_{Ga} = -(v_A - v'_{Ga}) \quad (3)$$

From the formulae (1), (2), and (3), on the assumption that $v_{Ga}$ is 0, the speed of gallium $v'_{Ga}$ after collision of argon or oxygen can be represented by the following formula (4).

[Formula 4]

$$v'_{Ga} = \frac{\sqrt{m_A}}{m_A + m_{Ga}} \cdot 2\sqrt{2E} \quad (4)$$

In the formula (4), mass of argon or oxygen is substituted into $m_A$, whereby the speeds after collision of the atoms are compared. In the case where the argon and the oxygen have the same energy before collision, the speed of gallium in the case where argon collides with the gallium was found to be 1.24 times as high as that in the case where oxygen collides with the gallium. Thus, the energy of the gallium in the case where argon collides with the gallium is higher than that in the case where oxygen collides with the gallium by the square of the speed.

The speed (energy) of gallium after collision in the case where argon collides with the gallium is found to be higher than that in the case where oxygen collides with the gallium. Accordingly, it is considered that a crack is formed at a deeper position in the case where argon collides with the gallium than in the case where oxygen collides with the gallium.

The above calculation shows that when sputtering is performed using a target including the InGaZnO$_4$ crystal having a homologous structure, separation occurs from the cleavage plane to form a pellet. On the other hand, even when sputtering is performed on a region having another structure of a target without the cleavage plane, a pellet is not formed, and a sputtered particle with an atomic-level size which is minuter than a pellet is formed. Because the sputtered particle is smaller than the pellet, the sputtered particle is thought to be removed through a vacuum pump connected to a sputtering apparatus. Therefore, a model in which particles with a variety of sizes and shapes fly to a substrate and are deposited hardly applies to the case where sputtering is performed using a target including the InGaZnO$_4$ crystal having a homologous structure. The model illustrated in FIG. 40A where sputtered pellets are deposited to form a CAAC-OS is a reasonable model.

The CAAC-OS deposited in such a manner has a density substantially equal to that of a single crystal OS. For example, the density of the single crystal OS film having a homologous structure of InGaZnO$_4$ is 6.36 g/cm$^3$, and the density of the CAAC-OS film having substantially the same atomic ratio is approximately 6.3 g/cm$^3$.

Figure 49A:
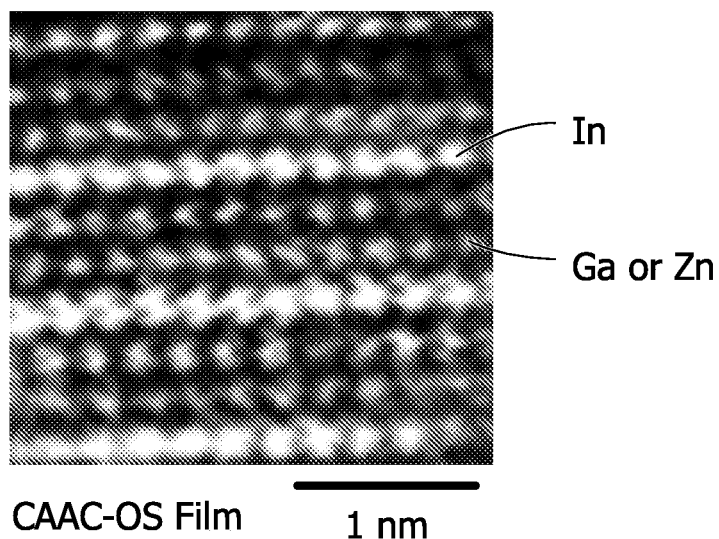
FIGS. 49A and 49B are cross-sectional HAADF-STEM images of a CAAC-OS and a target.
Figure 49B:
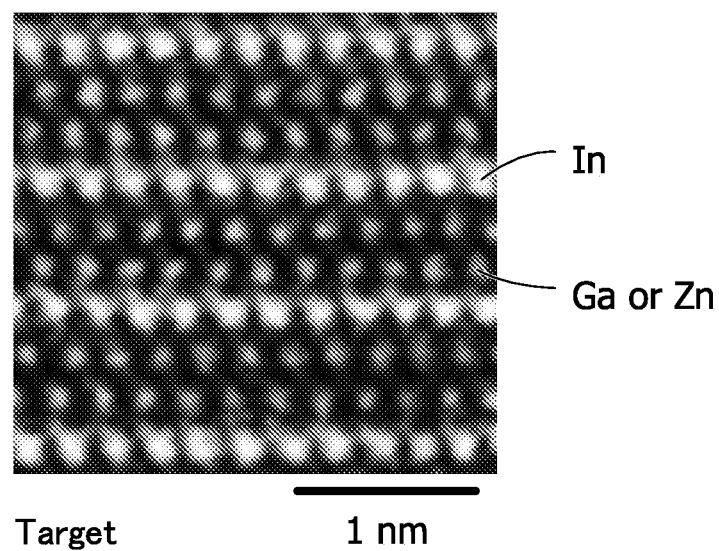

FIGS. 49A and 49B show atomic order of cross sections of an In—Ga—Zn oxide (see FIG. 49A) that is a CAAC-OS deposited by sputtering and a target thereof (see FIG. 49B). For observation of atomic arrangement, a high-angle annular dark field scanning transmission electron microscopy (HAADF-STEM) is used. In the case of observation by HAADF-STEM, the intensity of an image of each atom is proportional to the square of its atomic number. Therefore, Zn (atomic number: 30) and Ga (atomic number: 31), whose atomic numbers are close to each other, are hardly distinguished from each other. A Hitachi scanning transmission electron microscope HD-2700 is used for the HAADF-STEM.

When FIG. 49A and FIG. 49B are compared, it is found that the CAAC-OS and the target each have a homologous structure and atomic order in the CAAC-OS correspond to that in the target. Thus, as illustrated in the deposition model in FIG. 40A, the crystal structure of the target is transferred, whereby a CAAC-OS is formed.

The structure and method described in this embodiment can be implemented by being combined as appropriate with any of the other structures and methods described in the other embodiments.

Embodiment 3

In this embodiment, an oxygen vacancy of an oxide semiconductor film is described in detail below.

<(1) Ease of Formation and Stability of V$_o$H>

In the case where an oxide semiconductor film (hereinafter referred to as IGZO) is a complete crystal, H preferentially diffuses along the a-b plane at a room temperature. In heat treatment at 450° C., H diffuses along the a-b plane and in the c-axis direction. Here, description is made on whether H easily enters an oxygen vacancy V$_o$ if the oxygen vacancy V$_o$ exists in IGZO. A state in which H is in an oxygen vacancy V$_o$ is referred to as VoH.

Figure 20:
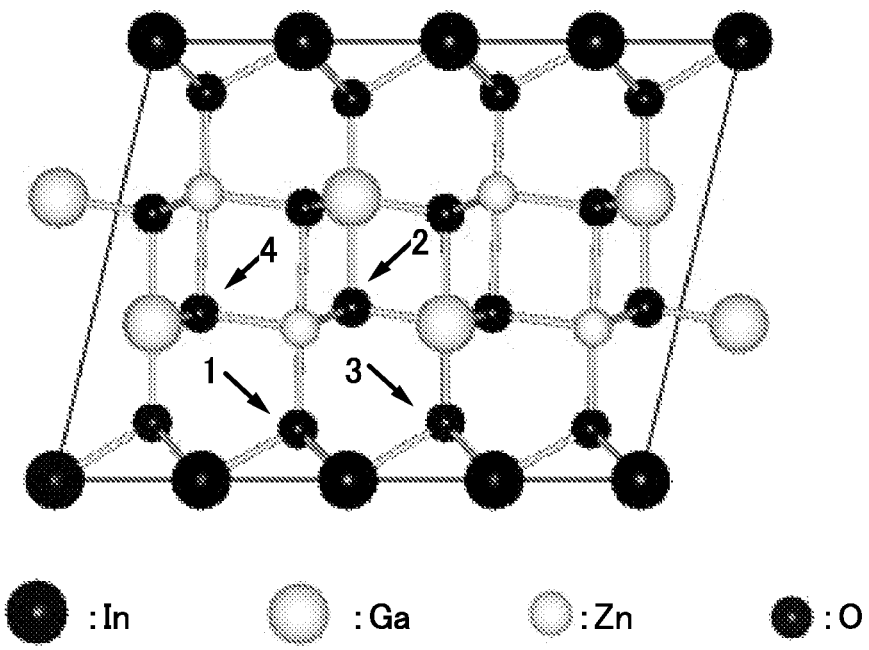
FIG. 20 shows a calculation model.

An InGaZnO$_4$ crystal model shown in FIG. 20 was used for calculation. The activation barrier (E$_a$) along the reaction path where H in V$_o$H is released from V$_o$ and bonded to oxygen was calculated by a nudged elastic band (NEB) method. The calculation conditions are shown in Table 2.

TABLE 2

| Software | VASP |
| --- | --- |
| Calculation method | NEB method |
| Functional | GGA-PBE |
| Pseudopotential | PAW |
| Cut-off energy | 500 eV |
| K points | 2 × 2 × 3 |

In the InGaZnO$_4$ crystal model, there are oxygen sites 1 to 4 as shown in FIG. 20 which differ from each other in metal elements bonded to oxygen and the number of bonded metal elements. Here, calculation was made on the oxygen sites 1 and 2 in which an oxygen vacancy V$_o$ is easily formed.

First, calculation was made on the oxygen site in which an oxygen vacancy V$_o$ is easily formed: an oxygen site 1 that was bonded to three In atoms and one Zn atom.

Figure 22:
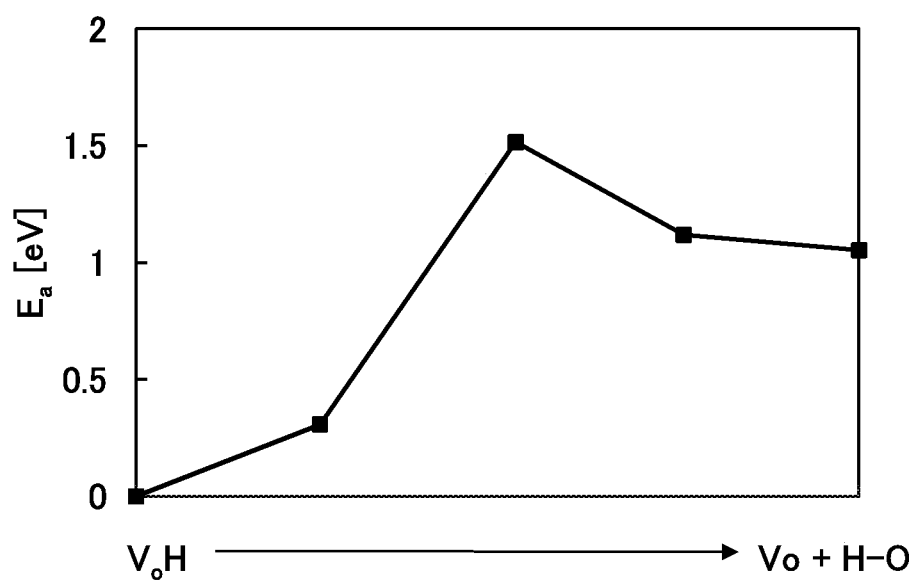
FIG. 22 shows an activation barrier.

FIG. 21A shows a model in the initial state and FIG. 21B shows a model in the final state. FIG. 22 shows the calculated activation barrier (E$_a$) in the initial state and the final state. Note that here, the initial state refers to a state in which H exists in an oxygen vacancy V$_o$ (V$_o$H), and the final state refers to a structure including an oxygen vacancy V$_o$ and a state in which H is bonded to oxygen bonded to one Ga atom and two Zn atoms (H—O).

From the calculation results, bonding of H in an oxygen vacancy V$_o$ to another oxygen atom needs an energy of approximately 1.52 eV, while entry of H bonded to O into an oxygen vacancy V$_o$ needs an energy of approximately 0.46 eV.

Reaction frequency (Γ) was calculated with use of the activation barriers (E$_a$) obtained by the calculation and Formula 5. In Formula 5, k$_B$ represents the Boltzmann constant and T represents the absolute temperature.

[Formula 5]

$$\Gamma = v \exp\left(-\frac{E_a}{k_B T}\right)$$

The reaction frequency at 350° C. was calculated on the assumption that the frequency factor v 10$^{13}$ [1/sec]. The frequency of H transfer from the model shown in FIG. 21A to the model shown in FIG. 21B was 5.52×10⁰ [1/sec], whereas the frequency of H transfer from the model shown in FIG. 21B to the model shown in FIG. 21A was 1.82×10⁹ [1/sec]. This suggests that H diffusing in IGZO is likely to form $V_oH$ if an oxygen vacancy $V_o$ exists in the neighborhood, and H is unlikely to be released from the oxygen vacancy $V_o$ once $V_oH$ is formed.

Next, calculation was made on the oxygen site in which an oxygen vacancy $V_o$ is easily formed: an oxygen site 2 that was bonded to one Ga atom and two Zn atoms.

Figure 24:
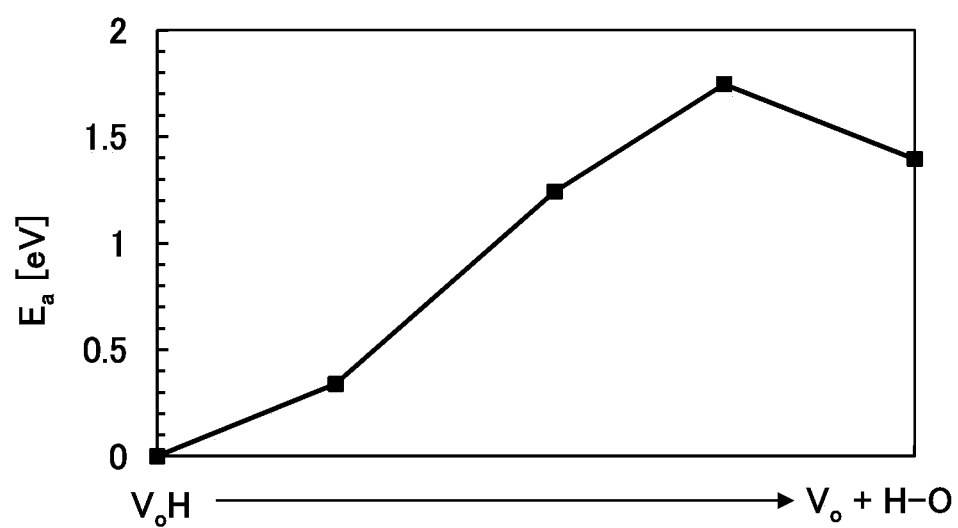
FIG. 24 shows an activation barrier.

FIG. 23A shows a model in the initial state and FIG. 23B shows a model in the final state. FIG. 24 shows the calculated activation barrier ($E_a$) in the initial state and the final state. Note that here, the initial state refers to a state in which H exists in an oxygen vacancy $V_o$ ($V_oH$), and the final state refers to a structure including an oxygen vacancy $V_o$ and a state in which H is bonded to oxygen bonded to one Ga atom and two Zn atoms (H—O).

From the calculation results, bonding of H in an oxygen vacancy $V_o$ to another oxygen atom needs an energy of approximately 1.75 eV, while entry of H bonded to O in an oxygen vacancy $V_a$ needs an energy of approximately 0.35 eV.

Reaction frequency (Γ) was calculated with use of the activation barriers ($E_a$) obtained by the calculation and Formula 5.

The reaction frequency at 350° C. was calculated on the assumption that the frequency factor v=10¹³ [1/sec]. The frequency of H transfer from the model shown in FIG. 23A to the model shown in FIG. 23B was 7.53×10⁻² [1/sec], whereas the frequency of H transfer from the model shown in FIG. 23B to the model shown in FIG. 23A was 1.44×10¹⁰ [1/sec]. This suggests that H is unlikely to be released from the oxygen vacancy $V_o$ once $V_oH$ is formed.

From the above results, it was found that H in IGZO easily diffused in annealing and if an oxygen vacancy $V_a$ existed, H was likely to enter the oxygen vacancy $V_o$ to be $V_oH$.

<(2) Transition Level of $V_oH$>

The calculation by the NEB method, which was described in <(1) Ease of formation and stability of $V_oH$>, indicates that in the case where an oxygen vacancy $V_o$ and H exist in IGZO, the oxygen vacancy $V_o$ and H easily form $V_oH$ and $V_oH$ is stable. To determine whether $V_oH$ is related to a carrier trap, the transition level of $V_oH$ was calculated.

The model used for calculation is an InGaZnO₄ crystal model (112 atoms). $V_oH$ models of the oxygen sites 1 and 2 shown in FIG. 20 were made to calculate the transition levels. The calculation conditions are shown in Table 3.

TABLE 3

| | |
|---|---|
| Software | VASP |
| Model | InGaZnO₄ crystal model (112 atoms) |
| Functional | HSE06 |
| Mixture ratio of exchange terms | 0.25 |
| Pseudopotential | GGA-PBE |
| Cut-off energy | 800 eV |
| K points | 1 × 1 × 1 |

The mixture ratio of exchange terms was adjusted to have a band gap close to the experimental value. As a result, the band gap of the InGaZnO₄ crystal model without defects was 3.08 eV that is close to the experimental value, 3.15 eV.

The transition level (ε(q/q')) of a model having defect D can be calculated by the following Formula 6. Note that ΔE(D^q) represents the formation energy of defect D at charge q, which is calculated by Formula 7.

[Formula 6]
$$\varepsilon(q/q') = \frac{\Delta E(D^q) - \Delta E(D^{q'})}{q' - q}$$

[Formula 7]
$$\Delta E(D^q) = E_{tot}(D^q) - E_{tot}(\text{bulk}) + \sum_i \Delta n_i \mu_i + q(\varepsilon_{VBM} + \Delta V_q + E_F)$$

In Formulae 6 and 7, $E_{tot}(D^q)$ represents the total energy of the model having defect D at the charge q, $E_{tot}$(bulk) represents the total energy in a model without defects (complete crystal), $\Delta n_i$ represents a change in the number of atoms i contributing to defects, μ represents the chemical potential of atom i, $\varepsilon V_q$ represents the energy of the valence band maximum in the model without defects, $\Delta V_q$ represents the correction term relating to the electrostatic potential, and $E_F$ represents the Fermi energy.

Figure 25:
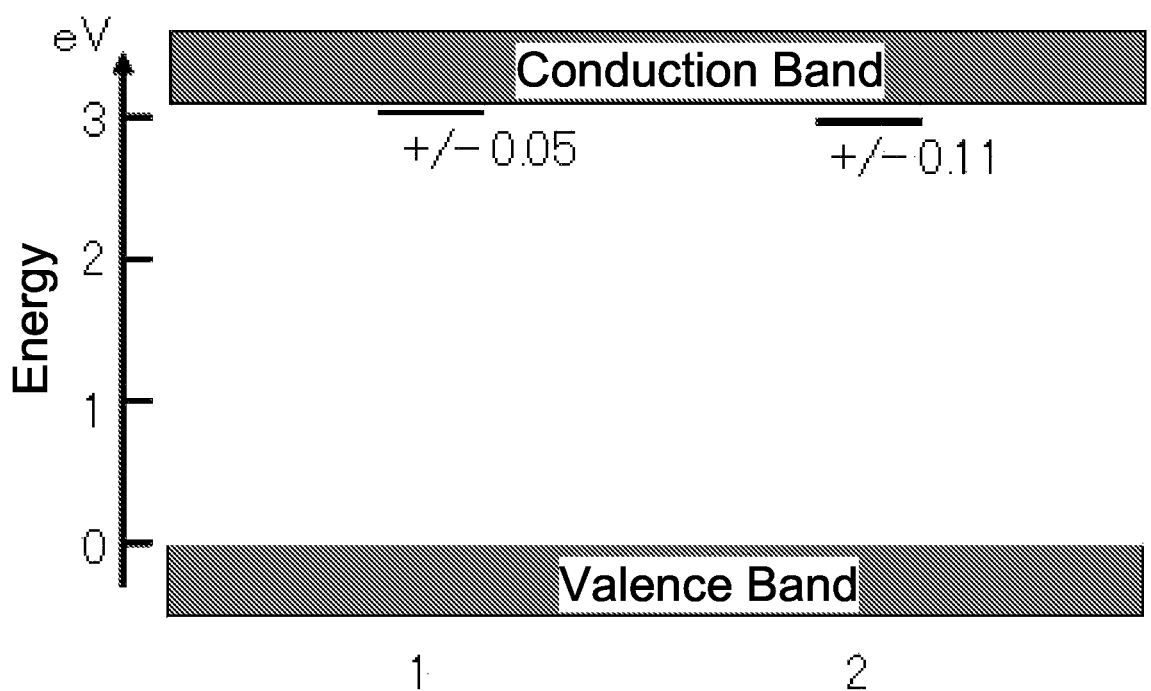
FIG. 25 shows the transition levels of VoH.

FIG. 25 shows the transition levels of $V_oH$ obtained from the above formulae. The numbers in FIG. 25 represent the depth from the conduction band minimum. In FIG. 25, the transition level of $V_oH$ in the oxygen site 1 is at 0.05 eV from the conduction band minimum, and the transition level of $V_oH$ in the oxygen site 2 is at 0.11 eV from the conduction band minimum. Therefore, these $V_oH$ would be related to electron traps, that is, $V_oH$ was found to behave as a donor. It was also found that IGZO including $V_oH$ had conductivity.

The structure described in this embodiment can be used in appropriate combination with any of the structures described in the other embodiments.

Embodiment 4

In this embodiment, an example of a display device that includes any of the transistors and the capacitors described in the embodiment above is described below with reference to FIG. 26, FIG. 27, and FIG. 28.

Figure 26:
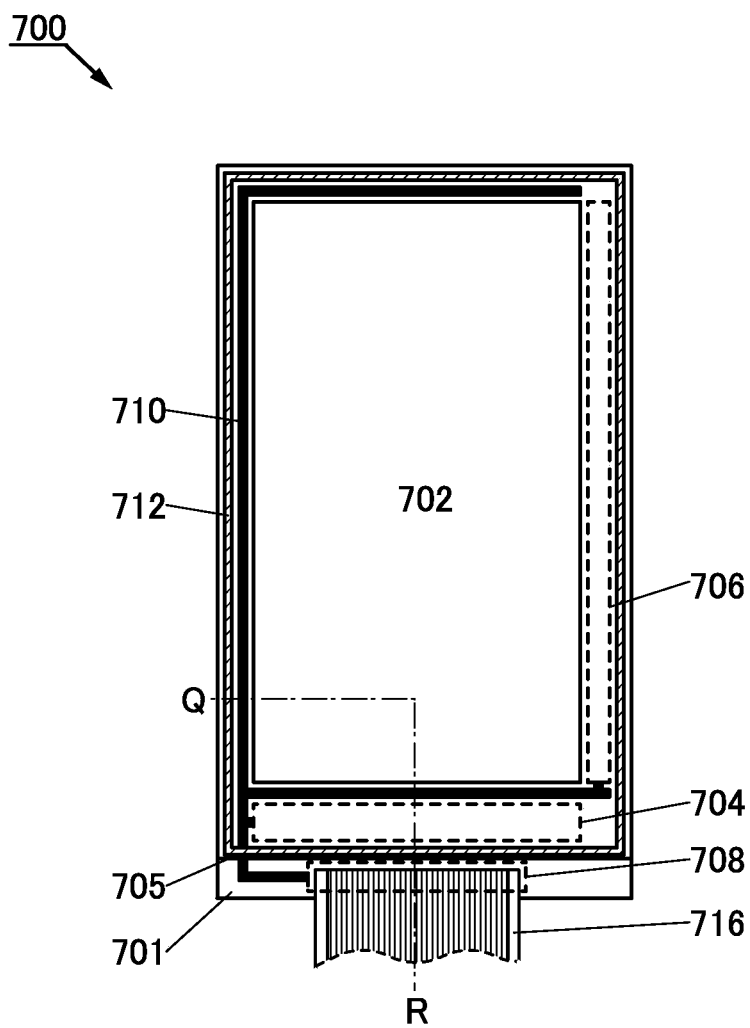
FIG. 26 is a top view illustrating one embodiment of a display device.

FIG. 26 is a top view of an example of a display device. A display device 700 illustrated in FIG. 26 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 26, a display element is provided between the first substrate 701 and the second substrate 705.

In the display device 700, a flexible printed circuit (FPC) terminal portion 708 electrically connected to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used. In the pixel portion 702, any of the transistors and capacitors that are the semiconductor devices of embodiments of the present invention can be used.

The display device 700 can include any of a variety of elements. Examples of the element include a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by electrical or magnetic effect may be included. Note that examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Further, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared to the case of using the coloring layer in some cases.

In this embodiment, a structure including a liquid crystal element and an EL element as display elements is described with reference to FIG. 27 and FIG. 28. Note that FIG. 27 is a cross-sectional view along the dashed-dotted line Q-R shown in FIG. 26 and shows a structure including a liquid crystal element as a display element, whereas FIG. 28 is a cross-sectional view along the dashed-dotted line Q-R shown in FIG. 26 and shows a structure including an EL element as a display element.

Figure 27:
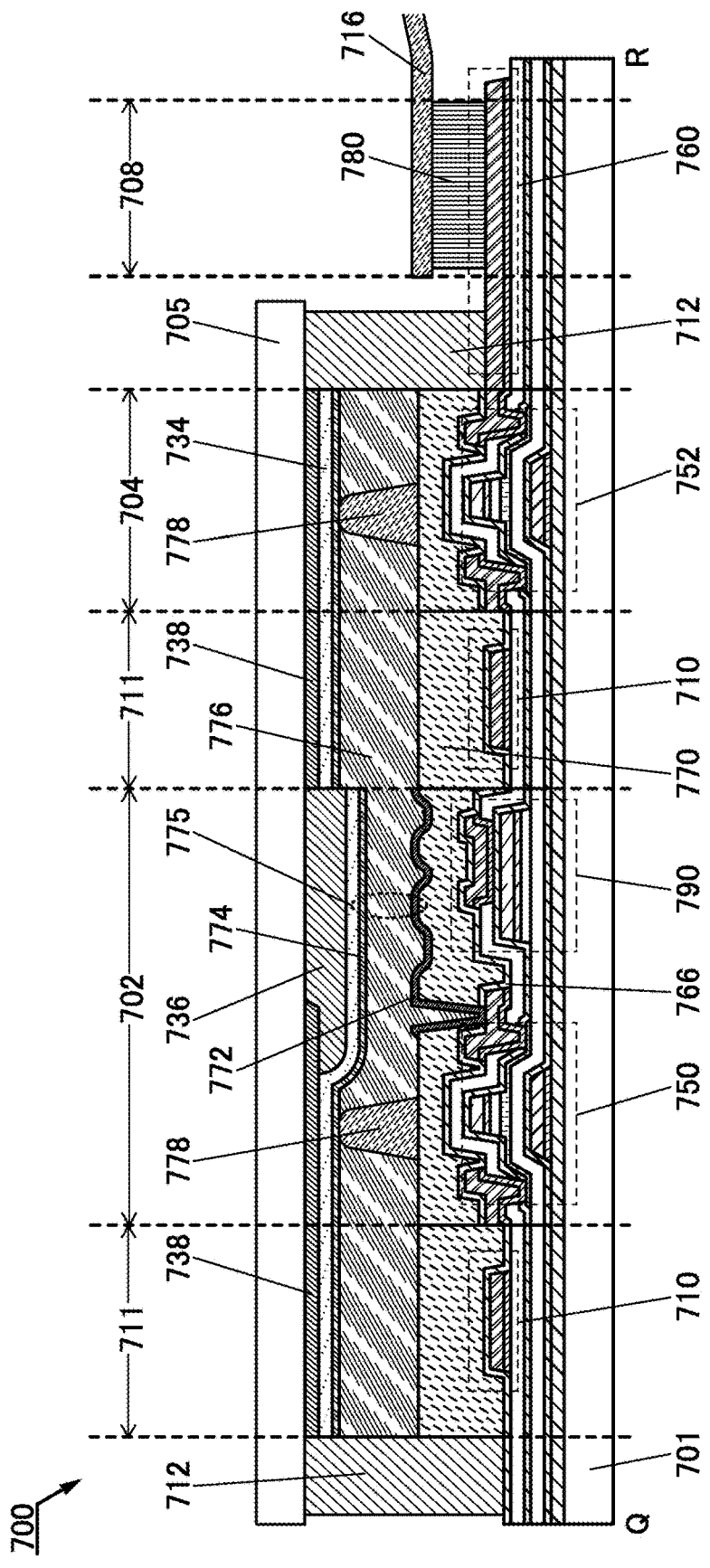
FIG. 27 is a cross-sectional view illustrating one embodiment of a display device.
Figure 28:
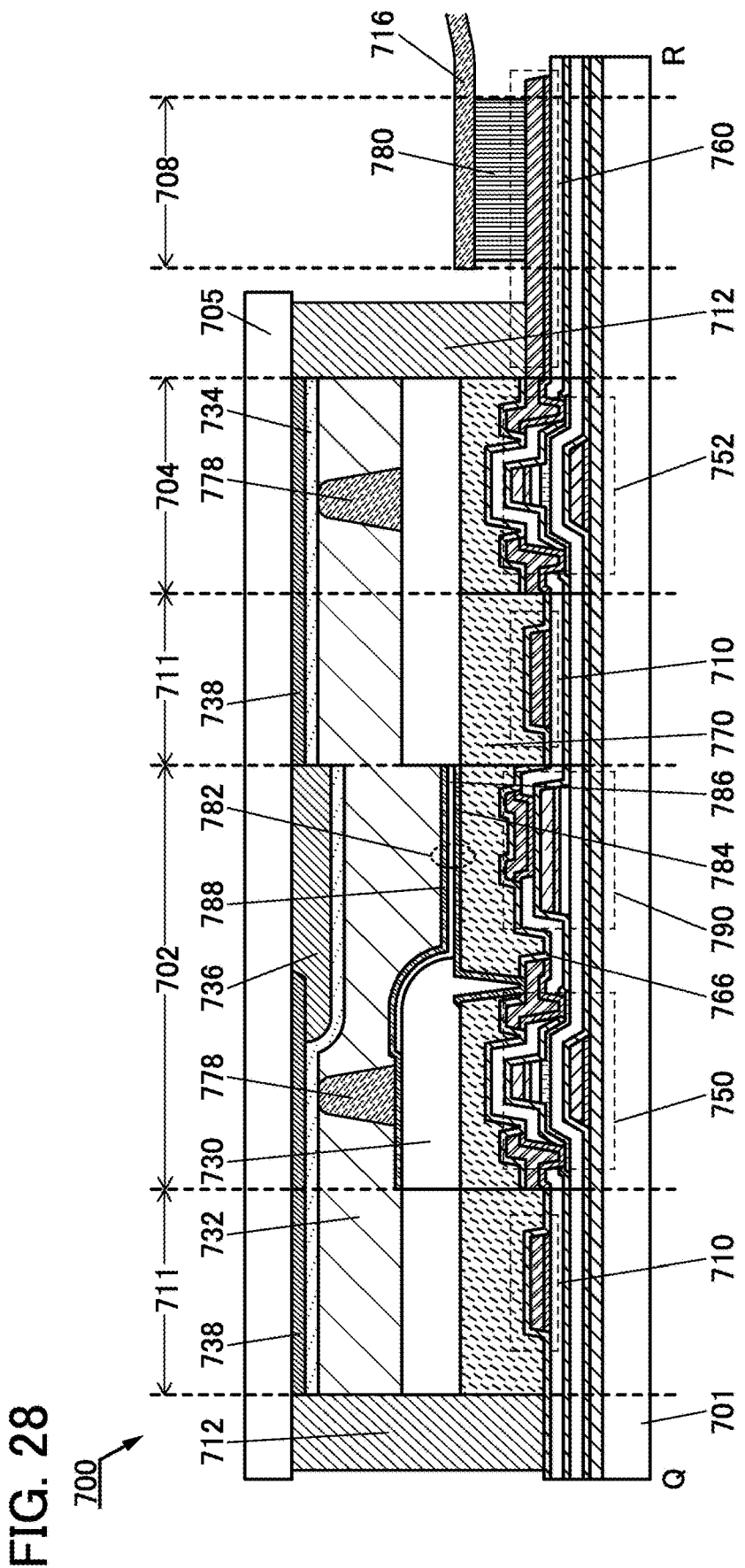
FIG. 28 is a cross-sectional view illustrating one embodiment of a display device.

Common portions between FIG. 27 and FIG. 28 are described first, and then different portions are described.
<Common Portions in Display Devices>

The display device 700 illustrated in FIG. 27 and FIG. 28 includes a lead wiring portion 711, the pixel portion 702, the source driver circuit portion 704, and the FPC terminal portion 708. Note that the lead wiring portion 711 includes a signal line 710. The pixel portion 702 includes a transistor 750 and a capacitor 790. The source driver circuit portion 704 includes a transistor 752.

The transistor 750 and the transistor 752 each have a structure similar to that of the transistor 100A described above. Note that the transistor 750 and the transistor 752 may each have a structure of the other transistors described in any of the above embodiments.

The transistors used in this embodiment each include an oxide semiconductor film which is highly purified and in which formation of oxygen vacancies is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, by which the number of components of the semiconductor device can be reduced. In addition, the transistor which can operate at high speed can be used also in the pixel portion, whereby a high-quality image can be provided.

The capacitor 790 has a structure similar to that of the capacitor 150A described above.

In FIG. 27 and FIG. 28, an insulating film 766 and a planarization insulating film 770 are provided over the transistor 750, the transistor 752, and the capacitor 790.

The insulating film 766 can be formed using materials and methods similar to that of the insulating film 128 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same process as conductive films functioning as a source electrode and a drain electrode of the transistor 750 or 752. Note that the signal line 710 may be formed using a conductive film which is formed in a different process from as a source electrode and a drain electrode of the transistor 750 or 752, e.g., a conductive film functioning as a first gate electrode or a conductive film functioning as a second gate electrode may be used. In the case where the signal line 710 is formed using a material containing a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same process as conductive films functioning as a source electrode and a drain electrode of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure 778 is provided between the first substrate 701 and the second substrate 705. The structure 778 is a columnar spacer obtained by selective etching of an insulating film and is provided to control the thickness (cell gap) between the first substrate 701 and the second substrate 705. Alternatively, a spherical spacer may be used as the structure 778.

Furthermore, a light-blocking film 738 functioning as a black matrix, a coloring film 736 functioning as a color filter, and an insulating film 734 in contact with the light-blocking film 738 and the coloring film 736 are provided on the second substrate 705 side.

<Structure Example of Display Device Using Liquid Crystal Element as Display Element>

The display device 700 illustrated in FIG. 27 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 27 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive films functioning as a source electrode and a drain electrode included in the transistor 750. The conductive film 772 is formed over the planarization insulating film 770 to function as a pixel electrode, i.e., one electrode of the display element. The conductive film 772 has a function of a reflective electrode. The display device 700 in FIG. 27 is what is called a reflective color liquid crystal display device in which external light is reflected by the conductive film 772 to display an image through the coloring film 736.

A conductive film that transmits visible light or a conductive film that reflects visible light can be used for the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used for the conductive film 772.

Note that projections and depressions are provided in part of the planarization insulating film 770 of the pixel portion 702 in the display device 700 in FIG. 27. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 illustrated in FIG. 27 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 27, an alignment film may be provided on a side of the conductive film 772 in contact with the liquid crystal layer 776 and on a side of the conductive film 774 in contact with the liquid crystal layer 776. Although not illustrated in FIG. 27, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time. The liquid crystal composition which includes a liquid crystal exhibiting a blue phase and a chiral material is preferable because it has optical isotropy, which makes the alignment process unneeded, and has a small viewing angle dependence. An alignment film does not need to be provided and rubbing treatment is thus not necessary; accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 28 includes a light-emitting element 782. The light-emitting element 782 includes a conductive film 784, an EL layer 786, and a conductive film 788. The display device 700 shown in FIG. 28 is capable of displaying an image by light emission from the EL layer 786 included in the light-emitting element 782.

The conductive film 784 is connected to the conductive films functioning as a source electrode and a drain electrode included in the transistor 750. The conductive film 784 is formed over the planarization insulating film 770 to function as a pixel electrode, i.e., one electrode of the display element. A conductive film which transmits visible light or a conductive film which reflects visible light can be used for the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 shown in FIG. 28, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 shown in FIG. 28, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

Embodiment 5

In this embodiment, one embodiment of a light-emitting device using the semiconductor device of one embodiment of the present invention is described. Note that in this embodiment, a structure of a pixel portion of a light-emitting device is described with reference to FIGS. 29A and 29B.

Figure 29A:
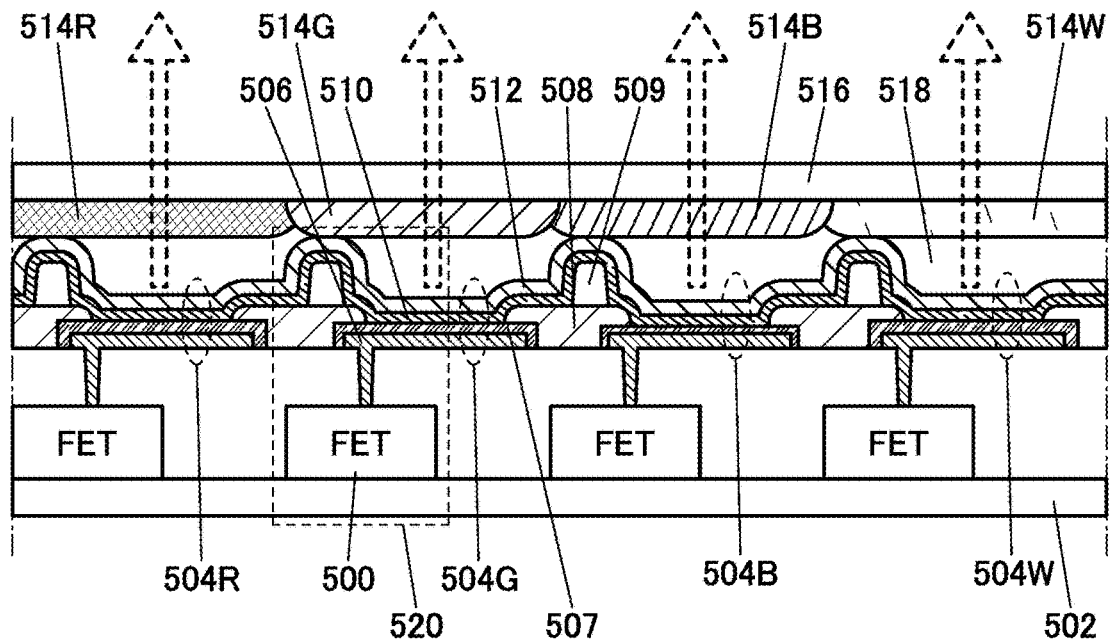
FIGS. 29A and 29B illustrate a structure of a pixel portion of a light-emitting device.

In FIG. 29A, a plurality of FETs 500 is formed over a first substrate 502, and each of the FETs 500 is electrically connected to a light-emitting element (504R, 504G, 504B, or 504W). Specifically, the FET 500 is electrically connected to a first conductive film 506 included in the light-emitting element. Note that the light-emitting elements (504R, 504G, 504B, and 504W) each include the first conductive film 506, a second conductive film 507, an EL layer 510, and a third conductive film 512.

Furthermore, coloring layers (514R, 514G, 514B, and 514W) are provided in positions facing the corresponding light-emitting elements (504R, 504G, 504B, and 504W). Note that the coloring layers (514R, 514G, 514B, and 514W) are provided in contact with a second substrate 516. Furthermore, a sealing film 518 is provided between the first substrate 502 and the second substrate 516. For example, a glass material such as a glass frit, or a resin that is curable at room temperature such as a two-component type resin, a light curable resin, a heat-curable resin, and the like can be used for the sealing film 518.

A partition wall 508 is provided so as to cover end portions of adjacent stacks of the first conductive film 506 and the second conductive film 507. A structure 509 is provided over the partition wall 508. Note that the first conductive film 506 has a function as a reflective electrode and a function as an anode of the light-emitting element. The second conductive film 507 has a function of adjusting the optical path length of each light-emitting element. The EL layer 510 is formed over the second conductive film 507, and the third conductive film 512 is formed over the EL Layer 510. The third conductive film 512 has a function as a semi-transmissive and semi-reflective electrode and a function as a cathode of the light-emitting element. The structure 509 is provided between the light-emitting element and the coloring layer and has a function as a spacer.

The EL layer 510 can be shared by the light-emitting elements (504R, 504G, 504B, and 504W). Note that each of the light-emitting elements (504R, 504G, 504B, and 504W) has a micro optical resonator (or microcavity) structure which allows light emitted from the EL layer 510 to resonate by the first conductive film 506 and the third conductive film 512; thus, spectra of light with different wavelengths can be narrowed and extracted even when they include the same EL layer 510. Specifically, by adjusting the thickness of each of the second conductive films 507 provided under the EL layer 510 in the light-emitting element (504R, 504G, 504B, or 504W), a desired emission spectrum can be obtained from the EL layer 510, so that light emission with high color purity can be obtained. Therefore, the structure illustrated in FIG. 29A does not require a process of separately forming EL layers with different colors, and facilitates achieving high resolution.

The light-emitting device illustrated in FIG. 29A includes the coloring layer (the color filter). Therefore, by using the microcavity structure and the color filter in combination, light emission with higher color purity can be obtained. Specifically, the optical path length of the light-emitting element 504R is adjusted so that red light emission is provided; red light is emitted in the direction indicated by an arrow through the coloring layer 514R. Furthermore, the optical path length of the light-emitting element 504G is adjusted so that green light emission is provided; green light is emitted in the direction indicated by an arrow through the coloring layer 514G. Furthermore, the optical path length of the light-emitting element 504B is adjusted so that blue light emission is provided; blue light is emitted in the direction indicated by an arrow through the coloring layer 514B. Furthermore, the optical path length of the light-emitting element 504W is adjusted so that white light emission is provided; white light is emitted in the direction indicated by an arrow through the coloring layer 514W.

Note that a method for adjusting the optical path length of each light-emitting element is not limited thereto. For example, the optical path length may be adjusted by controlling the film thickness of the EL layer 510 in each light-emitting element.

The coloring layers (514R, 5140, and 514B) may have a function of transmitting light in a particular wavelength region. For example, a red (R) color filter for transmitting light in a red wavelength range, a green (G) color filter for transmitting light in a green wavelength range, a blue (B) color filter for transmitting light in a blue wavelength range, or the like can be used. The coloring layer 514W may be formed using an acrylic-based resin material which does not contain a pigment or the like. The coloring layers (514R, 514G, 514B, and 514W) can be formed using any of various materials by a printing method, an inkjet method, an etching method using a photolithography technique, or the like.

The first conductive film 506 can be formed using, for example, a metal film having high reflectivity (reflection factor of visible light is 40% to 100%, preferably 70% to 100%). The conductive film 506 can be formed using a single layer or a stacked layer using aluminum, silver, or an alloy containing such a metal material (e.g., an alloy of silver, palladium, and copper).

The second conductive film 507 can be formed using, for example, conductive metal oxide. As the conductive metal oxide, indium oxide, tin oxide, zinc oxide, indium tin oxide, indium zinc oxide, or any of these metal oxide materials in which silicon oxide or tungsten oxide is contained can be used. Providing the second conductive film 507 is preferable because the formation of an insulating film between the EL layer 510 to be formed later and the first conductive film 506 can be suppressed. Furthermore, conductive metal oxide which is used as the second conductive film 507 may be formed in layer lower than the first conductive film 506.

The third conductive film 512 is formed using a conductive material having reflectivity and a conductive material having a light-transmitting property, and visible light reflectivity of the film is preferably 20% to 80%, more preferably 40% to 70%. As the third conductive film 512, for example, silver, magnesium, an alloy of such a metal material, or the like is formed to be thin (e.g., 10 nm or less), and then, conductive metal oxide which can be used for the second conductive film 507 is formed.

The above-described light-emitting device has a structure in which light is extracted from the second substrate 516 side (a top emission structure), but may have a structure in which light is extracted from the first substrate 501 side where the FETs 500 are formed (a bottom emission structure) or a structure in which light is extracted from both the first substrate 501 side and the second substrate 516 side (a dual emission structure). In the case of the bottom emission structure, the coloring layers (514R, 514G, 514B, and 514W) may be formed under the first conductive film 506. Note that a light-transmitting substrate may be used for the substrate through which light is transmitted, and a light-transmitting substrate and a light-blocking substrate may be used for the substrate through which light is not transmitted.

In FIG. 29A, the structure in which the light-emitting elements emit light of red (R), green (G), blue (B), and white (W) is illustrated as an example. However, a structure is not limited thereto. For example, a structure in which the light-emitting elements emit light of red (R), green (G), and blue (B) may be used.

Figure 29B:
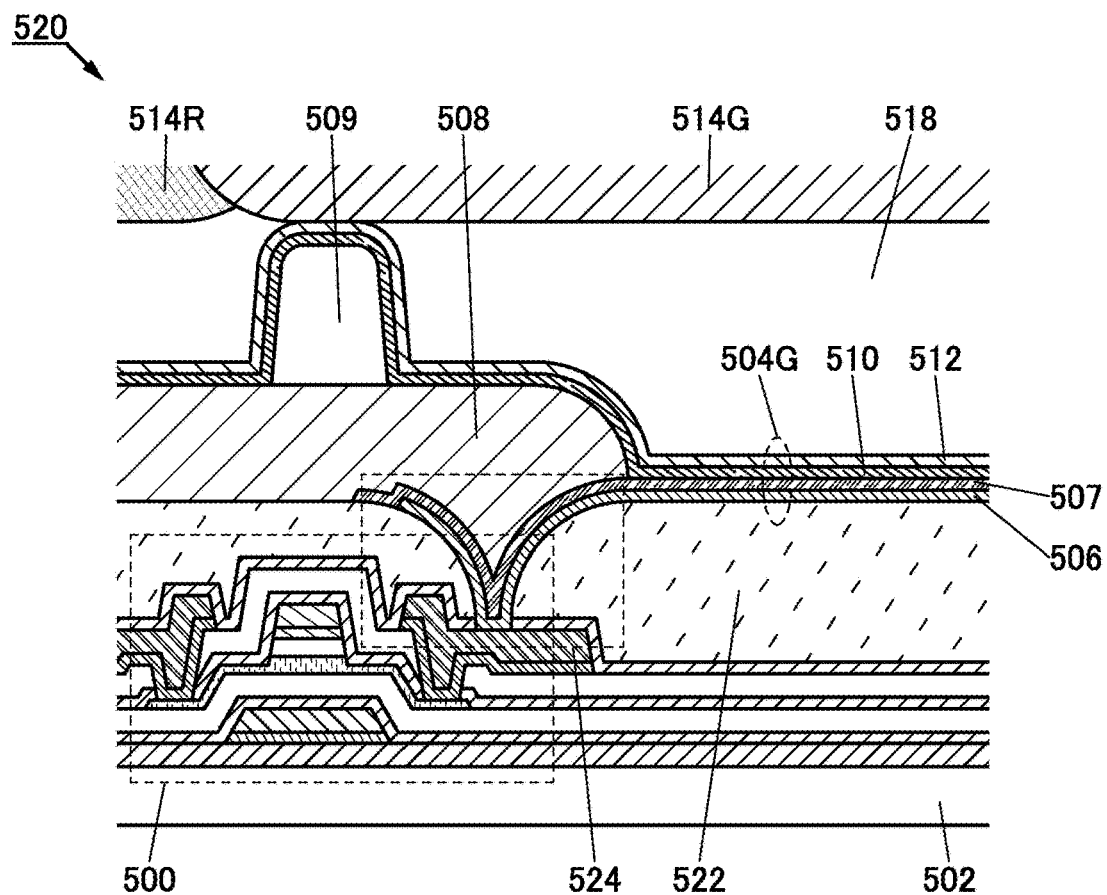

Here, a connection between the light-emitting element and the FET is described in detail using FIG. 29B. Note that FIG. 29B is an example of a structure of a region 520 surrounded by a dashed line shown in FIG. 29A.

In FIG. 29B, an insulating film 522 functioning as a planarization film is formed over the FET 500. Furthermore, an opening portion 524 reaching a conductive film functioning as a source electrode or a drain electrode of the FET 500 is formed in the insulating film 522. Furthermore, the first conductive film 506 connected to the conductive film functioning as a source electrode or a drain electrode of the FET 500 is formed over the insulating film 522. Furthermore, the second conductive film 507 is formed over the first conductive film 506.

The structure of the FET 500 is similar to the structure of the transistor 100A described in the above embodiment; therefore, description thereof is omitted.

The structure described in this embodiment can be used in appropriate combination with any of the structures described in the other embodiments.

Embodiment 6

In this embodiment, a configuration example of a display device of one embodiment of the present invention is described.

Configuration Example of Display Device

Figure 31A:
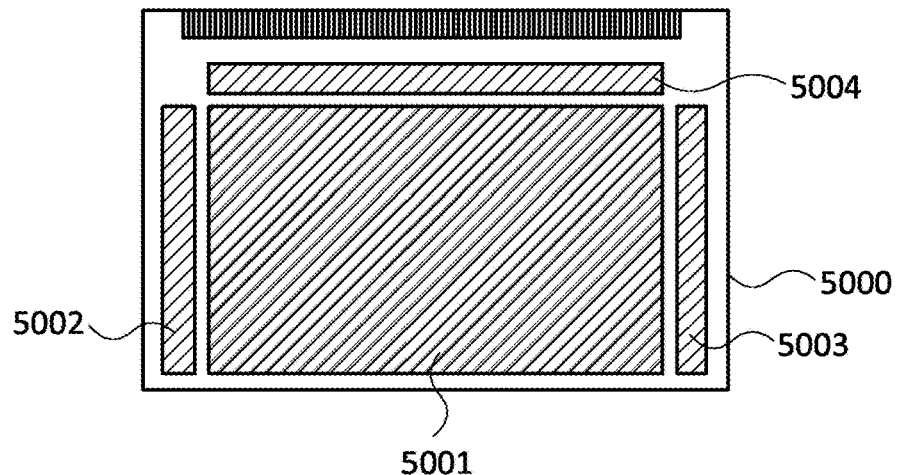
FIGS. 31A to 31C are a top view and circuit diagrams of a display device.
Figure 31B:
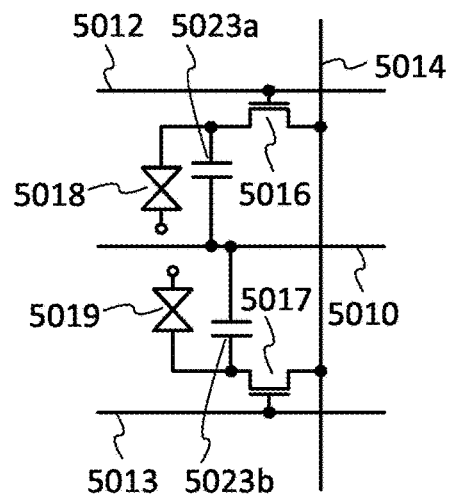
Figure 31C:
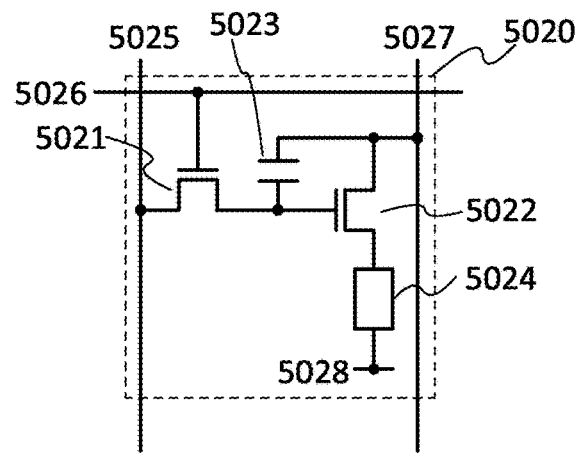

FIG. 31A is a top view of a display device of one embodiment of the present invention. FIG. 31B illustrates a pixel circuit where a liquid crystal element is used for a pixel of a display device of one embodiment of the present invention. FIG. 31C illustrates a pixel circuit where an organic EL element is used for a pixel of a display device of one embodiment of the present invention.

Any of the above-described transistors can be used as a transistor used for the pixel. Here, an example in which an n-channel transistor is used is shown. Note that a transistor manufactured through the same steps as the transistor used for the pixel may be used for a driver circuit. Any of the above-described capacitors can be used as a capacitor used for the pixel. Thus, by using any of the above-described transistors and capacitors for a pixel or a driver circuit, the display device can have high display quality and/or high reliability.

FIG. 31A illustrates an example of a top view of an active matrix display device. A pixel portion 5001, a first scan line driver circuit 5002, a second scan line driver circuit 5003, and a signal line driver circuit 5004 are provided over a substrate 5000 in the display device. The pixel portion 5001 is electrically connected to the signal line driver circuit 5004 through a plurality of signal lines and is electrically connected to the first scan line driver circuit 5002 and the second scan line driver circuit 5003 through a plurality of scan lines. Pixels including display elements are provided in respective regions divided by the scan lines and the signal lines. The substrate 5000 of the display device is electrically connected to a timing control circuit (also referred to as a controller or a control IC) through a connection portion such as an FPC.

The first scan line driver circuit 5002, the second scan line driver circuit 5003, and the signal line driver circuit 5004 are formed over the substrate 5000 where the pixel portion 5001 is formed. Therefore, a display device can be manufactured at cost lower than that in the case where a driver circuit is separately formed. Further, in the case where a driver circuit is separately formed, the number of wiring connections is increased. By providing the driver circuit over the substrate 5000, the number of wiring connections can be reduced. Accordingly, the reliability and/or yield can be improved.

<(1) Liquid Crystal Display Device>

FIG. 31B illustrates an example of a circuit configuration of the pixel. Here, a pixel circuit which is applicable to a pixel of a VA liquid crystal display device, or the like is illustrated.

This pixel circuit can be applied to a structure in which one pixel includes a plurality of pixel electrodes. The pixel electrodes are connected to different transistors, and the transistors can be driven with different gate signals. Accordingly, signals applied to individual pixel electrodes in a multi-domain pixel can be controlled independently.

A gate wiring 5012 of a transistor 5016 and a gate wiring 5013 of a transistor 5017 are separated so that different gate signals can be supplied thereto. In contrast, a source or drain electrode 5014 functioning as a data line is shared by the transistors 5016 and 5017. Any of the above-described transistors can be used as appropriate as each of the transistors 5016 and 5017. Any of the above-described capacitors can be used as appropriate as each of the capacitors 5023a and 5023b. Thus, the liquid crystal display device can have high display quality and/or high reliability.

A first pixel electrode is electrically connected to the transistor 5016 and a second pixel electrode is electrically connected to the transistor 5017. The first pixel electrode and the second pixel electrode are separated. A shape of the first pixel electrode and the second pixel electrode is not especially limited, for example, may be a V-like.

A gate electrode of the transistor 5016 is electrically connected to the gate wiring 5012, and a gate electrode of the transistor 5017 is electrically connected to the gate wiring 5013. When different gate signals are supplied to the gate wiring 5012 and the gate wiring 5013, operation timings of the transistor 5016 and the transistor 5017 can be varied. As a result, alignment of liquid crystals can be controlled.

Furthermore, a capacitor may be formed using a capacitor wiring 5010, an insulating film functioning as a dielectric, and a capacitor electrode electrically connected to the first pixel electrode or the second pixel electrode.

The multi-domain pixel includes a first liquid crystal element 5018 and a second liquid crystal element 5019. The first liquid crystal element 5018 includes the first pixel electrode, a counter electrode, and a liquid crystal layer therebetween. The second liquid crystal element 5019 includes the second pixel electrode, a counter electrode, and a liquid crystal layer therebetween.

Note that a pixel circuit in the display device of one embodiment of the present invention is not limited to that shown in FIG. 31B. For example, a switch, a resistor, a capacitor, a transistor, a sensor, a logic circuit, or the like may be added to the pixel illustrated in FIG. 31B.

<(2) Light-Emitting Device>

FIG. 31C illustrates another example of a circuit configuration of the pixel. Here, a pixel structure of a display device using a light-emitting element typified by an organic EL element (such a device is referred to as a light-emitting device) is described.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Based on such a mechanism, such a light-emitting element is referred to as a current-excitation type light-emitting element.

FIG. 31C illustrates an example of a pixel circuit. Here, an example in which two n-channel transistors and one capacitor are used in one pixel is illustrated. Note that any of the above-described transistors can be used as the n-channel transistors. Any of the above-described capacitors can be used as the capacitor. Furthermore, digital time grayscale driving can be employed for the pixel circuit.

The configuration of the applicable pixel circuit and operation of a pixel employing digital time grayscale driving will be described.

A pixel 5020 includes a switching transistor 5021, a driver transistor 5022, a light-emitting element 5024, and a capacitor 5023. A gate electrode of the switching transistor 5021 is connected to a scan line 5026, a first electrode (one of a source electrode and a drain electrode) of the switching transistor 5021 is connected to a signal line 5025, and a second electrode (the other of the source electrode and the drain electrode) of the switching transistor 5021 is connected to a gate electrode of the driver transistor 5022. The gate electrode of the driver transistor 5022 is connected to a power supply line 5027 through the capacitor 5023, a first electrode of the driver transistor 5022 is connected to the power supply line 5027, and a second electrode of the driver transistor 5022 is connected to a first electrode (a pixel electrode) of the light-emitting element 5024. A second electrode of the light-emitting element 5024 corresponds to a common electrode 5028. The common electrode 5028 is electrically connected to a common potential line provided over the same substrate.

As each of the switching transistor 5021 and the driver transistor 5022, any of the above-described transistors can be used. Any of the above-described capacitors can be used as the capacitor 5023. In this manner, an organic EL display device having high display quality and/or high reliability can be provided.

The potential of the second electrode (the common electrode 5028) of the light-emitting element 5024 is set to be a low power supply potential. Note that the low power supply potential is lower than a high power supply potential supplied to the power supply line 5027. For example, the low power supply potential can be GND, 0 V, or the like. The high power supply potential and the low power supply potential are set to be higher than or equal to the forward threshold voltage of the light-emitting element 5024, and the difference between the potentials is applied to the light-emitting element 5024, whereby current is supplied to the light-emitting element 5024, leading to light emission. The forward voltage of the light-emitting element 5024 refers to a voltage at which a desired luminance is obtained, and includes at least forward threshold voltage.

Note that gate capacitance of the driver transistor 5022 may be used as a substitute for the capacitor 5023 in some cases, so that the capacitor 5023 can be omitted. The gate capacitance of the driver transistor 5022 may be formed between the channel formation region and the gate electrode.

Next, a signal input to the driver transistor 5022 is described. In the case of a voltage-input voltage driving method, a video signal for turning on or off the driver transistor 5022 is input to the driver transistor 5022. In order for the driver transistor 5022 to operate in a linear region, voltage higher than the voltage of the power supply line 5027 is applied to the gate electrode of the driver transistor 5022. Note that voltage higher than or equal to voltage which is the sum of power supply line voltage and the threshold voltage Vth of the driver transistor 5022 is applied to the signal line 5025.

In the case of performing analog grayscale driving, a voltage higher than or equal to a voltage which is the sum of the forward voltage of the light-emitting element 5024 and the threshold voltage Vth of the driver transistor 5022 is applied to the gate electrode of the driver transistor 5022. A video signal by which the driver transistor 5022 is operated in a saturation region is input, so that current is supplied to the light-emitting element 5024. In order for the driver transistor 5022 to operate in a saturation region, the potential of the power supply line 5027 is set higher than the gate potential of the driver transistor 5022. When an analog video signal is used, it is possible to supply current to the light-emitting element 5024 in accordance with the video signal and perform analog grayscale driving.

Note that in the display device of one embodiment of the present invention, a pixel configuration is not limited to that shown in FIG. 31C. For example, a switch, a resistor, a capacitor, a sensor, a transistor, a logic circuit, or the like may be added to the pixel circuit shown in FIG. 31C.

Figure 32A:
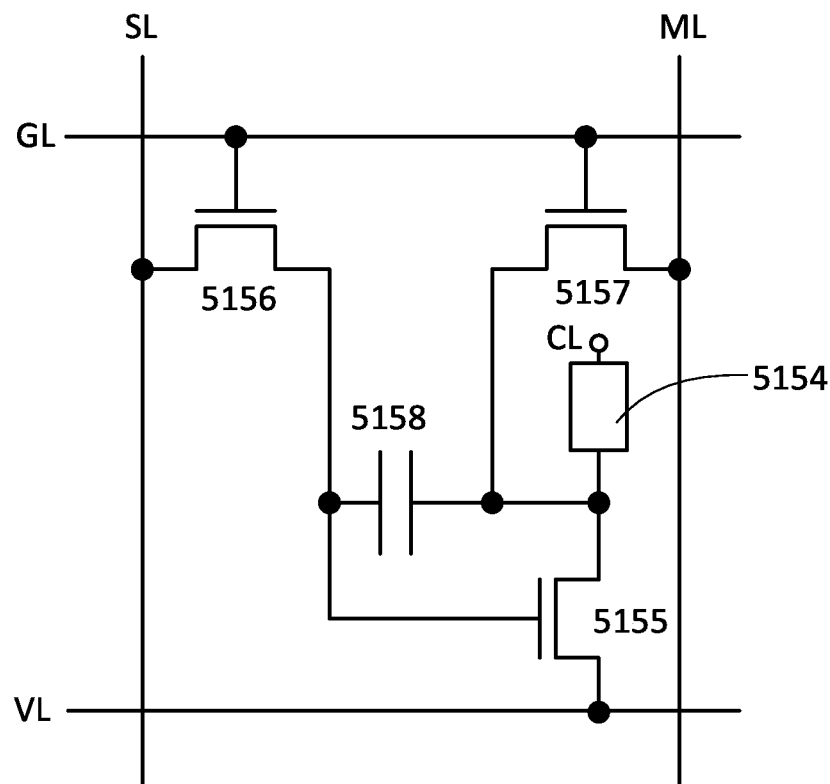
FIGS. 32A and 32B are a circuit diagram and a timing chart of a display device.

For example, FIG. 32A illustrates an applicable example of a pixel circuit. Here, an example in which three n-channel transistors and one capacitor are used in one pixel is illustrated.

FIG. 32A illustrates an example of a circuit diagram of a pixel 5111. The pixel 5111 includes a transistor 5155, a transistor 5156, a transistor 5157, a capacitor 5158, and a light-emitting element 5154.

The potential of a pixel electrode in the light-emitting element 5154 is controlled in accordance with an image signal Sig input to the pixel 5111. The luminance of the light-emitting element 5154 depends on a potential difference between the pixel electrode and the common electrode.

The transistor 5156 has a function of controlling electrical connection between a wiring SL and a gate of the transistor 5155. One of the source and the drain of the transistor 5155 is electrically connected to an anode of the light-emitting element 5154, and the other of the source and the drain is electrically connected to a wiring VL. The transistor 5157 has a function of controlling electrical connection between a wiring ML and the other of the source and the drain of the transistor 5155. One of a pair of electrodes of the capacitor 5158 is electrically connected to the gate of the transistor 5155, and the other is electrically connected to the anode of the light-emitting element 5154.

The switching of the transistor 5156 is performed in accordance with the potential of a wiring GL which is electrically connected to a gate of the transistor 5156. The switching of the transistor 5157 is performed in accordance with the potential of the wiring GL which is electrically connected to a gate of the transistor 5157.

Note that any of the above-described transistors can be used for at least one of the transistors 5155, 5156, and 5157. Furthermore, any of the above-described capacitors can be used for the capacitor 5158.

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope. Note that one embodiment of the present invention is not limited to these expressions which are just examples. Here, each of X, Y, Z1, and Z2 denotes an object (e.g., a device, an element, a circuit, a wiring, an electrode, a terminal, a conductive film, a layer, or the like).

Next, an operation example of the pixel 5111 illustrated in FIG. 32A is described.

Figure 32B:
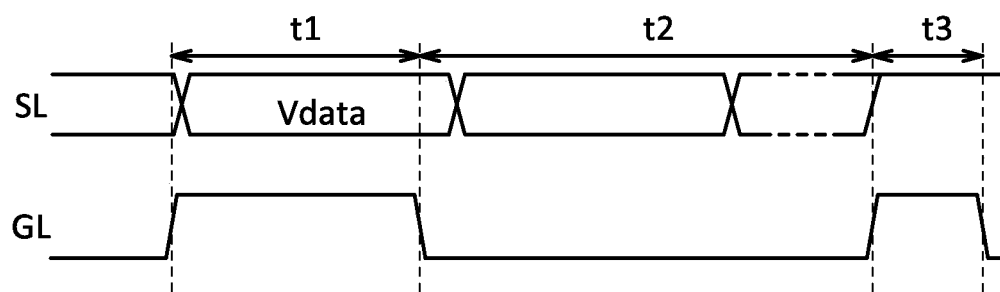

FIG. 32B shows an example of a timing chart of the potentials of the wiring GL electrically connected to the pixel 5111 in FIG. 32A and the potential of the image signal Sig supplied to the wiring SL. Note that in the timing chart in FIG. 32B, all the transistors included in the pixel 5111 in FIG. 32A are n-channel transistors.

First, in a period t1, a high-level potential is applied to the wiring GL. Accordingly, the transistor 5156 and the transistor 5157 are turned on. A potential Vdata of the image signal Sig is applied to the wiring SL, and the potential Vdata is applied to the gate of the transistor 5155 through the transistor 5156.

A potential Vano is applied to the wiring VL, and a potential Vcat is applied to the wiring CL. The potential Vano is preferably higher than the sum of the potential Vcat, the threshold voltage Vthe of the light-emitting element 5154, and the threshold voltage Vth of the transistor 5155. The above potential difference is provided between the wiring VL and the wiring CL, so that the value of the drain current of the transistor 5155 is determined by the potential Vdata. Then, the drain current is supplied to the light-emitting element 5154, whereby the Luminance of the light-emitting element 5154 is determined.

In the case where the transistor 5155 is an n-channel type, it is preferable that, in the period t1, the potential of the wiring ML be lower than the sum of the potential of the wiring CL and the threshold voltage Vthe of the light-emitting element 5154, and the potential of the wiring VL be higher than the sum of the potential of the wiring ML and the threshold voltage Vth of the transistor 5155. With the above configuration, the drain current of the transistor 5155 can be made to flow preferentially through the wiring ML instead of the light-emitting element 5154 even when the transistor 5157 is on.

Next, in a period t2, a low-level potential is applied to the wiring GL. Accordingly, the transistor 5156 and the transistor 5157 are turned off. When the transistor 5156 is off, the potential Vdata is held at the gate of the transistor 5155. A potential Vano is applied to the wiring VL, and a potential Vcat is applied to the wiring CL. Thus, the light-emitting element 5154 emits light in accordance with the luminance determined in the period t1.

Next, in a period t3, a high-level potential is applied to the wiring GL. Accordingly, the transistor 5156 and the transistor 5157 are turned on. In addition, such a potential that the gate voltage of the transistor 5155 is higher than the threshold voltage Vth thereof is applied to the wiring SL. The potential Vcat is applied to the wiring CL. Then, the potential of the wiring ML is lower than the sum of the potential of the wiring CL and the threshold voltage Vthe of the light-emitting element 5154, and the potential of the wiring VL is higher than the sum of the potential of the wiring ML and the threshold voltage Vth of the transistor 5155. With the above configuration, the drain current of the transistor 5155 can be made to flow preferentially through the wiring ML instead of the light-emitting element 5154.

Then, the drain current of the transistor 5155 is supplied to a monitor circuit through the wiring ML. The monitor circuit generates a signal including information about the value of the drain current by using the drain current flowing through the wiring ML. Thus, using the above signal, the light-emitting device according to one embodiment of the present invention can correct the value of the potential Vdata of the image signal Sig supplied to the pixel 5111.

Note that in the light-emitting device including the pixel 5111 illustrated in FIG. 32A, the operation in the period t3 is not necessarily performed after the operation in the period t2. For example, in the pixel 5111, the operation in the period t3 may be performed after the operations in the periods t1 and t2 are repeated a plurality of times. Alternatively, after the operation in the period t3 is performed on pixels 5111 in one row, the light-emitting elements 5154 may be brought into a non-light-emitting state by writing an image signal corresponding to the lowest grayscale level 0 to the pixels 5111 in the row which have been subjected to the above operation. Then, the operation in the period t3 may be performed on pixels 5111 in the next row.

Figure 33A:
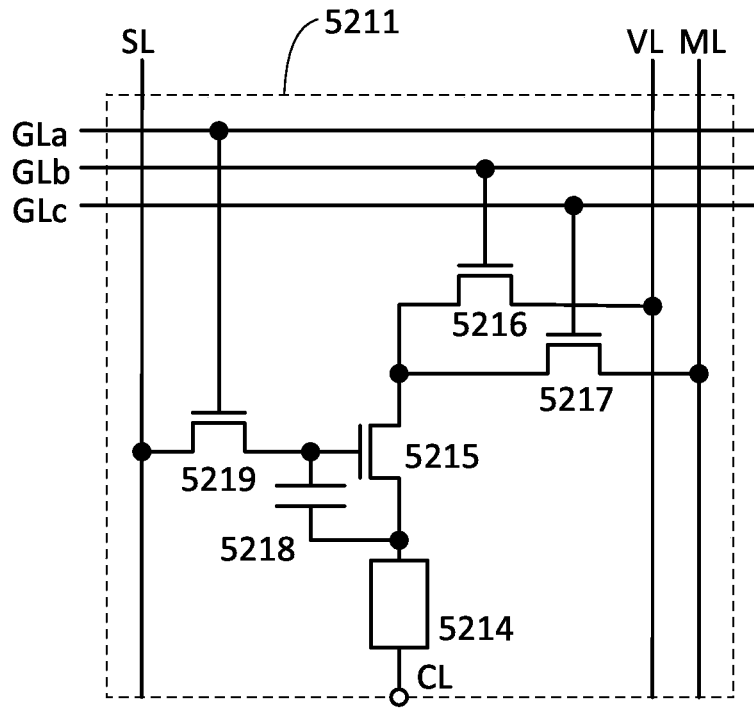
FIGS. 33A and 33B are a circuit diagram and a timing chart of a display device.

Alternatively, a configuration of a pixel circuit illustrated in FIG. 33A may be employed. FIG. 33A illustrates an example of a pixel circuit. Here, an example in which four n-channel transistors and one capacitor are used in one pixel is illustrated.

A pixel 5211 illustrated in FIG. 33A includes a transistor 5215, a transistor 5216, a transistor 5217, a capacitor 5218, a light-emitting element 5214, and a transistor 5219.

The potential of a pixel electrode in the light-emitting element 5214 is controlled in accordance with an image signal Sig input to the pixel 5211. The luminance of the light-emitting element 5214 depends on a potential difference between the pixel electrode and the common electrode.

The transistor 5219 has a function of controlling electrical connection between the wiring SL and a gate of the transistor 5215. One of a source and a drain of the transistor 5215 is electrically connected to an anode of the light-emitting element 5214. The transistor 5216 has a function of controlling electrical connection between the wiring VL and the other of the source and the drain of the transistor 5215. The transistor 5217 has a function of controlling electrical connection between the wiring ML and the other of the source and the drain of the transistor 5215. One of a pair of electrodes of the capacitor 5218 is electrically connected to the gate of the transistor 5215, and the other is electrically connected to the anode of the light-emitting element 5214.

The switching of the transistor 5219 is performed in accordance with the potential of a wiring GLa which is electrically connected to a gate of the transistor 5219. The switching of the transistor 5216 is performed in accordance with the potential of a wiring GLb which is electrically connected to a gate of the transistor 5216. The switching of the transistor 5217 is performed in accordance with the potential of a wiring GLc which is electrically connected to a gate of the transistor 5217.

Note that any of the above-described transistors can be used for at least one of the transistor 5215, the transistor 5216, the transistor 5217, and the transistor 5219. Furthermore, any of the above-described capacitors can be used for the capacitor 5218.

Next, an example of operation of the pixel 5211 illustrated in FIG. 33A for external correction is described.

Figure 33B:
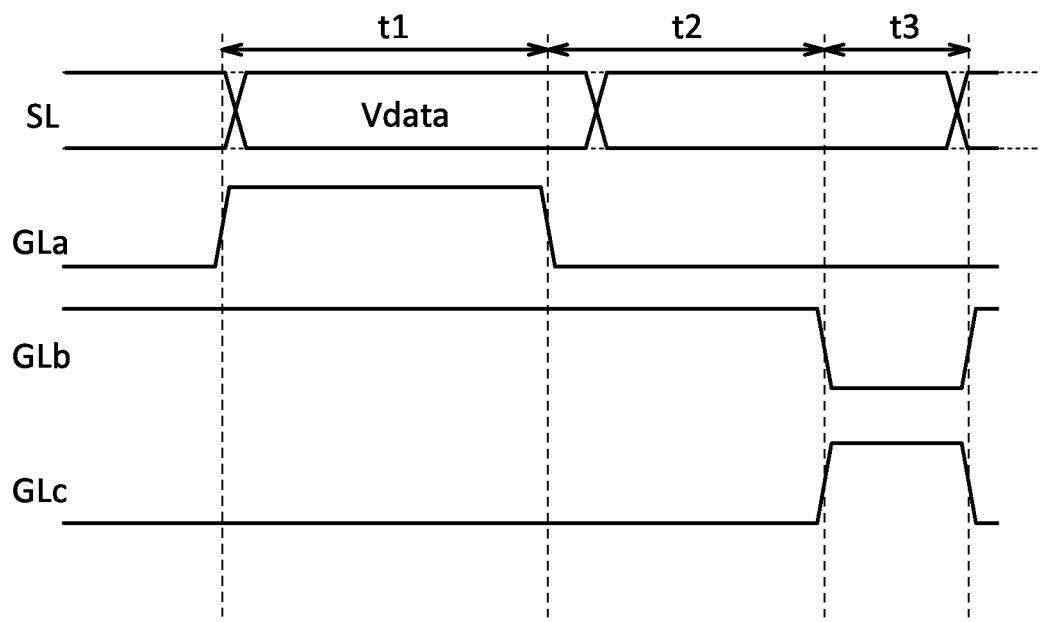

FIG. 33B shows an example of a timing chart of potentials of the wiring GLa, the wiring GLb, and the wiring GLc, which are electrically connected to the pixel 5211 illustrated in FIG. 33A, and a potential of the image signal Sig supplied to the wiring SL. Note that the timing chart of FIG. 33B is an example in which all the transistors included in the pixel 5211 shown in FIG. 33A are n-channel transistors.

First, in a period t1, a high-level potential is applied to the wiring GLa, a high-level potential is applied to the wiring GLb, and a low-level potential is applied to the wiring GLc. Accordingly, the transistors 5219 and 5216 are turned on and the transistor 5217 is turned off. A potential Vdata of the image signal Sig is applied to the wiring SL, and the potential Vdata is applied to the gate of the transistor 5215 through the transistor 5219.

A potential Vano is applied to the wiring VL, and a potential Vcat is applied to the wiring CL. The potential Vano is preferably higher than the sum of the potential Vcat and the threshold voltage Vthe of the light-emitting element 5214. The potential Vano of the wiring VL is applied to the other of the source and the drain of the transistor 5215 through the transistor 5216. Thus, the value of the drain current of the transistor 5215 is determined in accordance with the potential Vdata. Then, the drain current is supplied to the light-emitting element 5214, whereby the luminance of the light-emitting element 5214 is determined.

Next, in a period t2, a low-level potential is applied to the wiring GLa, a high-level potential is applied to the wiring GLb, and a low-level potential is applied to the wiring GLc. Accordingly, the transistor 5216 is turned on and the transistors 5219 and 5217 are turned off. Since the transistor 5219 is turned off, the potential Vdata is held at the gate of the transistor 5215. The potential Vano is applied to the wiring VL, and the potential Vcat is applied to the wiring CL. Thus, the light-emitting element 5214 maintains the luminance determined in the period t1.

Next, in a period t3, a low-level potential is applied to the wiring GLa, a low-level potential is applied to the wiring GLb, and a high-level potential is applied to the wiring GLc. Accordingly, the transistor 5217 is turned on and the transistors 5219 and 5216 are turned off. The potential Vcat is applied to the wiring CL. The potential Vano is applied to the wiring ML, which is connected to the monitor circuit.

By the above operation, the drain current of the transistor 5215 is supplied to the light-emitting element 5214 through the transistor 5217. In addition, the drain current is also supplied to the monitor circuit through the wiring ML. The monitor circuit generates a signal including information about the value of the drain current by using the drain current flowing through the wiring ML. Thus, using the above signal, the light-emitting device according to one embodiment of the present invention can correct the value of the potential Vdata of the image signal Sig supplied to the pixel 5211.

Note that in the light-emitting device including the pixel 5211 illustrated in FIG. 33A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5211 in one row, the light-emitting elements 5214 may be brought into a non-light-emitting state by writing an image signal corresponding to the lowest grayscale level 0 to the pixels 5211 in the row which have been subjected to the above operation. Then, the operation in the period t3 may be performed on pixels 5211 in the next row.

Figure 34A:
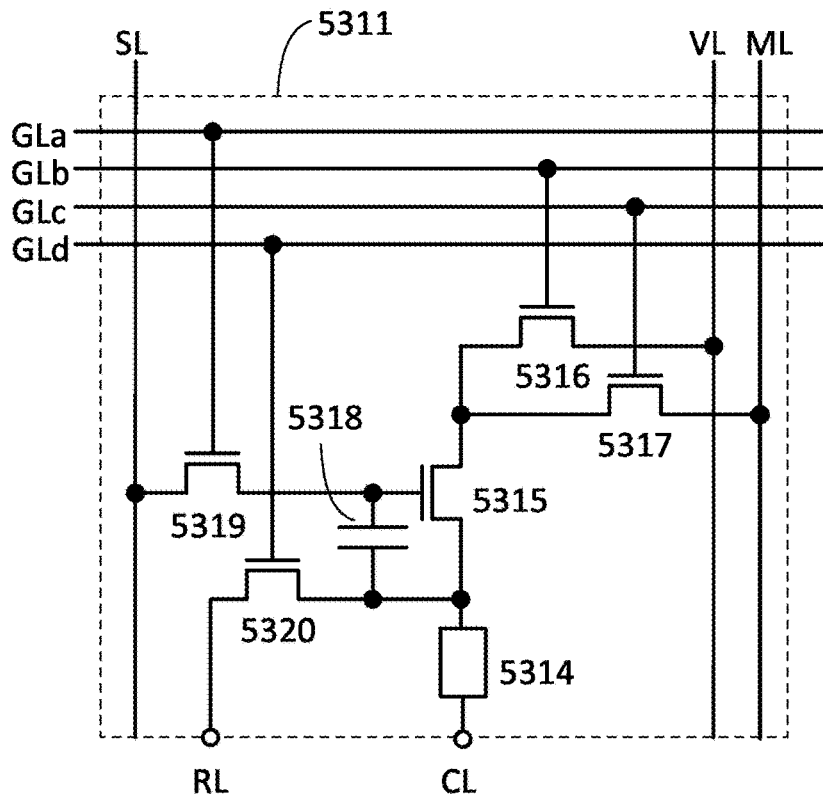
FIGS. 34A and 34B are a circuit diagram and a timing chart of a display device.

Alternatively, a configuration of a pixel circuit illustrated in FIG. 34A may be employed. FIG. 34A illustrates an example of a pixel circuit. Here, an example in which five n-channel transistors and one capacitor are used in one pixel is illustrated.

A pixel 5311 illustrated in FIG. 34A includes a transistor 5315, a transistor 5316, a transistor 5317, a capacitor 5318, a light-emitting element 5314, a transistor 5319, and a transistor 5320.

The transistor 5320 has a function of controlling electrical connection between a wiring RL and the anode of the light-emitting element 5314. The transistor 5319 has a function of controlling electrical connection between the wiring SL and a gate of the transistor 5315. One of a source and a drain of the transistor 5315 is electrically connected to an anode of the light-emitting element 5314. The transistor 5316 has a function of controlling electrical connection between the wiring VL and the other of the source and the drain of the transistor 5315. The transistor 5317 has a function of controlling electrical connection between the wiring ML and the other of the source and the drain of the transistor 5315. One of a pair of electrodes of the capacitor 5318 is electrically connected to the gate of the transistor 5315, and the other is electrically connected to the anode of the light-emitting element 5314.

The switching of the transistor 5319 is performed in accordance with the potential of the wiring GLa which is electrically connected to a gate of the transistor 5319. The switching of the transistor 5316 is performed in accordance with the potential of the wiring GLb which is electrically connected to a gate of the transistor 5316. The switching of the transistor 5317 is performed in accordance with the potential of the wiring GLc which is electrically connected to a gate of the transistor 5317. The switching of the transistor 5320 is performed in accordance with the potential of the wiring GLd which is electrically connected to a gate of the transistor 5320.

Note that any of the above-described transistors can be used for at least one of the transistor 5315, the transistor 5316, the transistor 5317, the transistor 5319, and the transistor 5320. Furthermore, any of the above-described capacitors can be used for the capacitor 5318.

Next, an example of operation of the pixel 5311 illustrated in FIG. 34A for external correction is described.

Figure 34B:
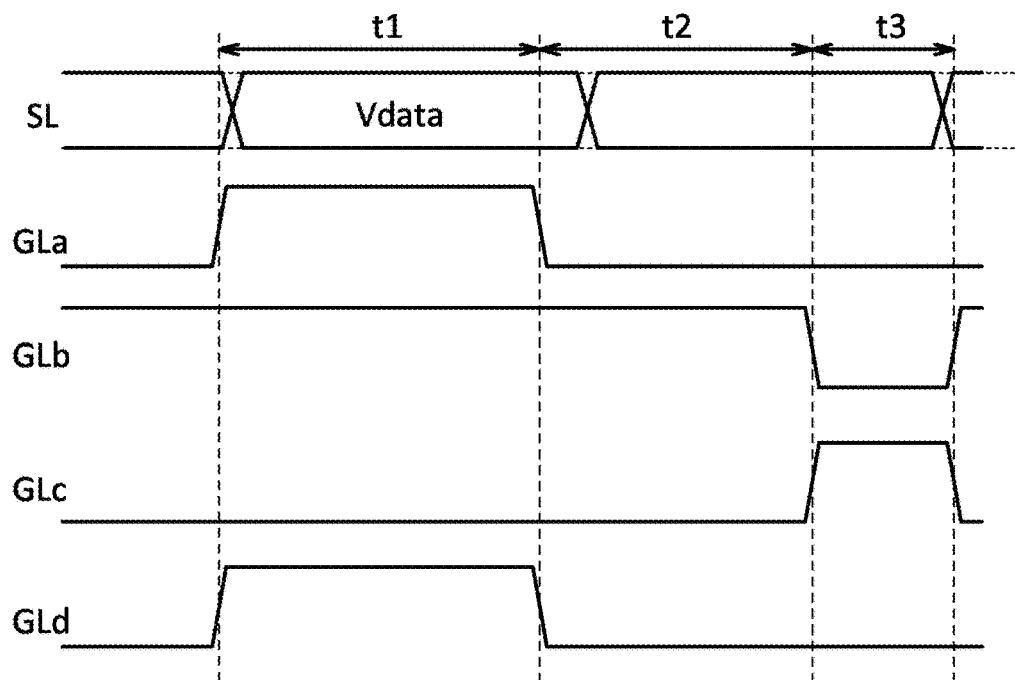

FIG. 34B shows an example of a timing chart of potentials of the wiring GLa, the wiring GLb, the wiring GLc, and the wiring GLd, which are electrically connected to the pixel 5311 illustrated in FIG. 34A, and a potential of the image signal Sig supplied to the wiring SL. Note that in the timing chart in FIG. 34B, all the transistors included in the pixel 5311 in FIG. 34A are n-channel transistors.

First, in a period t1, a high-level potential is applied to the wiring GLa, a high-level potential is applied to the wiring GLb, a low-level potential is applied to the wiring GLc, and a high-level potential is applied to the wiring GLd. Accordingly, the transistors 5319, 5316, and 5320 are turned on and the transistor 5317 is turned off. A potential Vdata of the image signal Sig is applied to the wiring SL, and the potential Vdata is applied to the gate of the transistor 5315 through the transistor 5319. Thus, the value of the drain current of the transistor 5315 is determined by the potential Vdata. A potential Vano is applied to the wiring VL and a potential V1 is applied to the wiring RL; therefore, the drain current flows between the wiring VL and the wiring RL through the transistor 5316 and the transistor 5320.

The potential Vano is preferably higher than the sum of the potential Vcat and the threshold voltage Vthe of the light-emitting element 5314. The potential Vano of the wiring VL is applied to the other of the source and the drain of the transistor 5315 through the transistor 5316. The potential V1 applied to the wiring RL is applied to the one of the source and the drain of the transistor 5315 through the transistor 5320. The potential Veat is applied to the wiring CL.

Note that it is preferable that the potential V1 be sufficiently lower than a potential obtained by subtracting the threshold voltage Vth of the transistor 5315 from the potential V0. The light-emitting element 5314 does not emit light in the period t1 because the potential V1 can be set sufficiently lower than the potential obtained by subtracting the threshold voltage Vthe of the light-emitting element 5314 from the potential Vcat.

Next, in a period t2, a low-level potential is applied to the wiring GLa, a high-level potential is applied to the wiring GLb, a low-level potential is applied to the wiring GLc, and a low-level potential is applied to the wiring GLd. Accordingly, the transistor 5316 is turned on and the transistors 5319, 5317, and 5320 are turned off. Since the transistor 5319 is off, the potential Vdata is held at the gate of the transistor 5315.

A potential Vano is applied to the wiring VL, and a potential Vcat is applied to the wiring CL. Accordingly, the drain current of the transistor 5315, the value of which is determined in the period t1, is supplied to the light-emitting element 5314 because the transistor 5320 is turned off. By supply of the drain current to the light-emitting element 5314, the luminance of the light-emitting element 5314 is determined, and the luminance is held in the period 2.

Next, in a period t3, a low-level potential is applied to the wiring GLa, a low-level potential is applied to the wiring GLb, a high-level potential is applied to the wiring GLc, and a low-level potential is applied to the wiring GLd. Accordingly, the transistor 5317 is turned on and the transistors 5319, 5316, and 5320 are turned off. The potential Vcat is applied to the wiring CL. The potential Vano is applied to the wiring ML, which is connected to the monitor circuit.

By the above operation, the drain current of the transistor 5315 is supplied to the light-emitting element 5314 through the transistor 5317. In addition, the drain current is also supplied to the monitor circuit through the wiring ML. The monitor circuit generates a signal including information about the value of the drain current by using the drain current flowing through the wiring ML. Thus, using the above signal, the light-emitting device according to one embodiment of the present invention can correct the value of the potential Vdata of the image signal Sig supplied to the pixel 5311.

Note that in the light-emitting device including the pixel 5311 illustrated in FIG. 34A, the operation in the period t3 is not necessarily performed after the operation in the period t2. For example, in the light-emitting device, the operation in the period t3 may be performed after the operations in the periods t1 and t2 are repeated a plurality of times. Alternatively, after the operation in the period t3 is performed on pixels 5311 in one row, the light-emitting elements 5314 may be brought into a non-light-emitting state by writing an image signal corresponding to the lowest grayscale level 0 to the pixels 5311 in the row which have been subjected to the above operation. Then, the operation in the period t3 may be performed on pixels 5311 in the next row.

In the pixel 5311 illustrated in FIG. 34A, even when variation in resistance of a portion between the anode and the cathode of the light-emitting element 5314 among pixels is caused by deterioration of the light-emitting element 5314 or the like, the potential of the source of the transistor 5315 can be set to a predetermined potential V1 at the time of applying the potential Vdata to the gate of the transistor 5315. Thus, variation in luminance of the light-emitting element 5314 among pixels can be prevented.

Figure 35A:
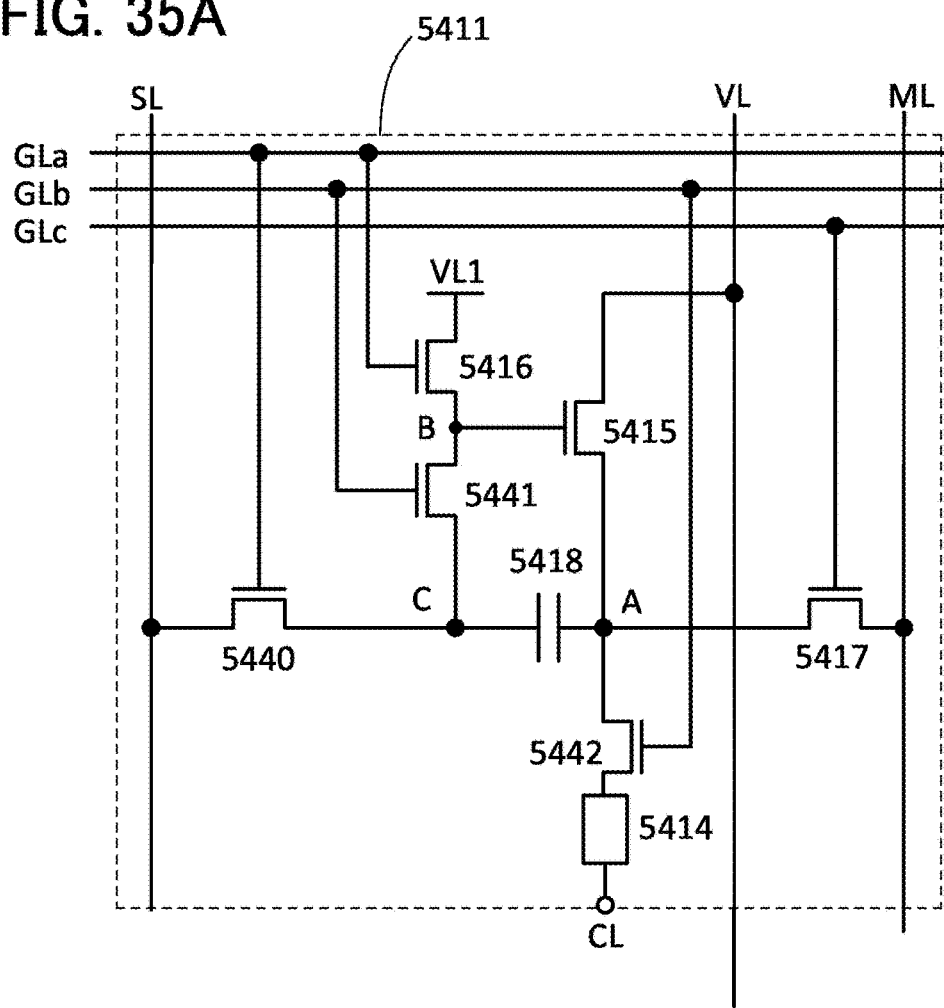
FIGS. 35A and 35B are a circuit diagram and a timing chart of a display device.

Alternatively, a configuration of a pixel circuit illustrated in FIG. 35A may be employed. FIG. 35A illustrates an example of a pixel circuit. Here, an example in which six n-channel transistors and one capacitor are used in one pixel is illustrated.

A pixel 5411 illustrated in FIG. 35A includes a transistor 5415, a transistor 5416, a transistor 5417, a capacitor 5418, a light-emitting element 5414, a transistor 5440, a transistor 5441, and a transistor 5442.

The potential of a pixel electrode in the light-emitting element 5414 is controlled in accordance with an image signal Sig input to the pixel 5411. The luminance of the light emitting element 5414 depends on a potential difference between the pixel electrode and the common electrode.

The transistor 5440 has a function of controlling electrical connection between the wiring SL and one of a pair of electrodes of the capacitor 5418. The other of the pair of electrodes of the capacitor 5418 is electrically connected to one of a source and a drain of the transistor 5415. The transistor 5416 has a function of controlling electrical connection between the wiring VL1 and a gate of the transistor 5415. The transistor 5441 has a function of controlling electrical connection between one of the pair of electrodes of the capacitor 5418 and the gate of the transistor 5415. The transistor 5442 has a function of controlling electrical connection between one of the source and the drain of the transistor 5415 and an anode of the light-emitting element 5414. The transistor 5417 has a function of controlling electrical connection between the other of the source and the drain of the transistor 5415 and the wiring ML.

In FIG. 35A, the other of the source and the drain of the transistor 5415 is electrically connected to the wiring VL.

The transistor 5440 is switched in accordance with the potential of the wiring GLa which is electrically connected to a gate of the transistor 5440. The transistor 5416 is switched in accordance with the potential of the wiring GLa which is electrically connected to a gate of the transistor 5416. The transistor 5441 is switched in accordance with the potential of the wiring GLb which is electrically connected to a gate of the transistor 5441. The transistor 5442 is switched in accordance with the potential of the wiring GLb which is electrically connected to a gate of the transistor 5442. The transistor 5417 is switched in accordance with the potential of the wiring GLc which is electrically connected to a gate of the transistor 5417.

Figure 35B:
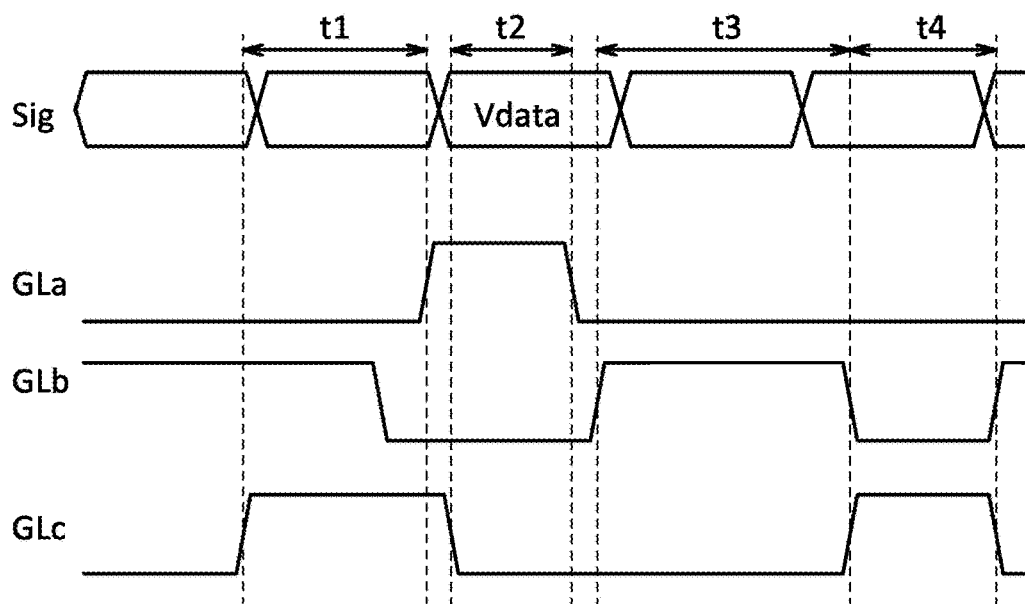

FIG. 35B shows an example of a timing chart of potentials of the wiring GLa, the wiring GLb, and the wiring GLc, which are electrically connected to the pixel 5411 illustrated in FIG. 35A, and a potential of the image signal Sig supplied to the wiring SL. Note that in the timing chart in FIG. 35B, all the transistors included in the pixel 5411 in FIG. 35A are n-channel transistors.

First, in a period t1, a low-level potential is applied to the wiring GLa, a high-level potential is applied to the wiring GLb, and a high-level potential is applied to the wiring GLc. Accordingly, the transistors 5441, 5442, and 5417 are turned on, and the transistors 5440 and 5416 are turned off. The transistors 5442 and 5417 are turned on, whereby a potential V0, which is the potential of the wiring ML, is applied to the one of the source and the drain of the transistor 5415 and the other of the pair of electrodes of the capacitor 5418 (represented as a node A).

A potential Vano is applied to the wiring VL, and a potential Vcat is applied to the wiring CL. The potential Vano is preferably higher than the sum of the potential V0 and the threshold voltage Vthe of the light-emitting element 5414. Note that the potential V0 is preferably lower than the sum of the potential Vcat and the threshold voltage Vthe of the light-emitting element 5414. With the potential V0 set in the above range, current can be prevented from flowing through the light-emitting element 5414 in the period t1.

A low-level potential is then applied to the wiring GLb, and the transistors 5441 and 5442 are accordingly turned off and the node A is held at the potential V0.

Next, in a period t2, a high-level potential is applied to the wiring GLa, a low-level potential is applied to the wiring GLb, and a low-level potential is applied to the wiring GLc. Accordingly, the transistors 5440 and 5416 are turned on, and the transistors 5441, 5442, and 5417 are turned off.

In the transition from the period t1 to the period t2, it is preferable that the potential applied to the wiring GLa be changed from low to high and then the potential applied to the wiring GLc be changed from high to low. This operation prevents change in the potential of the node A due to the change of the potential applied to the wiring GLa.

A potential Vcat is applied to the wiring VL, and a potential Vcat is applied to the wiring CL. A potential Vdata of the image signal Sig is applied to the wiring SL, and a potential V1 is applied to the wiring VL1. Note that the potential V1 is preferably higher than the sum of the potential Vcat and the threshold voltage Vth of the transistor 5415 and lower than the sum of the potential Vano and the threshold voltage Vth of the transistor 5415.

Note that in the pixel structure shown in FIG. 35A, even if the potential V1 is higher than the sum of the potential Vcat and the threshold voltage Vthe of the light-emitting element 5414, the light-emitting element 5414 does not emit light as long as the transistor 5442 is off. Thus, the allowable potential V0 range can be expanded and the allowable range of V1-V0 can also be increased. As a result of increasing the degree of freedom of values for V1-V0, the threshold voltage Vth of the transistor 5415 can be obtained accurately even when time required to obtain the threshold voltage Vth of the transistor 5415 is reduced or limited.

By this operation, the potential V1 which is higher than the sum of the potential of the node A and the threshold voltage Vth is input to the gate of the transistor 5415 (represented as a node B), and the transistor 5415 is turned on. Thus, electric charge in the capacitor 5418 is discharged through the transistor 5415, and the potential of the node A, which is the potential V0, starts to increase. The potential of the node A finally converges to the potential V1-Vth and the gate voltage of the transistor 5415 converges to the threshold voltage Vth of the transistor 5415; then, the transistor 5415 is turned off.

The potential Vdata of the image signal Sig applied to the wiring SL is applied to the one of the pair of electrodes of the capacitor 5418 (represented as a node C) through the transistor 5440.

Next, in a period t3, a low-level potential is applied to the wiring GLa, a high-level potential is applied to the wiring GLb, and a low-level potential is applied to the wiring GLc. Accordingly, the transistors 5441 and 5442 are turned on, and the transistors 5440, 5416, and 5417 are turned off.

In the transition from the period t2 to the period t3, it is preferable that the potential applied to the wiring GLa be changed from high to low and then the potential applied to the wiring GLb be changed from low to high. This structure can prevent potential change of the node A due to change of the potential applied to the wiring GLa.

A potential Vano is applied to the wiring VL, and a potential Vcat is applied to the wiring CL.

The potential Vdata is applied to the node B by the above operation; thus, the gate voltage of the transistor 5415 becomes Vdata-V1+Vth. Thus, the gate voltage of the transistor 5415 can be the value to which the threshold voltage Vth is added. With this structure, variation in the threshold voltage Vth of the transistor 5415 can be reduced. Thus, variation of current values supplied to the light-emitting element 5414 can be suppressed, whereby reducing unevenness in luminance of the light-emitting device.

Note that the potential applied to the wiring GLb is greatly varied here, whereby an influence of variation of threshold voltages of the transistor 5442 on the value of a current supplied to the light-emitting element 5414 can be prevented. In other words, the high-level potential applied to the wiring GLb is much higher than the threshold voltage of the transistor 5442, and the low-level potential applied to the wiring GLb is much lower than the threshold voltage of the transistor 5442; thus, on/off switching of the transistor 5442 is secured and the influence of variation of threshold voltages of the transistor 5442 on the value of current supplied to the light-emitting element 5414 can be prevented.

Next, in a period t4, a low-level potential is applied to the wiring GLa, a low-level potential is applied to the wiring GLb, and a high-level potential is applied to the wiring GLc. Accordingly, the transistor 5417 is turned on and the transistors 5416, 5440, 5441, and 5442 are turned off.

In addition, a potential Vano is applied to the wiring VL, and the wiring ML is electrically connected to the monitor circuit.

By the above operation, drain current Id of the transistor 5415 flows not to the light-emitting element 5414 but to the wiring ML through the transistor 5417. The monitor circuit generates a signal including information about the value of the drain current Id by using the drain current Id flowing through the wiring ML. The magnitude of the drain current Id depends on the mobility or the size (channel length, channel width) of the transistor 5415. Using the above signal, the light-emitting device according to one embodiment of the present invention can thus correct the value of the potential Vdata of the image signal Sig supplied to the pixel 5411. That is, the influence of variation in the mobility of the transistor 5415 can be reduced.

Note that in the light-emitting device including the pixel 5411 illustrated in FIG. 35A, the operation in the period t4 is not necessarily always performed after the operation in the period t3. For example, in the light-emitting device, the operation in the period t4 may be performed after the operations in the periods t1 to t3 are repeated a plurality of times. Alternatively, after the operation in the period t4 is performed on pixels 5411 in one row, the light-emitting elements 5414 may be brought into a non-light-emitting state by writing an image signal corresponding to the lowest grayscale level 0 to the pixels 5411 in the row which have been subjected to the above operation. Then, the operation in the period t4 may be performed on pixels 5411 in the next row.

Note that, in the light-emitting device including the pixel 5411 illustrated in FIG. 35A, the other of the source and the drain of the transistor 5415 is electrically isolated from the gate of the transistor 5415, so that their potentials can be individually controlled. Accordingly, in the period t2, the potential of the other of the source and the drain of the transistor 5415 can be set higher than a potential obtained by adding the threshold voltage Vth to the gate potential of the transistor 5415. Thus, when the transistor 5415 is normally on, that is, when the threshold voltage Vth is negative, charge can be accumulated in the capacitor 5418 until the source potential of the transistor 5415 becomes higher than the gate potential V1 of the transistor 5415. For these reasons, in the light-emitting device according to one embodiment of the present invention, even when the transistor 5415 is a normally on transistor, the threshold voltage Vth can be obtained in the period t2; and in the period t3, the gate voltage of the transistor 5415 can be set to a value obtained by adding the threshold voltage Vth.

Therefore, in the light-emitting device of one embodiment of the present invention, display unevenness can be reduced and high-quality images can be displayed even if the transistor 5415 becomes a normally-on transistor.

Not only the characteristics of the transistor 5415 but also the characteristics of the light-emitting element 5414 may be monitored. Here, it is preferable that current not flow through the transistor 5415 by controlling the potential Vdata of the image signal Sig, for example. The current of the light-emitting element 5414 can be thus extracted, and degradation or variation in current characteristics of the light-emitting element 5414 can be obtained.

The structure described in this embodiment can be used in appropriate combination with any of the structures described in the other embodiments.

Embodiment 7

In this embodiment, a display module and electronic appliances that can be formed using a semiconductor device of one embodiment of the present invention are described with reference to FIG. 36 and FIGS. 37A to 37H.

Figure 36:
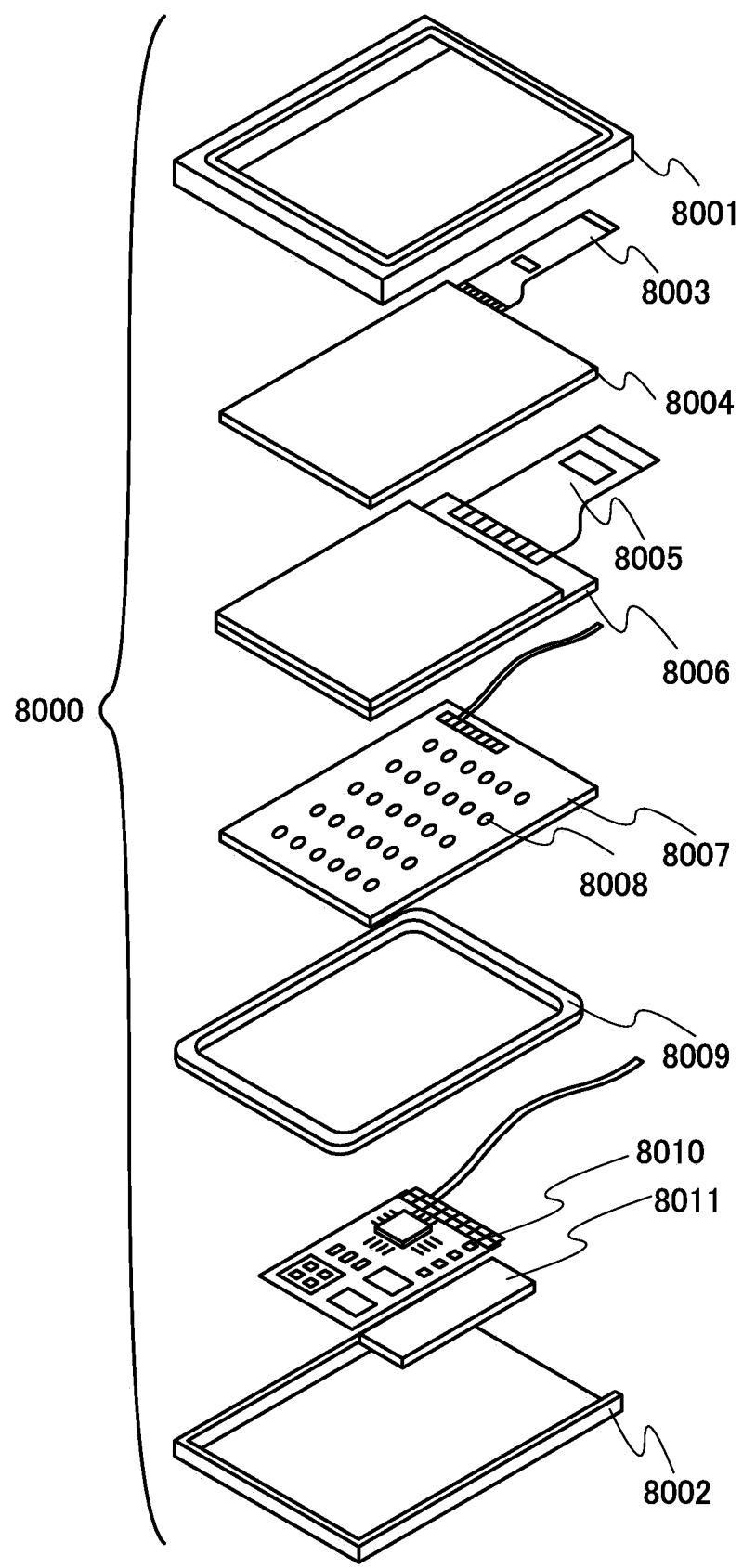
FIG. 36 illustrates a display module.

In a display module 8000 illustrated in FIG. 36, a touch panel 8004 connected to an FPC 8003, a display panel 8006 connected to an FPC 8005, a backlight unit 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap the display panel 8006. A counter substrate (scaling substrate) of the display panel 8006 can have a touch panel function. A photosensor may be provided in each pixel of the display panel 8006 to form an optical touch panel.

The backlight unit 8007 includes a light source 8008. Note that although a structure in which the light sources 8008 are provided over the backlight unit 8007 is illustrated in FIG. 36, one embodiment of the present invention is not limited to this structure. For example, a structure in which the light source 8008 is provided at an end portion of the backlight unit 8007 and a light diffusion plate is further provided may be employed. Note that the backlight unit 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 37A to 37H illustrate electronic appliances. These electronic appliances can include a housing 9000, a display portion 9001, a speaker 9003, an LED lamp 9004, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

Figure 37A:
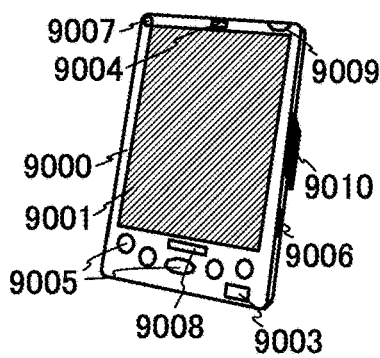
FIGS. 37A to 37H illustrate electronic devices.
Figure 37B:
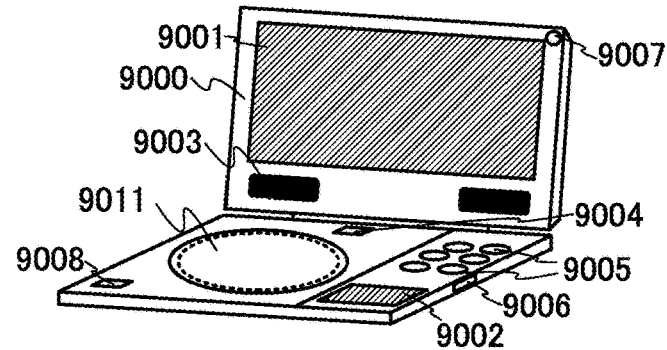
Figure 37C:
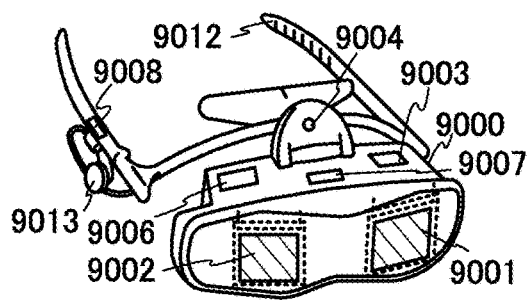
Figure 37D:
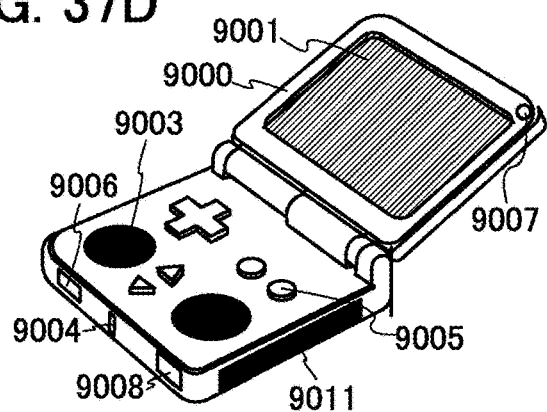
Figure 37E:
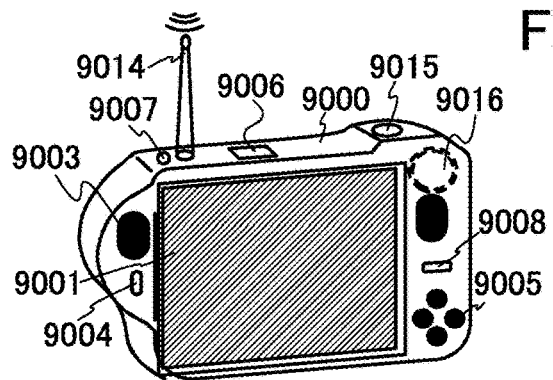
Figure 37F:
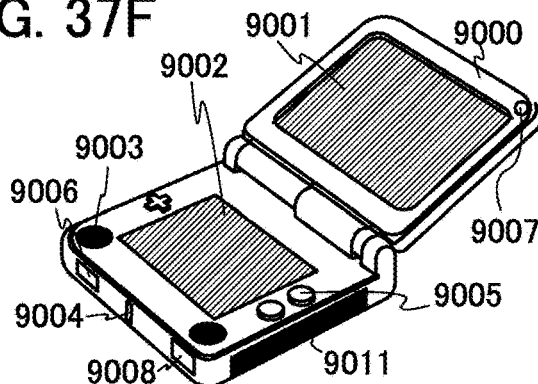
Figure 37G:
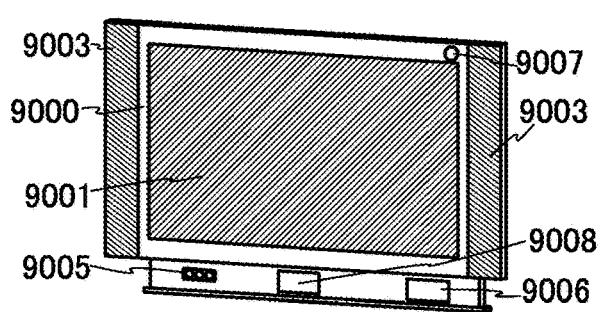
Figure 37H:
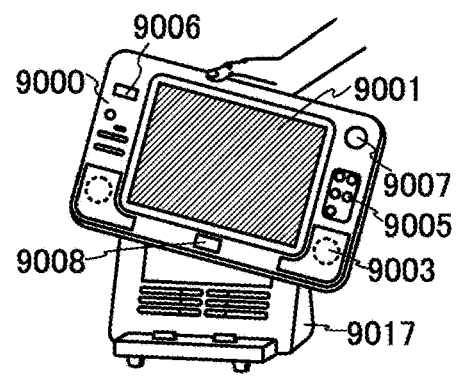

FIG. 37A illustrates a mobile computer that can include a switch 9009, an infrared port 9010, and the like in addition to the above components. FIG. 37B illustrates a portable image reproducing device (e.g., a DVD player) that is provided with a memory medium and can include a second display portion 9002, a memory medium reading portion 9011, and the like in addition to the above components. FIG. 37C illustrates a goggle-type display that can include the second display portion 9002, a support 9012, an earphone 9013, and the like in addition to the above components. FIG. 37D illustrates a portable game machine that can include the memory medium reading portion 9011 and the like in addition to the above components. FIG. 37E illustrates a digital camera that has a television reception function and can include an antenna 9014, a shutter button 9015, an image receiving portion 9016, and the like in addition to the above components. FIG. 37F illustrates a portable game machine that can include the second display portion 9002, the memory medium reading portion 9011, and the like in addition to the above components. FIG. 37G illustrates a television receiver that can include a tuner, an image processing portion, and the like in addition to the above components. FIG. 37H illustrates a portable television receiver that can include a charger 9017 capable of transmitting and receiving signals, and the like in addition to the above components.

The electronic appliances illustrated in FIGS. 37A to 37H can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Furthermore, the electronic appliance including a plurality of display portions can have a function of displaying image data mainly on one display portion while displaying text data on another display portion, a function of displaying a three-dimensional image by displaying images on a plurality of display portions with a parallax taken into account, or the like. Furthermore, the electronic appliance including an image receiving portion can have a function of shooting a still image, a function of taking a moving image, a function of automatically or manually correcting a shot image, a function of storing a shot image in a memory medium (an external memory medium or a memory medium incorporated in the camera), a function of displaying a shot image on the display portion, or the like. Note that functions that can be provided for the electronic appliances illustrated in FIGS. 37A to 37H are not limited to those described above, and the electronic appliances can have a variety of functions.

The electronic appliances described in this embodiment each include the display portion for displaying some sort of data. Note that the semiconductor device of one embodiment of the present invention can also be used for an electronic appliance that does not have a display portion.

The structure described in this embodiment can be used in appropriate combination with any of the structures described in the other embodiments.

EXAMPLE

In this example, a cross-sectional shape of a transistor of one embodiment of the present invention was observed.

A method for manufacturing a sample which was observed in this example will be described below. Note that in this example, a transistor corresponding to the transistor 100 illustrated in FIGS. 1A and 1C was manufactured.

First, the substrate 102 was prepared. As the substrate 102, a glass substrate was used. Next, as the insulating film 108a, a 100-nm-thick silicon nitride film (SiN-1) was formed over the substrate 102. Next, as the insulating film 108b, a 400-nm-thick silicon oxynitride film (SiON-1) was formed over the insulating film 108a. Note that the insulating film 108a and the insulating film 108b were successively formed in a vacuum using a PECVD apparatus.

Next, as the film that suppresses release of oxygen, a 5-nm-thick tantalum nitride film was formed over the insulating film 108b. Note that the tantalum nitride film was formed using a sputtering apparatus. Next, oxygen was added to the insulating film 108b from the tantalum nitride film side using an ashing apparatus. Next, the tantalum nitride film was removed using a dry etching apparatus.

Next, as the oxide semiconductor film 110, a 50-nm-thick oxide semiconductor film (IGZO) was formed over the insulating film 108b. Note that a sputtering apparatus was used for forming the oxide semiconductor film 110; a metal oxide of In:Ga:Zn 1:1:1.2 [atomic %] was used as a sputtering target, and an AC power supply was used for supplying power to the sputtering target. Next, heat treatment was performed on the substrate over which the oxide semiconductor film 110 was formed. As the heat treatment, heat treatment under a nitrogen atmosphere at a temperature of 450° C. for one hour and heat treatment under a mixed gas of nitrogen and oxygen at a temperature of 450° C. for one hour were sequentially performed.

Next, a mask was formed over the oxide semiconductor film 110 by a lithography step, and the oxide semiconductor film 110 was processed into an island-like shape using the mask. Note that the oxide semiconductor film 110 was processed by a wet etching method using a chemical solution.

Next, as the insulating film 112, a 100-nm-thick silicon oxynitride film (SiON-2) was formed over the island-shaped oxide semiconductor film 110. Note that the insulating film 112 was formed using a PECVD apparatus.

Next, as the conductive film 114a, a 30-nm-thick tantalum nitride film (TaN) was formed over the insulating film 112. Next, as the conductive film 114b, a 150-nm-thick tungsten film (W) was formed over the conductive film 114a. Note that the conductive film 114a and the conductive film 114b were successively formed in a vacuum using a sputtering apparatus.

Next, a mask was formed over the conductive film 114b by a lithography step, and the conductive films 114b and 114a and the insulating film 112 were processed into an island-like shape using the mask. The processing of the conductive films 114a and 114b and the insulating film 112 was performed using a dry etching apparatus. Next, the impurity element was added to the oxide semiconductor film 110 with the mask left. The impurity element was added as follows. An etching apparatus was used, the substrate was placed between parallel plates in a chamber of the etching apparatus, and then, an argon gas was introduced to the chamber, and an RF power was applied between the parallel plates so that a bias was applied on the substrate side.

Next, as the insulating film 118, a 100-nm-thick silicon nitride film (SiN-2) was formed to cover the insulating film 108b, the oxide semiconductor film 110, the insulating film 112, and the conductive films 114a and 114b. Next, as the insulating film 120, a 300-nm-thick silicon oxynitride film (SiON-3) was formed over the insulating film 118. Note that the insulating film 118 and the insulating film 120 were successively formed in a vacuum using a PECVD apparatus.

Next, a mask was formed over the insulating film 120 by a lithography step, and opening portions were formed in the insulating films 120 and 118 using the mask. Note that the opening portions reach the oxide semiconductor film 110. The opening portions were formed using a dry etching apparatus.

Next, conductive films were formed to cover the insulating film 120 and the opening portion. As the conductive films, a 50-nm-thick tungsten film, a 400-nm-thick aluminum film, and a 100-nm-thick titanium film were stacked in this order. Note that the conductive films were successively formed in a vacuum using a sputtering apparatus.

Next, a mask was formed over the conductive film by a lithography step, and the conductive film 122 and the conductive film 124 were formed using the mask.

Through the above-described process, the sample for cross-sectional observation of this example was manufactured.

Figure 38A:
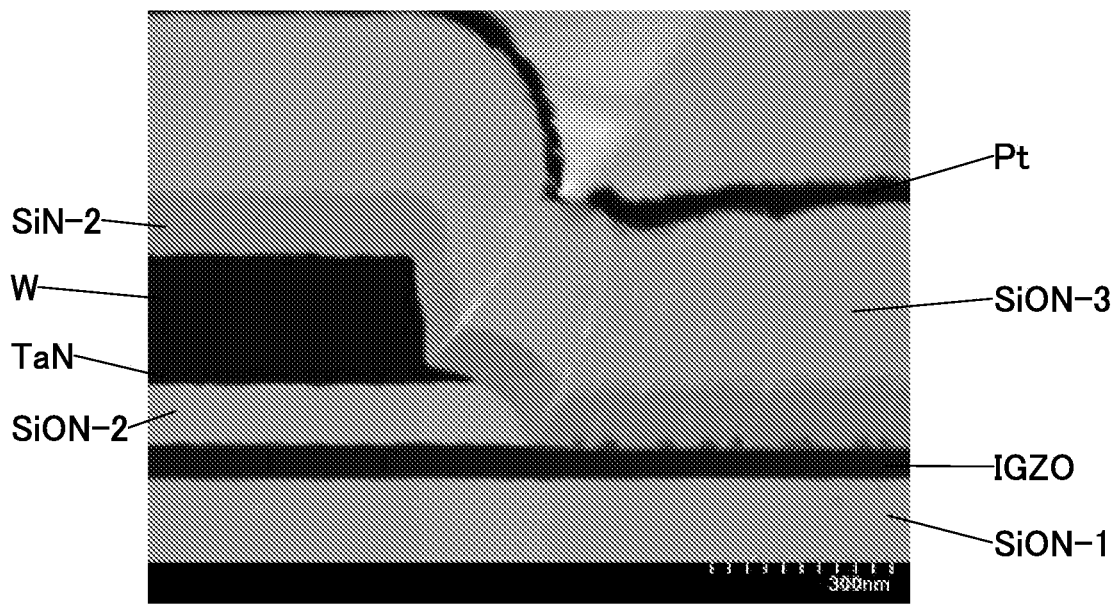
FIGS. 38A and 38B are cross-sectional TEM images in an example.
Figure 38B:
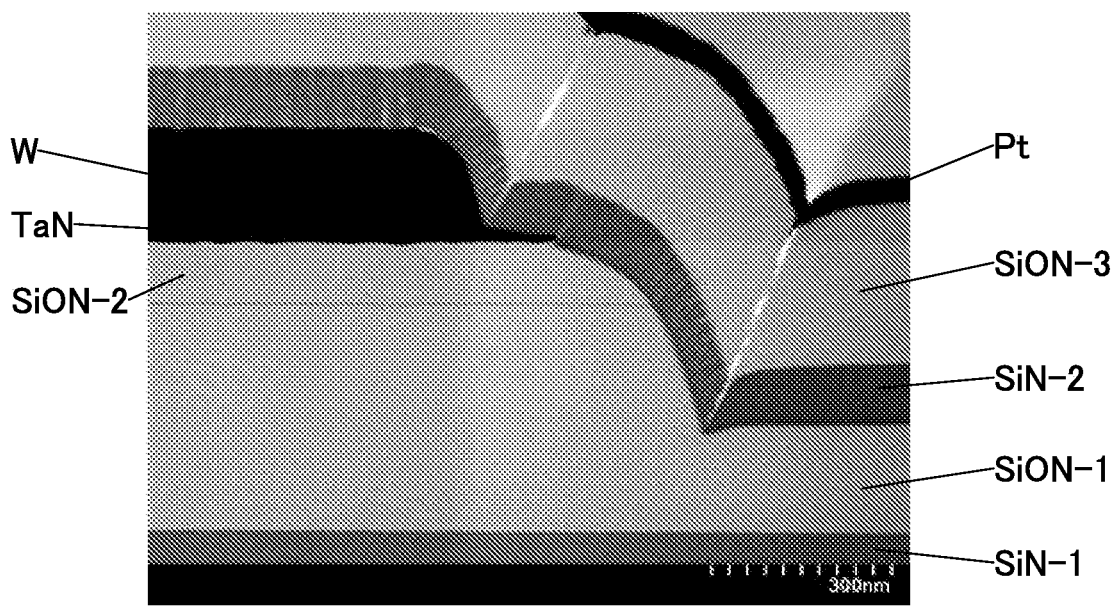

FIGS. 38A and 38B show the results of cross-sectional observation. Note that a transmission electron microscope (TEM) was used for the cross-sectional observation.

FIG. 38A is a cross-sectional TEM image of the vicinity of the conductive film 114 in the dashed-dotted line X1-X2 direction shown in FIG. 1A. FIG. 38B is a cross-sectional TEM image of the vicinity of the conductive film 114 in the dashed-dotted line Y1-Y2 direction shown in FIG. 1A.

Note that "SiN-1", "SiN-2", "SiON-1", "SiON-2", "SiON-3", "TaN", and "W" in FIGS. 38A and 38B correspond to film kinds described in the above parentheses in Example. Furthermore, "Pt" in FIGS. 38A and 38B denotes platinum of surface coating for cross-sectional observation.

It is found from the cross-sectional TEM image shown in FIG. 38A that an end portion of the tantalum nitride film (TaN) is positioned on the outer side than an end portion of the tungsten film (W). Furthermore, an end portion of the silicon oxynitride film (SiON-2) is positioned on the outer side than the end portion of the tantalum nitride film (TaN). It is found from the cross-sectional TEM image shown in FIG. 38B that an end portion of the tantalum nitride film (TaN) is positioned on the outer side than an end portion of the tungsten film (W). Furthermore, an end portion of the silicon oxynitride film (SiON-2) is positioned on the outer side than the end portion of the tantalum nitride film (TaN). Furthermore, the silicon oxynitride film (SiON-1) has a depressed portion in a region that does not overlap with the silicon oxynitride film (SiON-2). It is found from the cross-sectional TEM images shown in FIGS. 38A and 38B that, in the sample formed in this example, the silicon nitride film (SiN-2) has high coverage and a favorable cross-sectional shape.

The structure described in this example can be used in appropriate combination with any of the structures described in the embodiments.

This application is based on Japanese Patent Application serial no. 2014-020517 filed with Japan Patent Office on Feb. 5, 2014, and Japanese Patent Application serial no. 2014-037209 filed with Japan Patent Office on Feb. 27, 2014, the entire contents of which are hereby incorporated by reference.

What is claimed is:

1. A light emitting device comprising a pixel, the pixel comprising:
    a first transistor, a second transistor, a third transistor, a light emitting element, a capacitor, a first wiring, a second wiring, and a third wiring,
    wherein a gate of the first transistor is electrically connected to one electrode of the capacitor, and one of a source and a drain of the second transistor,
    wherein one of a source and a drain of the first transistor is electrically connected to the light emitting element, the other electrode of the capacitor, and one of a source and a drain of the third transistor,
    wherein the other of the source and the drain of the first transistor is electrically connected to the first wiring,
    wherein the other of the source and the drain of the second transistor is electrically connected to the second wiring,
    wherein the other of the source and the drain of the third transistor is electrically connected to the third wiring,
    wherein the first transistor comprises:
        a first conductive layer over a substrate;
        a first insulating film over the first conductive layer;
        an oxide semiconductor film over the first insulating film, and overlapping the first conductive layer;
        a second insulating film over the oxide semiconductor film;
        a second conductive layer over the second insulating film, and overlapping the first conductive layer;
        a third insulating film over the second conductive layer;
        a third conductive layer over the third insulating film, and electrically connected to the oxide semiconductor film through a first contact hole provided in the third insulating film; and
        a fourth conductive layer over the third insulating film, and electrically connected to the oxide semiconductor film through a second contact hole provided in the third insulating film,
    wherein an end portion of the oxide semiconductor film is located over a top surface of the first insulating film,
    wherein the second insulating film is a single layer, and an end portion of the second insulating film is located over a top surface of the oxide semiconductor film,
    wherein the second conductive layer is configured to be a gate electrode of the first transistor,
    wherein, in a channel length direction of the first transistor, the first conductive layer overlapping the oxide semiconductor film is longer than the second conductive layer overlapping the oxide semiconductor film,
    wherein the third insulating film has a region in contact with a side surface of the second conductive layer, a top surface of the second insulating film, and a top surface of the oxide semiconductor film,
    wherein a top surface of the second insulating film has a region extending beyond the second conductive layer, and
    wherein the capacitor includes a fifth conductive layer having a same material as the second conductive layer, and a sixth conductive layer having a same material as the third conductive layer.

2. The light emitting device according to claim 1, wherein the oxide semiconductor film includes indium, gallium, and zinc.

3. The light emitting device according to claim 1, wherein the oxide semiconductor film includes a crystal part in which spots are observed in a ring-like region when a nanobeam electron diffraction is performed.

4. The light emitting device according to claim 1, wherein the third insulating film has a region in contact with a top surface of the fifth conductive layer and a bottom surface of the sixth conductive layer.

5. The light emitting device according to claim 1, wherein the first transistor is a driver transistor, and the second transistor and the third transistor are a switching transistor.

6. A light emitting device comprising a pixel, the pixel comprising:
    a first transistor, a second transistor, a third transistor, a light emitting element, a capacitor, a first wiring, a second wiring, and a third wiring,
    wherein a gate of the first transistor is electrically connected to one electrode of the capacitor, and one of a source and a drain of the second transistor,
    wherein one of a source and a drain of the first transistor is electrically connected to the light emitting element, the other electrode of the capacitor, and one of a source and a drain of the third transistor,
    wherein the other of the source and the drain of the first transistor is electrically connected to the first wiring,
    wherein the other of the source and the drain of the second transistor is electrically connected to the second wiring,
    wherein the other of the source and the drain of the third transistor is electrically connected to the third wiring,
    wherein the first transistor comprises:
        a first conductive layer over a substrate;
        a first insulating film over the first conductive layer;
        an oxide semiconductor film over the first insulating film, and overlapping the first conductive layer;
        a second insulating film over the oxide semiconductor film;
        a second conductive layer over the second insulating film, and overlapping the first conductive layer;
        a third insulating film over the second conductive layer;
        a third conductive layer over the third insulating film, and electrically connected to the oxide semiconductor film through a first contact hole provided in the third insulating film; and
        a fourth conductive layer over the third insulating film, and electrically connected to the oxide semiconductor film through a second contact hole provided in the third insulating film, wherein an end portion of the oxide semiconductor film is located over a top surface of the first insulating film, wherein the second insulating film is a single layer, and an end portion of the second insulating film is located over a top surface of the oxide semiconductor film, wherein the second conductive layer is configured to be a gate electrode of the first transistor, wherein, in a channel length direction of the first transistor, the first conductive layer overlapping the oxide semiconductor film is longer than the second conductive layer overlapping the oxide semiconductor film, wherein the third insulating film has a region in contact with a side surface of the second conductive layer, a top surface of the second insulating film, and a top surface of the oxide semiconductor film, wherein a top surface of the second insulating film has a region extending beyond the second conductive layer, wherein the oxide semiconductor film includes a first region overlapping the second conductive layer and the second insulating film, and a second region overlapping the second insulating film and not overlapping the second conductive layer, and a third region in contact with the third insulating film, wherein a hydrogen concentration of the second region is larger than a hydrogen concentration of the first region, and wherein the capacitor includes a fifth conductive layer having a same material as the second conductive layer, and a sixth conductive layer having a same material as the third conductive layer.

7. The light emitting device according to claim 6, wherein the oxide semiconductor film includes indium, gallium, and zinc.

8. The light emitting device according to claim 6, wherein the oxide semiconductor film includes a crystal part in which spots are observed in a ring-like region when a nanobeam electron diffraction is performed.

9. The light emitting device according to claim 6, wherein the third insulating film has a region in contact with a top surface of the fifth conductive layer and a bottom surface of the sixth conductive layer.

10. The light emitting device according to claim 6, wherein the first transistor is a driver transistor, and the second transistor and the third transistor are a switching transistor.

11. A light emitting device comprising a pixel, the pixel comprising:
a first transistor, a second transistor, a third transistor, a light emitting element, a capacitor, a first wiring, a second wiring, and a third wiring,
wherein a gate of the first transistor is electrically connected to one electrode of the capacitor, and one of a source and a drain of the second transistor,
wherein one of a source and a drain of the first transistor is electrically connected to the light emitting element, the other electrode of the capacitor, and one of a source and a drain of the third transistor,
wherein the other of the source and the drain of the first transistor is electrically connected to the first wiring,
wherein the other of the source and the drain of the second transistor is electrically connected to the second wiring,
wherein the other of the source and the drain of the third transistor is electrically connected to the third wiring,
wherein the first transistor comprises:
a first conductive layer over a substrate;
a first insulating film over the first conductive layer;
an oxide semiconductor film over the first insulating film, and overlapping the first conductive layer;
a second insulating film over the oxide semiconductor film;
a second conductive layer over the second insulating film, and overlapping the first conductive layer;
a third insulating film over the second conductive layer,
a third conductive layer over the third insulating film, and electrically connected to the oxide semiconductor film through a first contact hole provided in the third insulating film; and
a fourth conductive layer over the third insulating film, and electrically connected to the oxide semiconductor film through a second contact hole provided in the third insulating film, wherein an end portion of the oxide semiconductor film is located over a top surface of the first insulating film, wherein the second insulating film is a single layer, and an end portion of the second insulating film is located over a top surface of the oxide semiconductor film, wherein the second conductive layer is configured to be a gate electrode of the first transistor, wherein, in a channel length direction of the first transistor, the first conductive layer overlapping the oxide semiconductor film is longer than the second conductive layer overlapping the oxide semiconductor film, wherein the third insulating film has a region in contact with a side surface of the second conductive layer, a top surface of the second insulating film, and a top surface of the oxide semiconductor film, wherein a top surface of the second insulating film has a region extending beyond the second conductive layer, wherein the oxide semiconductor film includes a first region overlapping the second conductive layer and the second insulating film, and a second region overlapping the second insulating film and not overlapping the second conductive layer, and a third region in contact with the third insulating film, wherein a hydrogen concentration of the third region is larger than a hydrogen concentration of the first region, and wherein the capacitor includes a fifth conductive layer having a same material as the second conductive layer, and a sixth conductive layer having a same material as the third conductive layer.

12. The light emitting device according to claim 11, wherein the oxide semiconductor film includes indium, gallium, and zinc.

13. The light emitting device according to claim 11, wherein the oxide semiconductor film includes a crystal part in which spots are observed in a ring-like region when a nanobeam electron diffraction is performed.

14. The light emitting device according to claim 11, wherein the third insulating film has a region in contact with a top surface of the fifth conductive layer and a bottom surface of the sixth conductive layer.

15. The light emitting device according to claim 11, wherein the first transistor is a driver transistor, and the second transistor and the third transistor are a switching transistor.

* * * * *